United States Patent
Moon et al.

(10) Patent No.: US 9,646,705 B2
(45) Date of Patent: May 9, 2017

(54) MEMORY SYSTEMS INCLUDING NONVOLATILE MEMORY DEVICES AND DYNAMIC ACCESS METHODS THEREOF

(71) Applicants: Sangkwon Moon, Pyeongtaek-si (KR); Kyung Ho Kim, Seoul (KR); Jihong Kim, Seoul (KR); Jaeyong Jeong, Yongin-si (KR)

(72) Inventors: Sangkwon Moon, Pyeongtaek-si (KR); Kyung Ho Kim, Seoul (KR); Jihong Kim, Seoul (KR); Jaeyong Jeong, Yongin-si (KR)

(73) Assignees: SAMSUNG ELECTRONICS CO., LTD., Gyeonggi-Do (KR); SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 14/287,580

(22) Filed: May 27, 2014

(65) Prior Publication Data

US 2014/0369124 A1   Dec. 18, 2014

(30) Foreign Application Priority Data

Jun. 12, 2013  (KR) .................. 10-2013-0067231
Jan. 21, 2014  (KR) .................. 10-2014-0007350

(51) Int. Cl.

| | |
|---|---|
| *G11C 16/16* | (2006.01) |
| *G11C 16/26* | (2006.01) |
| *G11C 11/56* | (2006.01) |
| *G11C 16/34* | (2006.01) |

(52) U.S. Cl.
CPC .......... *G11C 16/16* (2013.01); *G11C 11/5635* (2013.01); *G11C 16/26* (2013.01); *G11C 16/349* (2013.01)

(58) Field of Classification Search
None
See application file for complete search history.

(56) References Cited

U.S. PATENT DOCUMENTS

| | | |
|---|---|---|
| 6,480,018 B2 | 11/2002 | Ra |
| 6,711,054 B2 | 3/2004 | Kanamitsu et al. |
| 7,072,222 B2 | 7/2006 | Ishii et al. |
| 7,286,397 B2 | 10/2007 | Miwa et al. |
| 7,646,639 B2 | 1/2010 | Lee et al. |
| 7,808,838 B2 | 10/2010 | Kim et al. |
| 8,064,262 B2 | 11/2011 | Yamashita |
| 8,406,049 B2 | 3/2013 | Nawata |
| 8,482,985 B2 | 7/2013 | Yamano et al. |
| 8,559,221 B2 | 10/2013 | Kito et al. |
| 8,565,019 B2 | 10/2013 | Honda et al. |

(Continued)

FOREIGN PATENT DOCUMENTS

| | | |
|---|---|---|
| KR | 2010-0117906 A | 11/2010 |
| KR | 2011-0001067 A | 1/2011 |

(Continued)

*Primary Examiner* — James G Norman
(74) *Attorney, Agent, or Firm* — Harness, Dickey & Pierce, PLC

(57) ABSTRACT

A method of operating a memory device includes: determining an erase mode based on a number of erase cycles performed on a memory block and an erase voltage utilized to perform each erase cycle; and setting an erase voltage level for executing an erase operation on the memory block based on the determined erase mode.

6 Claims, 42 Drawing Sheets

(56) References Cited

U.S. PATENT DOCUMENTS

| | | | |
|---|---|---|---|
| 2009/0103371 A1* | 4/2009 | Goda | G11C 16/3468 365/185.29 |
| 2011/0170349 A1 | 7/2011 | Avraham et al. | |
| 2012/0106246 A1 | 5/2012 | Nawata | |
| 2012/0275241 A1 | 11/2012 | Min | |
| 2013/0019054 A1 | 1/2013 | Jung et al. | |
| 2013/0176792 A1 | 7/2013 | Lee | |

FOREIGN PATENT DOCUMENTS

| | | |
|---|---|---|
| KR | 2011-0001101 A | 1/2011 |
| KR | 10-1034444 B1 | 5/2011 |
| KR | 2013-0081533 A | 7/2013 |

* cited by examiner

FIG. 8

| | | | | | 344c |
|---|---|---|---|---|---|
| Average EC | ~344a | | | | |
| Average CEW | ~344b | | | | |

| BLK | EC | last EW | CEW | Write Mode | Read Enhanced Write Mode |
|---|---|---|---|---|---|
| BLK0 | 150 | 0.8 | 120.5 | WM0 | - |
| BLK1 | 3200 | 0.9 | 2900.6 | WM1 | - |
| BLK2 | 500 | 1 | 485.7 | - | - |
| BLK3 | 300 | 0.5 | 186 | - | REWM2 |
| ⋮ | ⋮ | ⋮ | ⋮ | ⋮ | ⋮ |
| BLKn-1 | 2500 | 0.6 | 1822.8 | WM2 | - |

FIG. 35

FB Table(917)

| Not erased BLK | Erased BLK | | |
|---|---|---|---|
| | Erase State | BLK | Number |
| FB112, FB113, FB115, FB116, ··· ,FB919 | E0 | – | 0 |
| | E1 | – | 0 |
| | E2 | FB130,FB133,···,FB137 | 5 |
| | E3 | FB140,FB141,···,FB149 | 7 |
| | E4 | FB150,FB151,···,FB157 | 6 |

FIG. 37

FB Table(917')

| Not erased BLK | Erased BLK | | | |
|---|---|---|---|---|
| | Erase State | BLK | Number | Ref_min |
| FB112, FB113, FB115, FB116, ⋯, FB919 | E0 | - | 0 | 8 |
| | E1 | FB112, FB123 | 2 | 6 |
| | E2 | FB130, FB133, ⋯, FB137 | 5 | 4 |
| | E3 | FB140, FB141, ⋯, FB149 | 7 | 2 |
| | E4 | FB150, FB151, ⋯, FB157 | 6 | 2 |

MEMORY SYSTEMS INCLUDING NONVOLATILE MEMORY DEVICES AND DYNAMIC ACCESS METHODS THEREOF

CROSS-REFERENCE TO RELATED APPLICATIONS

This application claims priority under 35 U.S.C. §119 to Korean Patent Application No. 10-2013-0067231 filed on Jun. 12, 2013, and Korean Patent Application No. 10-2014-0007350 filed on Jan. 21, 2014 in the Korean Intellectual Property Office, the entire contents of which are hereby incorporated by reference.

BACKGROUND

Field

Example embodiments of inventive concepts described herein relate to semiconductor memory devices, for example, memory systems including nonvolatile memory devices and/or dynamic access methods thereof.

Description of Conventional Art

Semiconductor memory devices may be volatile or nonvolatile. Volatile semiconductor memory devices perform read and write operations at relatively high speeds, while contents stored therein are lost at power-off. Nonvolatile semiconductor memory devices generally have slower read and write speeds, but retain contents stored therein even at power-off.

A flash memory device is an example of a typical non-volatile semiconductor memory device. A flash memory device may be used as a voice and/or image data storing medium of information appliances such as a computer, a cellular phone, a PDA, a digital camera, a camcorder, a voice recorder, an MP3 player, a handheld PC, a game machine, a facsimile, a scanner, a printer, and the like.

SUMMARY

At least one example embodiment provides a method of operating a memory device, the method including: determining an erase mode based on a number of erase cycles performed on a memory block and an erase voltage utilized to perform each erase cycle; and setting an erase voltage level for executing an erase operation on the memory block based on the determined erase mode.

At least one other example embodiment provides a memory system including: a non-volatile memory including a memory block and a storage controller. The storage controller is configured to: determine an erase mode based on a number of erase cycles performed on the memory block and an erase voltage utilized to perform each erase cycle; and set an erase voltage level for executing an erase operation on the memory block based on the determined erase mode.

At least one other example embodiment provides a method of operating a memory device, the method including: selecting an erase mode from among a plurality of erase modes based on a cumulative effective wear level associated with a memory block, the cumulative effective wear level being an aggregate sum of effective wear levels associated with erase cycles performed on the memory block, each of the effective wear levels being indicative of an erase voltage used to perform an erase cycle on the memory block; and setting an erase voltage level for executing an erase operation on the memory block based on the selected erase mode.

At least one other example embodiment provides a memory system including: a non-volatile memory including a memory block and a storage controller including a dynamic access manager. The dynamic access manager is configured to: select an erase mode from among a plurality of erase modes based on a cumulative effective wear level associated with the memory block, the cumulative effective wear level being an aggregate sum of effective wear levels associated with erase cycles performed on the memory block, each of the effective wear levels being indicative of an erase voltage used to perform an erase cycle on the memory block; and set an erase voltage level for executing an erase operation on the memory block based on the selected erase mode.

At least one other example embodiment provides a method of reading data from a memory block of a memory device, the method including: detecting a write mode of the memory block in response to a request to read data from the memory block; setting a read voltage based on the detected write mode of the memory block; and reading the data from the memory block using the set read voltage.

At least one other example embodiment provides a memory system including: a non-volatile memory including a memory block and a storage controller. The storage controller is configured to: detect a write mode of the memory block in response to a request to read data from the memory block; set a read voltage based on the detected write mode of the memory block; and read the data from the memory block using the set read voltage.

At least one other example embodiment provides a method for writing data to a memory device including a plurality of memory blocks, the method including: selecting, in response to a received write command, a first of the plurality of memory blocks based on a write operation parameter associated with the received write command; setting a write voltage for writing data to the first memory block based on an erase mode associated with the first memory block; and writing data to the first memory block using the set write voltage. The write operation parameter may include at least one of (i) a write speed for writing the data to the first memory block, (ii) a write request interval, (iii) a size of the data, (iv) a write pattern associated with the data, and (v) an indication of whether the write command is requesting a background write operation.

At least one other example embodiment provides a memory system including: a non-volatile memory device including a plurality of memory blocks and a storage controller. The storage controller is configured to: select, in response to a received write command, a first of the plurality of memory blocks based on a write operation parameter associated with the received write command; set a write voltage for writing data to the first memory block based on an erase mode associated with the first memory block; and write data to the first memory block using the set write voltage.

At least one other example embodiment provides a method for writing data to a memory device including a plurality of memory blocks, the method including: selecting, in response to a received write command, a subset of the plurality of memory blocks based on cumulative effective wear levels associated with the plurality of memory blocks; selecting a first memory block from among the subset of memory blocks based on a write operation parameter associated with the received write command; setting a write voltage for writing data to the first memory block based on an erase mode associated with the first memory block; and writing data to the first memory block using the set write voltage.

At least one other example embodiment provides a memory system including: a non-volatile memory including a plurality of memory blocks and a storage controller. The storage controller is configured to: select, in response to a received write command, a subset of the plurality of memory blocks based on cumulative effective wear levels associated with the plurality of memory blocks; select a first memory block from among the subset of memory blocks based on a write operation parameter associated with the received write command; set a write voltage for writing data to the first memory block based on an erase mode associated with the first memory block; and write data to the first memory block using the set write voltage.

At least one other example embodiment provides a method for writing data to a memory device including a memory block, the method including: checking a device status parameter value for the memory device, the device status parameter being indicative of one of a number of free blocks at the memory device and an empty ratio of a write buffer at the memory device; setting a write voltage for writing data to the memory block based on the device status parameter value and at least one device status parameter threshold value; and writing data to the memory block using the set write voltage.

At least one other example embodiment provides a memory system including: a non-volatile memory and a storage controller. The storage controller is configured to: check a device status parameter value for the non-volatile memory, the device status parameter being indicative of one of a number of free blocks at the non-volatile memory and an empty ratio of a write buffer at the non-volatile memory; set a write voltage for writing data to a block of the non-volatile memory based on the device status parameter value and at least one device status parameter threshold value; and write data to the block of the non-volatile memory using the set write voltage.

At least one other example embodiment provides a method for writing data to a memory device, the method including: checking a device status parameter value for the memory device, the device status parameter value being indicative of one of a number of free blocks at the memory device and an empty ratio of a write buffer at the memory device; comparing the device status parameter value with at least one device status parameter threshold value; selecting a write mode from among a plurality of write modes for writing data to a memory block based on the comparison between the device status parameter value and the at least one device status parameter threshold value; setting a write voltage according to the selected write mode; and writing data to the memory block using the set write voltage.

At least one other example embodiment provides a memory system including: a non-volatile memory and a storage controller. The storage controller is configured to: check a device status parameter value for the non-volatile memory, the device status parameter value being indicative of one of a number of free blocks at the non-volatile memory and an empty ratio of a write buffer at the non-volatile memory; compare the device status parameter value with at least one device status parameter threshold value; select a write mode from among a plurality of write modes for writing data to a block of the non-volatile memory based on the comparison between the device status parameter value and the at least one device status parameter threshold value; set a write voltage corresponding to the selected write mode; and write data to the block of the non-volatile memory using the set write voltage.

At least one other example embodiment provides user device comprising: a host; and a memory system configured to interface with the host. The memory system includes: a non-volatile memory including a memory block; and a storage controller. The storage controller is configured to: determine an erase mode based on a number of erase cycles performed on the memory block and an erase voltage utilized to perform each erase cycle; and set an erase voltage level for executing an erase operation on the memory block based on the determined erase mode.

At least one other example embodiment provides a memory system including: a flash memory including a memory block and a memory controller. The memory controller includes: a dynamic access manager configured to determine an erase mode for the memory block based on a number of erase cycles performed on the memory block and an erase voltage used to perform each erase cycle, the dynamic access manager being further configured to set an erase voltage level for executing an erase operation on the memory block based on the determined erase mode; and a flash interface configured to execute the erase operation on the memory block.

At least one other example embodiment provides a recover method for a memory system, the method including: storing access mode information in association with data in a block of the non-volatile memory, the access mode information being indicative of at least one of (i) a write mode used to write the data to the block of the non-volatile memory, and (ii) an erase mode used to erase the block of the non-volatile memory; obtaining the stored access mode information from the non-volatile memory in response to a sudden power-off recovery request from a host; and storing the obtained access mode information in a per-block mode table at a memory controller.

At least one other example embodiment provides a memory system including: a non-volatile memory including a plurality of non-volatile memory chips, each of the plurality of non-volatile memory chips being associated with a write mode from among a plurality of write modes used to write data to the non-volatile memory; and a memory controller. The memory controller is configured to: determine, in response to a request to write data to the non-volatile memory, a write mode for writing the data to the non-volatile memory; select, from among the plurality of non-volatile memory chips, a first non-volatile memory chip associated with the determined write mode; and write the data to the selected non-volatile memory chip using the determined write mode.

At least one other example embodiment provides a solid state drive including: a flash memory and a solid state drive controller. The solid state drive controller is configured to: determine an erase mode based on a number of erase cycles performed on a block of the flash memory and an erase voltage utilized to perform each erase cycle; and set an erase voltage level for executing an erase operation on the block of the flash memory based on the determined erase mode.

At least one other example embodiment provides a wear leveling method for a memory device including a plurality of memory blocks, the method including: selecting, in response to a received write command, a first of the plurality of memory blocks based on a number of erase cycles performed on the first memory block and erase voltages utilized to perform the erase cycles on the first memory block, at least two of the erase voltages being different; and writing data to the selected first memory block.

Still another aspect of embodiments of the inventive concept is directed to provide a method of accessing a nonvolatile memory device which has a plurality of erases states with different threshold voltage distribution. The method comprises receiving write-requested data; deciding a write mode that defines a bias level for writing the write-requested data; selecting a memory block, to which the write-requested data is to be written, from a free block pool according to the decided write mode, the selected memory block having a first erase state; if the free block pool does not include the memory block having the first erase state, erasing a memory block with a second erase state of which a threshold voltage distribution is higher than that of the first erase state, to the first erase state; and writing the write-requested data at the erased memory blocks with the first erase state.

A further aspect of embodiments of the inventive concept is directed to provide a memory system comprising a nonvolatile memory device configured to erase a memory block to one of a plurality of erase states corresponding to different threshold voltage distributions according to a plurality of erase modes and to program a selected memory block to program states of different threshold voltage distributions according to a plurality of write modes; and a memory controller, wherein upon programming of data according to a selected write mode, if there is not provided a free block which has a first erase state and to which the write mode is to be applied, the memory controller controls the nonvolatile memory device to perform a lazy erase operation where a free block with a second erase state is erased to the first erase state.

With embodiments of the inventive concept, it is possible to variously adjust a level of an erase voltage supplied at an erase operation of a nonvolatile memory device. A life of the nonvolatile memory device limited according to an erase count may be extended by selecting various write modes according to a level of an erase voltage or according to an operation condition.

BRIEF DESCRIPTION OF THE DRAWINGS

Example embodiments will become more apparent from the following description with reference to the following figures, wherein like reference numerals refer to like parts throughout the various figures unless otherwise specified, and wherein:

FIG. 8 is a diagram schematically illustrating a per-block mode table according to an example embodiment of inventive concepts;

FIG. 35 is a table schematically illustrating a free block table according to an embodiment of the inventive concept;

FIG. 37 is a table schematically illustrating a free block table according to another embodiment of the inventive concept;

DETAILED DESCRIPTION

Figure 1A:
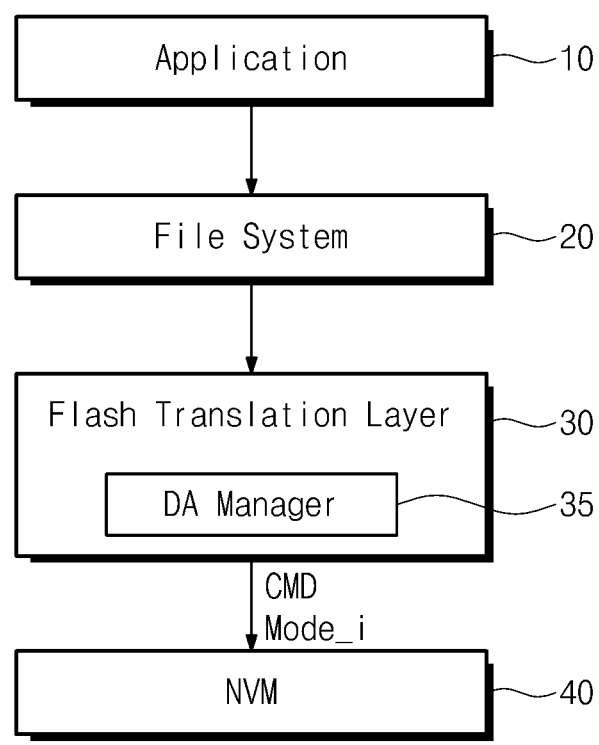
FIGS. 1A and 1B are block diagrams schematically illustrating software hierarchical structures for driving a nonvolatile memory device according to an example embodiment of inventive concepts.

Example embodiments will be described in detail with reference to the accompanying drawings. Inventive concepts, however, may be embodied in various different forms, and should not be construed as being limited only to the illustrated embodiments. Rather, these embodiments are provided as examples so that this disclosure will be thorough and complete, and will fully convey inventive concepts to those skilled in the art. Accordingly, known processes, elements, and techniques are not described with respect to some embodiments of inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Circuit components of flash memory devices and read methods discussed herein are only examples. Various modifications and changes may be made without escaping from the scope, spirit and other objects of inventive concepts.

Below, features and functions of inventive concepts will be exemplarily described using a NAND flash memory device as a nonvolatile storage medium. However, inventive concepts are not limited thereto. Also, storage mediums may be formed of other nonvolatile memory devices. For example, storage mediums may be formed of a phase change random access memory (PRAM), a magnetic RAM (MRAM), a resistive RAM (ReRAM), a ferroelectric RAM (FRAM), a NOR flash memory, or the like.

Inventive concepts may be implemented by different embodiments or applied thereto. Further, detailed description may be modified or changed according to viewpoints and applications without escaping from the scope, spirit and other objects of inventive concepts. Below, example embodiments of inventive concepts will be described with reference to accompanying drawings.

Figure 1B:
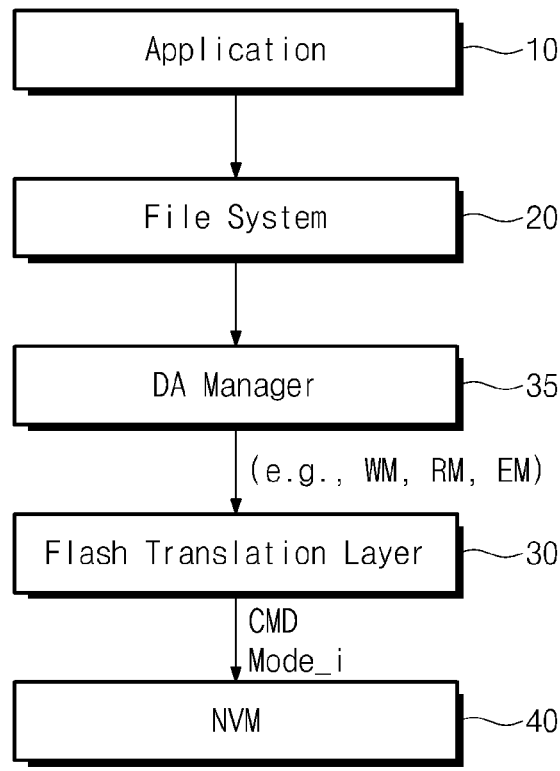

FIGS. 1A and 1B are block diagrams schematically illustrating example embodiments of software hierarchical structures for driving a nonvolatile memory device. FIG. 1A shows an example embodiment of a software hierarchical structure where a dynamic access manager 35 and a flash translation layer (FTL) 30 are included in the same layer. FIG. 1B shows an example embodiment of a software hierarchical structure where the dynamic access manager 35 is hierarchically higher than the flash translation layer 30.

Referring to FIG. 1A, the flash translation layer 30 translates a logical address (e.g., a sector address and the number of sectors) provided from application software 10 and a file system 20 into a physical address PA.

The flash translation layer 30 also provides an interface for hiding an erase operation of a nonvolatile memory device 40 between the file system 20 and the nonvolatile memory device 40. The flash translation layer 30 is also used to compensate for drawbacks such as an erase-before-write operation, mismatch between an erase unit and a write unit, etc. During a write operation of the nonvolatile memory device 40, the flash translation layer 30 maps a logical address LA generated by the file system 20 onto a physical address PA of the nonvolatile memory device 40.

The flash translation layer 30 forms an address mapping table for mapping logical addresses to physical addresses of the nonvolatile memory device 40. Here, the flash translation layer 30 may be included within a memory controller (not shown). The flash translation layer 30 may utilize various address mapping methods according to mapping units. For example, the address mapping methods of the flash translation layer 30 may include: a page mapping method; a block mapping method; a hybrid mapping method; etc.

The dynamic access manager 35 controls the nonvolatile memory device 40 according to erase and write modes that are different from conventional erase and write modes. For example, the dynamic access manager 35 erases a selected memory block according to an erase condition from among various erase conditions. In this example, a level of an erase voltage used during an erase operation may be varied. In general, memory blocks are conventionally erased under the same or substantially the same conditions. According to an example conventional technique, wear leveling based on an erase count is applied to the nonvolatile memory device 40 to extend the life of the nonvolatile memory device 40. An erase count is a number corresponding to the number of erase cycles performed on a given memory block.

The dynamic access manager 35 according to at least some example embodiments of inventive concepts applies effective wearing (hereinafter sometimes referred to as EW) with a relatively low value to a memory block that is managed by a relatively low erase voltage. Thus, wear leveling according to at least some example embodiments of inventive concepts may be performed based on an actual stress level, not merely based on erase count. The dynamic access manager 35 may manage write and read modes based on erase modes applied to respective memory blocks. That is, for example, the dynamic access manager 35 may issue a command or a mode set signal Mode_i for setting a bias of a selected memory block according to a decided access mode.

The nonvolatile memory device 40 may change driving conditions according to an access mode decided by the dynamic access manager 35. In one example, the nonvolatile memory device 40 selectively generates a read voltage, an erase voltage, a program voltage, etc. for execution of a mode selected by the dynamic access manager 35. Thus, the nonvolatile memory device 40 may further include an interface for receiving a separate command and/or control signal to set such a mode. The nonvolatile memory device 40 may include components for adjusting a DC voltage in response to a mode set command and/or a control signal.

Referring to FIG. 1B, in this example embodiment the dynamic access manager 35 is located at a higher level than the flash translation layer 30. In one example, the dynamic access manager 35 may be included in a host of a memory storage system. In another example, the dynamic access manager 35 may be included in a device driver.

According to at least this example embodiment, the dynamic access manager 35 provides the flash translation layer 30 with an access mode AM (e.g., write mode (WM), read mode (RM), erase mode (EM), etc.) for a selected memory block based on information provided from the application software 10 and/or the file system 20. The flash translation layer 30 issues a command CMD and/or a mode set signal Mode_i to set a bias of a selected memory block according to the access mode AM from the dynamic access manager 35.

An example embodiment in which the dynamic access manager 35 serves as a memory management module is described above. However, embodiments are not limited to only this example.

Still referring to FIG. 1B, the nonvolatile memory device 40 according to at least some example embodiments of inventive concepts erases a selected memory block in response to a command and/or a control signal. According to at least one example embodiment, the selected memory block may be erased using various levels of erase voltages.

In at least some example embodiments, the dynamic access manager 35 performs a wear leveling operation by setting an effective wearing EW based on a level of an erase voltage. In addition, the dynamic access manager 35 performs an access operation on a selected memory block according to access modes AM corresponding to various access biases, in response to a request from the host and/or when the dynamic access manager 35 itself determines that an access operation on a selected memory block is required.

Figure 2:
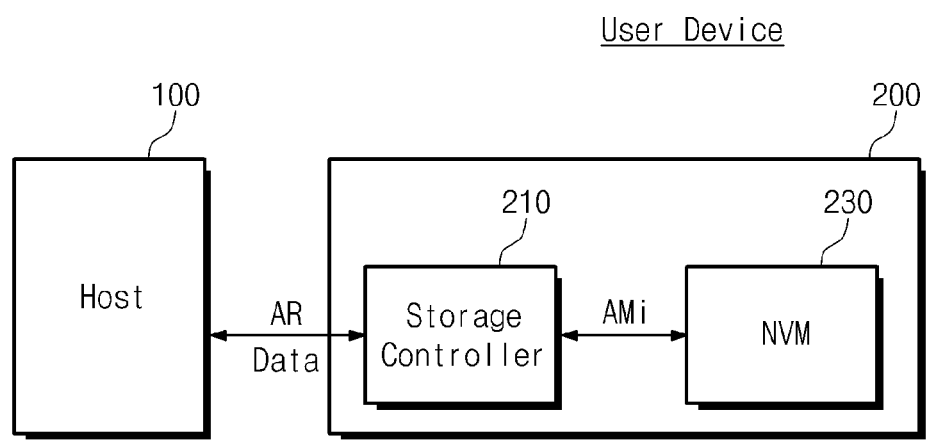
FIG. 2 is a block diagram schematically illustrating a user device according to an example embodiment of inventive concepts.

FIG. 2 is a block diagram schematically illustrating a user device according to an example embodiment of inventive concepts.

Referring to FIG. 2, a user device includes a host 100 and a memory system 200. The memory system 200 includes a storage controller 210 and a nonvolatile memory device 230. In one example, the host 100 may be a handheld electronic device such as a personal/handheld computer, a PDA, a PMP, an MP3 player, etc.

When an access request AR is generated, the host 100 provides the memory system 200 with access request data AR Data. The storage controller 210 provides an interface between the host 100 and the nonvolatile memory device 230.

In one example, the access request data AR Data includes write data and a logical address LA. In this example, the storage controller 210 writes data provided from the host 100 in the nonvolatile memory device 230 in response to the access request (e.g., a write command) from the host 100.

The storage controller 210 also controls a read operation of the nonvolatile memory device 230 in response to an access request (e.g., a read command) from the host 100.

According to at least some example embodiments, the storage controller 210 may provide a variety of access modes AMi for selected memory areas in response to one or more access request AR from the host 100. The access mode AMi may be used to set an operation bias of the nonvolatile memory device 230, and the storage controller 210 may provide the access mode AMi through a command and/or a control signal.

The storage controller 210 maintains erase mode information associated with respective memory blocks of the nonvolatile memory device 230. In response to receiving an access request AR from the host 100, the storage controller 210 determines an access mode AMi based on an erase mode EM of a memory block corresponding to a logical address associated with the access request AR. In one example, a memory block using a relatively low erase voltage and a relatively high erase verification voltage may be set to a low-speed write mode. In another example, a memory block using a relatively high erase voltage and a relatively low erase verification voltage may be set to a high-speed write mode.

The storage controller 210 determines and/or adjusts a read/write mode based on an effective wearing of a corresponding memory block. Moreover, the storage controller 210 performs wear leveling and/or garbage collection based on a cumulative value of the effective wearing. An example embodiment in which an access mode AMi is selected for a memory block is described. However, inventive concepts are not limited thereto. For example, in some cases, the storage controller 210 may select a physical address of a memory block being accessed according to the access mode AMi. When a high-speed data writing operation is required, the storage controller 210 may map an input logical address to a physical address of a memory block having an erase state that is capable of being programmed at high speed.

According to at least some example embodiments, the storage controller 210 may determine an access mode based on an instruction of the host 100, the number of free blocks, the size of write requested data, a time interval between requests, etc. This will be more fully described below.

The nonvolatile memory device 230 may be used as a storage medium of the memory system 200. For example, the nonvolatile memory device 230 may be formed of a NAND flash memory with a mass storage capacity. Alternatively, the nonvolatile memory device 230 may be formed of next-generation nonvolatile memories such as a PRAM, an MRAM, a ReRAM, an FRAM, a NOR flash memory, etc. The nonvolatile memory device 230 may adjust a bias level (e.g., a DC voltage) in response to a command and/or a control signal corresponding to an access mode AMi from the storage controller 210.

In accordance with the above description, the memory system 200 according to at least some example embodiments of inventive concepts may include the nonvolatile memory device 230 in which a level of an erase voltage and a threshold voltage of an erase state are variously set. The storage controller 210 may allocate different effective wearing according to a level of an erase voltage applied to each memory block and/or a level of stress generated during an erase state. The storage controller 210 may perform memory management based on a cumulative effective wearing CEW for each memory block. As discussed herein, the cumulative effective wearing CEW may also be referred to as a cumulative effective wear level, and may be indicative of a number of erase cycles performed on a memory block and the erase voltage used to perform each erase cycle. Moreover, a cumulative effective wear level for a memory block is an aggregate sum of the effective wearing (also referred to as effective wear level) associated with erase cycles performed on the memory block. And, each of the effective wear levels is indicative of an erase voltage used to perform the corresponding erase cycle.

According to at least some example embodiments, an absolute value of stress generated may be reduced according to the whole erase operation of memory blocks, which may extend a life of the memory system 200.

Figure 3:
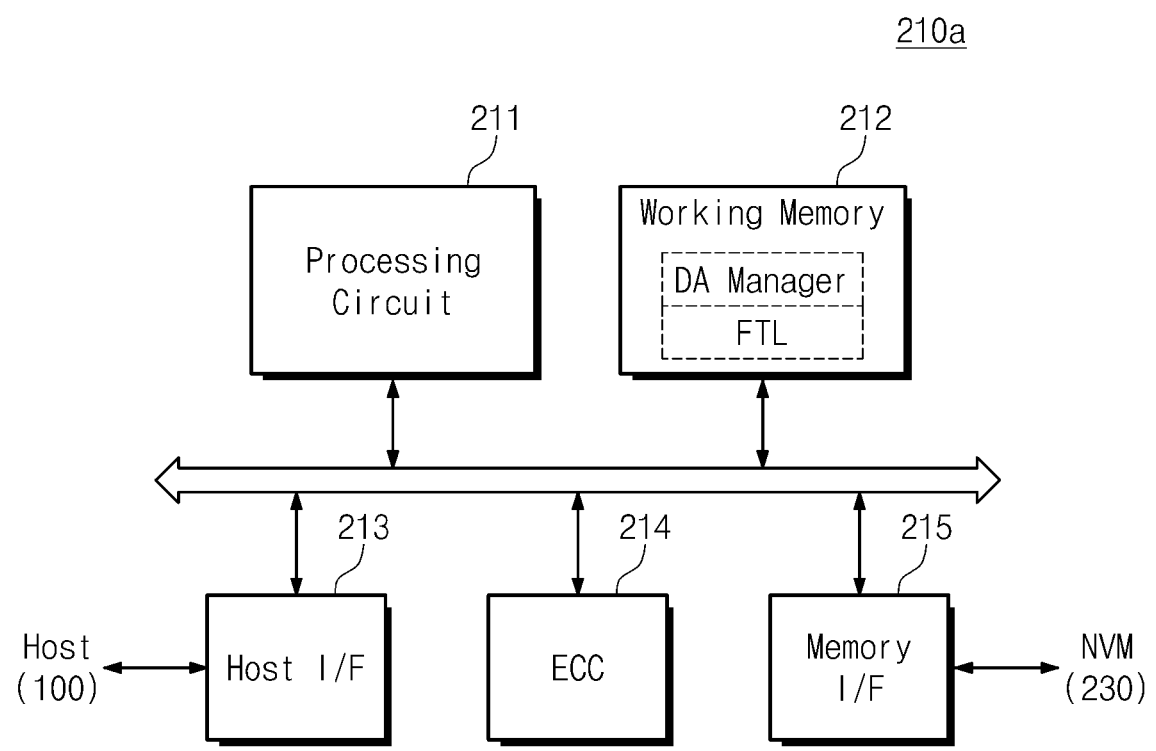
FIG. 3 is a block diagram schematically illustrating hardware components of a storage controller of FIG. 2 according to an example embodiment of inventive concepts.

FIG. 3 is a block diagram schematically illustrating hardware components of the storage controller of FIG. 2 according to an example embodiment of inventive concepts.

Referring to FIG. 3, the storage controller 210a includes: a processing circuit 211; a working memory 212; a host interface 213; an error correction circuit 214; and a memory interface 215. However, inventive concepts are not limited thereto. For example, the storage controller 210a may further include a read-only memory (ROM) that stores code data for an initial booting operation.

The processing circuit 211 may include a central processing unit (CPU) or a microprocessor. The processing circuit 211 controls an overall operation of the storage controller 210a. The processing circuit 211 also drives firmware for controlling the storage controller 210a. The firmware may be loaded into the working memory 212.

Data and software (and/or firmware) for controlling the storage controller 210a may be loaded into the working memory 212. The stored data and software may be processed and driven by the processing circuit 211. The working memory 212 may include at least one of a cache memory, a dynamic random access memory (DRAM), a static RAM (SRAM), a phase change RAM (PRAM), a flash memory device, etc. According to at least some example embodiments of inventive concepts, a dynamic access manager DA Manager and a flash translation layer FTL may be loaded into the working memory 212.

Still referring to FIG. 3, the host interface 213 provides an interface between a host 100 and the storage controller 210a. The host 100 and the storage controller 210a may be connected through one or more of various standardized interfaces. Example standardized interfaces include: ATA (Advanced Technology Attachment); SATA (Serial ATA); e-SATA (external SATA); SCSI (Small Computer Small Interface); SAS (Serial Attached SCSI); PCI (Peripheral component Interconnection); PCI-E (PCI Express); USB (Universal Serial Bus); IEEE 1394; Card interface; etc.

The error correction circuit 214 corrects an error of data damaged by various causes. In one example, the error correction unit 214 detects and corrects an error of data read from a nonvolatile memory device 230.

The memory interface 215 provides an interface between the storage controller 210a and the nonvolatile memory device 230. In one example, data processed by the processing circuit 211 is stored in the nonvolatile memory device 230 through the memory interface 215. Data read from the nonvolatile memory device 230 is also provided to the processing circuit 211 through the memory interface 215. The memory interface 215 may perform a setting operation on the nonvolatile memory device 230 for setting of an access mode AMi decided by the dynamic access manager.

Figure 4:
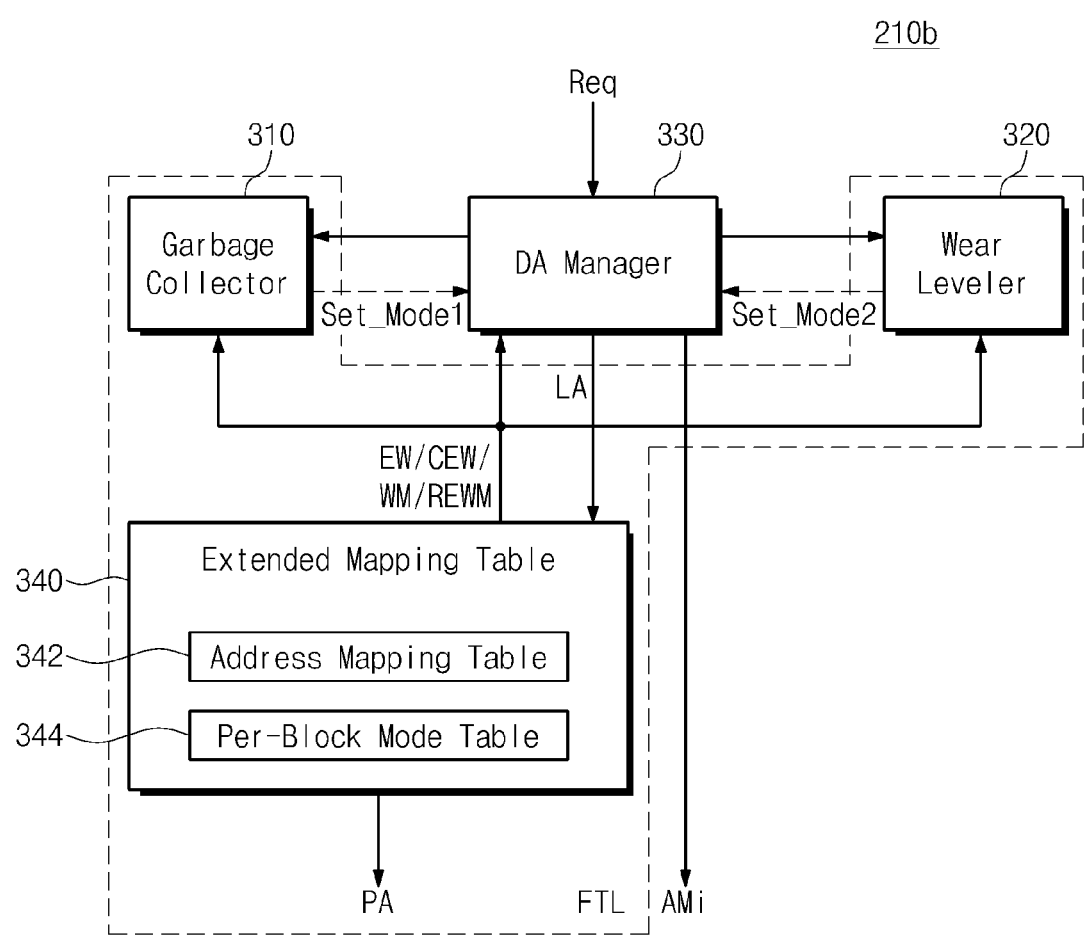
FIG. 4 is a block diagram schematically illustrating software components of a storage controller according to an example embodiment of inventive concepts.

FIG. 4 is a block diagram schematically illustrating software components of a storage controller according to an example embodiment of inventive concepts.

Referring to FIG. 4, software 210b of the storage controller 210 includes: a garbage collector 310; a wear leveler 320; a dynamic access manager 330; and an extended mapping table 340. Here, the garbage collector 310, the wear leveler 320, and the extended mapping table 340 are included in a flash translation layer FTL. The extended mapping table 340 includes an address mapping table 342 and a per-block mode table 344.

The garbage collector 310 performs a garbage collection operation of collecting valid data of data stored in memory blocks of a nonvolatile memory device 230 not supporting an overwrite operation, and storing the collected valid data in a memory block. Memory blocks in which invalid data is stored through the garbage collection operation may be recovered as a free block. The garbage collector 310 performs the garbage collection operation based on effective wearing EW for each memory block stored in the per-block mode table 344 of the extended mapping table 340.

Based on a result of the garbage collection operation, the garbage collector 310 may determine a write mode of a memory block in which valid data is to be stored. For example, a garbage collection operation executed during an idle mode of a memory system 200 may not necessitate a high-speed write operation. In this case, the garbage collector 310 provides a mode set signal Set_Mode1 to the dynamic access manager 330 such that data is written at low speed. A more urgent garbage collection operation to be executed when the number of free blocks is insufficient may necessitate a high-speed write operation. In this case, the garbage collector 310 provides the dynamic access manager 330 with the mode set signal Set_Mode1 such that data is written in a selected memory block at high speed.

Still referring to FIG. 3, the wear leveler 320 performs a wear leveling operation based on effective wearing EW and/or cumulative effective wearing CEW for each memory block stored in the per-block mode table 344. According to a conventional wear leveling operation, a memory block in which data is to be stored is selected based on only an erase count for each memory block. If a deviation in erase counts for memory blocks is relatively large, lifetime of a nonvolatile memory device 230 may be shortened. A deviation in erase counts for memory blocks may be reduced by using a wear leveling method in which a memory block with a relatively small erase count is selected as a memory block in which data is first to be written. The wear lever 320 according to at least this example embodiment of inventive concepts performs a wear leveling operation based on a cumulative effective wearing CEW for each memory block stored in the per-block mode table 344. In this example, a wear leveling operation is performed according to a level of erase stress actually applied to each memory block based on cumulative values of effective wearing EW.

For example, the wear leveler 320 may be set such that a memory block with a relatively small cumulative effective wearing CEW has a higher priority when selecting a write block. According to at least some example embodiments, wear leveling based on the erase count EC and wear leveling using the cumulative effective wearing CEW may be used together. Further, the cumulative effective wearing CEW may be used as data for compensating for the wear leveling method using the erase count EC. The wear leveler 320 provides a mode set signal Set_Mode2 to the dynamic access manager 330 to perform an access operation according to the erase count EC and/or the cumulative effective wearing CEW.

The dynamic access manager 330 processes an access request provided from a host 100 or an upper layer based on the effective wearing EW from the per-block mode table 344. According to at least one example embodiment, when an access request is provided from the host 100, the dynamic access manager 330 reads effective wearing EW corresponding to a selected memory block from the per-block mode table 344. The dynamic access manager 330 selects an access mode AMi according to the effective wearing EW of the selected memory block. For example, when the dynamic access manager 330 receives a write request from the host, the dynamic access manager 330 determines a write mode WM based on the effective wearing EW of the selected memory block. In this case, the dynamic access manager 330 may decide an access mode AMi to select one of various write biases needed for a write operation. The dynamic access manager 330 may also select the access mode AMi for adjusting a DC voltage level of the nonvolatile memory device 230 in response to other access requests (e.g., including a read request, etc.) as well as the write request.

Still referring to FIG. 4, as mentioned above the extended mapping table 340 includes an address mapping table 342 and the per-block mode table 344. The address mapping table 342 stores mapping information for converting logical addresses into physical addresses of the nonvolatile memory device 230. In one example, the address mapping table 342 includes mapping information between logical addresses and physical addresses in the form of a lookup table. The lookup table may be updated periodically according to a memory state.

The per-block mode table 344 according to at least some example embodiments stores effective wearing information for each memory block. In one example, the per-block mode table 344 stores information associated with a most recent erase mode of each of the memory blocks in the nonvolatile memory device 230. The erase mode EM may be determined according to an erase voltage Vers_i provided to a substrate during an erase operation of a selected memory block and an erase verification voltage Vevf_i. According to at least some example embodiments, a relatively high effective wearing EW may be allocated to a memory block erased by a relatively high erase voltage Vers_i. In one example, an effective wearing EW having a value between 0 and 1 may be allocated to a specific memory block for an erase operation. The effective wearing EW will be more fully described with reference to FIG. 6.

According to at least some example embodiments, it is possible to implement a memory system 200 capable of improved allocation an access mode in response to an access request.

Figure 5:
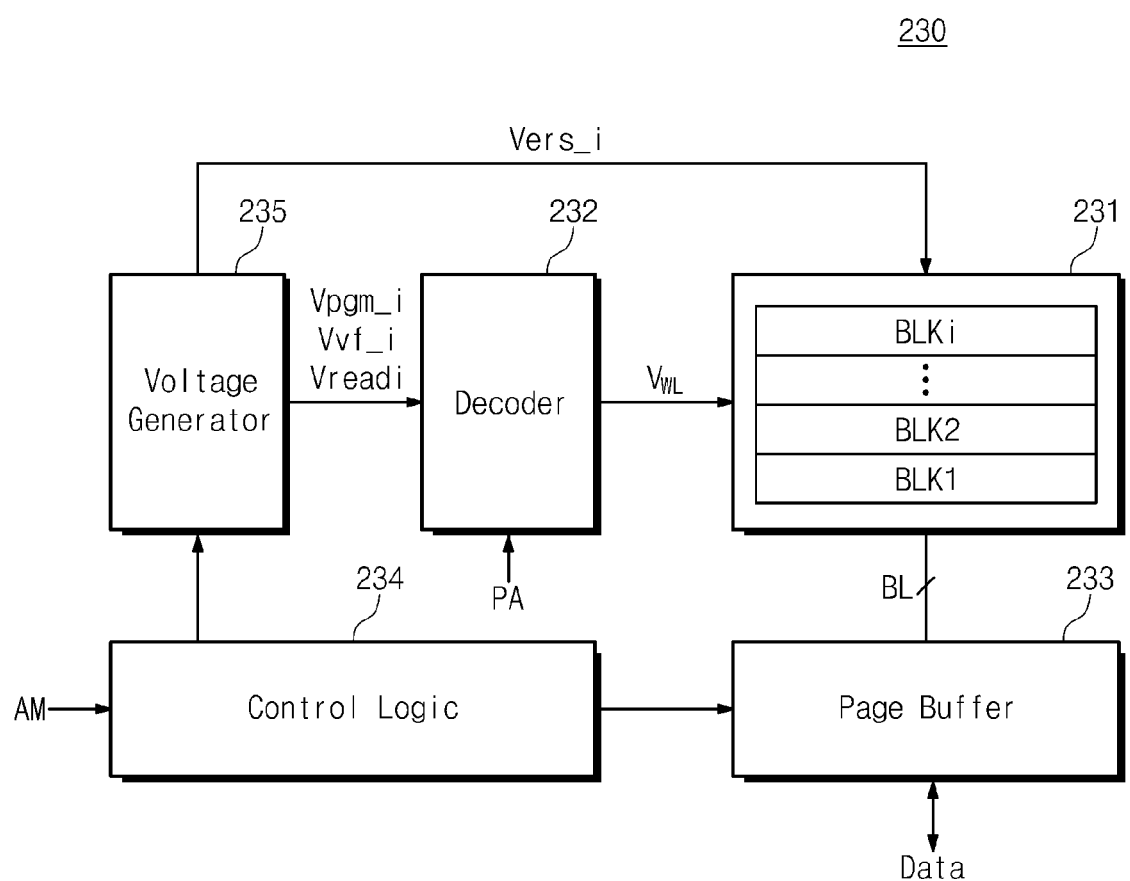
FIG. 5 is a block diagram schematically illustrating a nonvolatile memory device according to an example embodiment of inventive concepts.

FIG. 5 is a block diagram schematically illustrating a nonvolatile memory device according to an example embodiment of inventive concepts.

Referring to FIG. 5, a nonvolatile memory device 230 includes: a cell array 231; a decoder 232; a page buffer 233; control logic 234; and a voltage generator 235.

The cell array 231 is connected to the decoder 232 through word lines and selection lines. The cell array 231 is also connected to the page buffer 233 through bit lines BL. The cell array 231 includes a plurality of memory blocks BLK1 to BLKi, each of which includes a plurality of NAND cell strings. An erase operation may be executed by a memory block unit. During an erase operation, the voltage generator 235 applies an erase voltage Vers_i (where i is indicative of an erase mode) to a selected memory block of the cell array 231. The voltage generated 235 then applies an erase verification voltage Vevf_i to word lines of the selected memory block after supplying of the erase voltage Vers_i.

According to at least this example embodiment, the erase voltage Vers_i varies according to an erase mode EMi. For example, a level of the erase voltage Vers_i may be lowered for an erase mode where a threshold voltage of a memory cell corresponding to an erase state is relatively high. Alternatively, when the erase voltage Vers_i is provided in an incremental step pulse shape, a starting erase voltage may be reduced. A level of the erase verification voltage Vevf_i may be determined according to the erase mode EMi.

The decoder 232 selects one of the memory blocks BLK1 to BLKi of the cell array 231 in response to an address PA. The decoder 232 provides a word line of the selected memory block with a word line voltage $V_{WL}$ corresponding to a mode of operation. For example, during a program operation, the decoder 232 transfers a program voltage Vpgm_i and a verification voltage Vvf_i to a selected word line, while applying a pass voltage Vpass to an unselected word line. The decoder 232 provides selection signals to the selection lines to select a memory block, a sub block, etc. During a read operation, the decoder 232 applies a read voltage Vrd_i to a selected word line of a memory block, and applies a pass read voltage Vread_i to unselected word lines of the memory block.

Still referring to FIG. 5, the page buffer 233 operates as a write driver and/or a sense amplifier according to a mode of operation. During a program operation, the page buffer 233 transfers a bit line voltage corresponding to program data to a bit line of the cell array 231. During a read operation, the page buffer senses data stored in a selected memory cell through a bit line. The page buffer 233 latches the sensed data, and then outputs the latched data to an external device.

The control logic 234 controls the page buffer 233 and the decoder 232 in response to a command transferred from an external device. In one example, the control logic 234 controls the page buffer 233 and the decoder 232 to access a selected memory block according to an access mode AMi provided from the external device. The control logic 234 also controls the voltage generator 235 to generate program and verification voltages to be provided to a selected memory block according to a write mode WMi. The control logic 234 controls the voltage generator 235 to generate a variety of read voltage and pass read voltage sets according to a read mode.

The voltage generator 235 generates various word line voltages to be supplied to word lines and a voltage to be supplied to a bulk (e.g., a well area) where memory cells are formed. The various word line voltages to be supplied to word lines may include: a program voltage Vpgm_i; a pass voltage Vpass; a read voltage Vrd_i; a pass read voltage Vreadi; etc. The voltage generator 235 may generate selection line voltages $V_{SSL}$ and $V_{GSL}$ to be provided to the selection lines SSL and GSL during a read/program operation.

The voltage generator 235 also generates various levels of erase voltages Vers_i. The voltage generator 235 may adjust a start pulse level of the erase voltage Vers_i to be supplied to a bulk area of a selected memory block according to the erase mode EMi. The voltage generator 235 may also generate an erase verification voltage Vevf_i having a level corresponding to the erase voltage Vers_i. The voltage generator 235 may generate all DD voltages corresponding to the access mode AMi.

The nonvolatile memory device 230 according to an example embodiment of inventive concepts may reduce and/or minimize erase voltage stress applied to a memory block by varying erase, write and/or read biases of a selected memory block in response to an access mode AMi provided from a storage controller 210. In one example, the life of the nonvolatile memory device 230 may be extended by lowering the erase voltage stress. Also, the nonvolatile memory device 230 may set various read and write modes to cope with conditions changed according to a variation in the erase voltage Vers_i.

Figure 6:
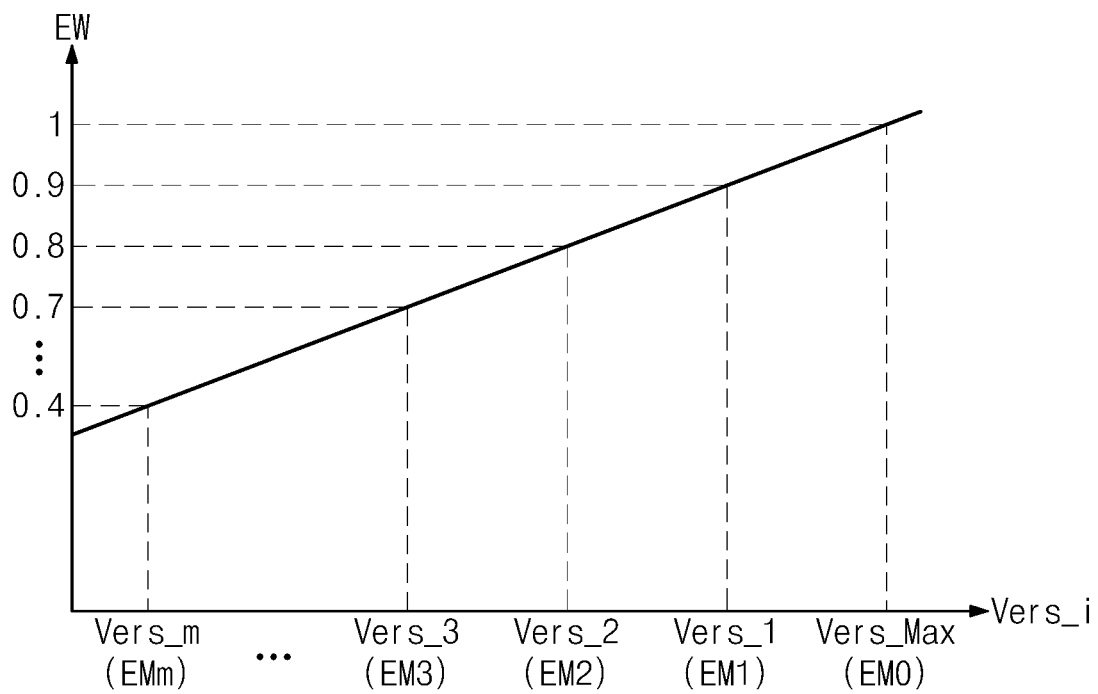
FIG. 6 is a graph schematically illustrating effective wearing EW according to an example embodiment of inventive concepts.

FIG. 6 is a graph schematically illustrating effective wearing EW according to an example embodiment of inventive concepts. In FIG. 6, a level of effective wearing EW according to an erase voltage Vers_i is illustrated as a linear function.

Referring to FIG. 6, when a memory block is erased using the maximum erase voltage Vers_Max, the effective wearing EW has a level of "1". When a memory block is erased using the minimum erase voltage Vers_m, the effective wearing EW has a level of "0.4". The effective wearing EW of a memory block erased by an erase voltage Vers_1 has a level of "0.9". Levels of the effective wearing EW shown in FIG. 6 are only examples. Correspondence between an erase voltage Vers_i and effective wearing EW corresponding to the erase voltage Vers_i may be determined as necessary based on test values and/or other empirical results.

Correspondence between an erase voltage Vers_i and effective wearing EW corresponding to the erase voltage Vers_i may be set to a parabolic function, an exponential function, a log function, etc. The erase voltage Vers_i may be a starting erase voltage applied to a bulk area of a memory block during an erase operation. The erase voltage Vers_i should not be limited to the examples discussed herein.

Figure 7:
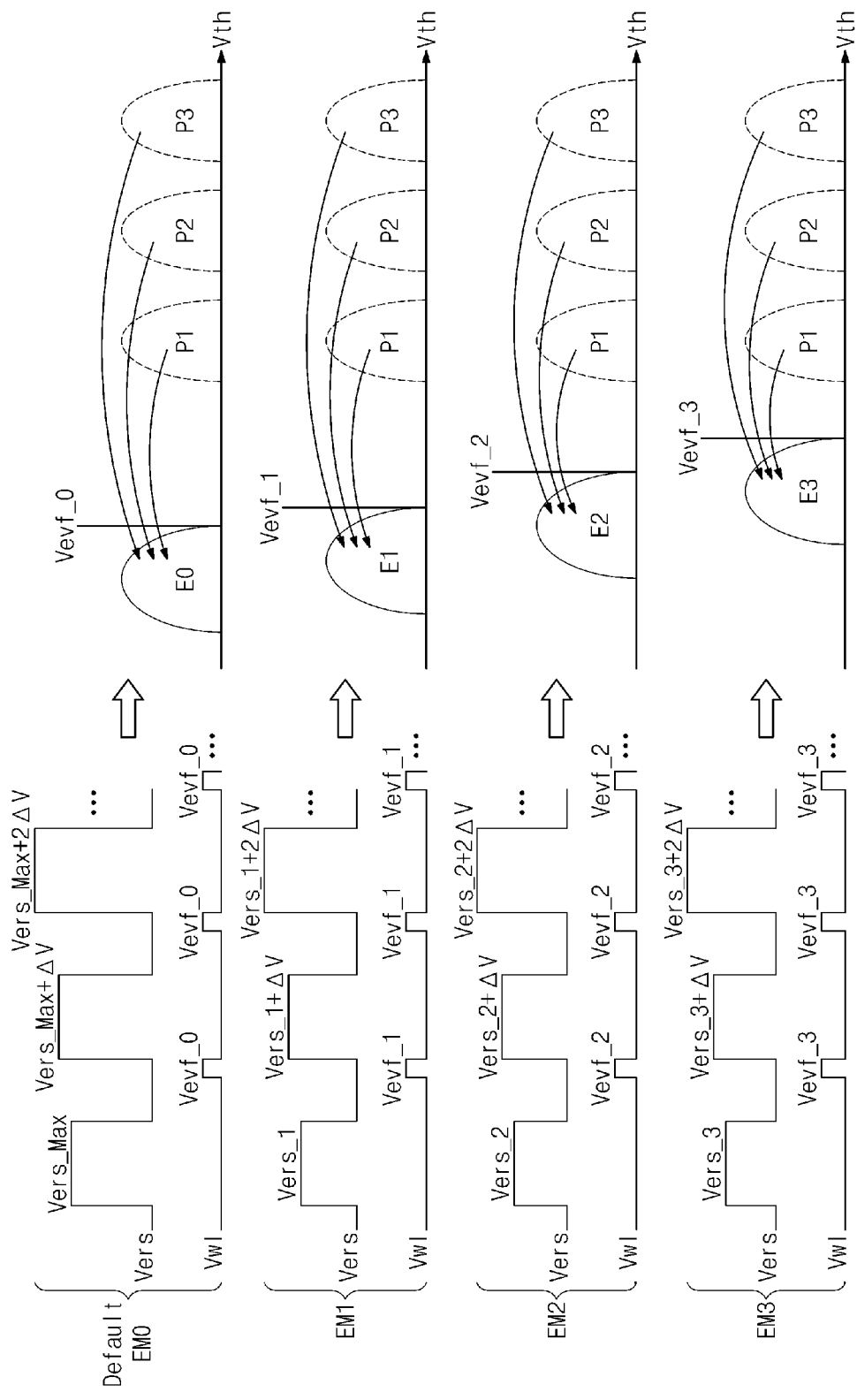
FIG. 7 is a diagram schematically illustrating an erase mode EMi according to an example embodiment of inventive concepts.

FIG. 7 is a diagram schematically illustrating example erase modes EMi according to an example embodiment of inventive concepts. The example shown in FIG. 7 will be described with regard to the storage controller 210 discussed above with regard to FIG. 2 for example purposes.

Referring to FIG. 7, the storage controller 210 determines an erase mode EMi according to a level of an erase voltage Vers_i and/or a level of an erase verification voltage Vevf_i.

Referring to a default erase mode EM0, when the storage controller 210 does not designate an erase mode, a selected memory block is erased according to the default erase mode EM0. When the storage controller 210 sets a selected memory block to be erased according to the default erase mode EM0, the storage controller 210 erases the selected memory block using a starting erase voltage Vers_Max and an erase verification voltage Vevf_0.

In the example embodiment shown in FIG. 7, when the storage controller 210 performs an erase operation using an incremental step pulse method, a selected memory block is supplied with the starting erase voltage Vers_Max. Then, the erase verification voltage Vevf_0 is provided to word lines of the selected memory block. If a result of the erase verification operation indicates that each memory cell has a threshold voltage higher than the erase verification voltage Vevf_0, then the storage controller 210 performs an erase operation using an erase voltage (Vers_Max+ΔV) and the erase verification voltage Vevf_0. The erase operation executed using the incremental step pulse manner is passed when threshold voltages of all memory cells are lower than the erase verification voltage Vevf_0.

Threshold voltages of memory cells in a selected memory block may be lowered to correspond to an erase state E0 through an erase operation corresponding to the default erase mode EM0. Threshold voltages of memory cells having an erase state E0 and program states P1, P2 and P3 may be lower than the erase verification voltage Vevf_0 through the erase operation corresponding to the default erase mode EM0.

Referring to a first erase mode EM1, when the storage controller 210 decides that a selected memory block is to be erased using the first erase mode EM1, the storage controller 210 erases the selected memory block using a starting erase voltage Vers_1 and an erase verification voltage Vevf_1. In this case, the starting erase voltage Vers_1 is supplied to a bulk area of the selected memory block. Then, the erase verification voltage Vevf_1 is applied to word lines of the selected memory block. If a result of the erase verification operation indicates that each of the memory cells has a threshold voltage higher than the erase verification voltage Vevf_1, then the storage controller 210 performs an erase operation using an erase voltage (Vers_1+$\Delta$V) and the erase verification voltage Vevf_1.

The erase operation executed using the incremental step pulse method is passed when threshold voltages of all memory cells are lower than the erase verification voltage Vevf_1. Threshold voltages of memory cells in a selected memory block may be lowered to correspond to an erase state E1 through an erase operation corresponding to the first erase mode EM1. After execution of the first erase mode EM1, threshold voltages of memory cells may be lower than the erase verification voltage Vevf_1.

In a second erase mode EM2, the storage controller 210 erases a selected memory block using a starting erase voltage Vers_2 and an erase verification voltage Vevf_2. In this example, the starting erase voltage Vers_2 is supplied to the selected memory block, and then the erase verification voltage Vevf_2 is applied to word lines of the selected memory block. When a result of the erase verification operation indicates erase fail, the storage controller 210 performs an erase operation using an erase voltage (Vers_2+$\Delta$V) and the erase verification voltage Vevf_2. In this example, the erase operation executed using the incremental step pulse method is passed when threshold voltages of all memory cells are lower than the erase verification voltage Vevf_2.

Threshold voltages of memory cells in a selected memory block may be lowered to correspond to an erase state E3 through an erase operation corresponding to the third erase mode EM3. After execution of the third erase mode EM3, threshold voltages of memory cells in a selected memory block may be lower erase verification voltage Vevf_3.

Example voltage waveforms and threshold voltage distributions associated with erase operations corresponding to erase modes are illustrated in FIG. 7. Here, the number of erase modes is 4. However, the number of erase modes may be changed to be less or more than 4. When an erase request is generated, the storage controller 210 (e.g., dynamic access manager 330 shown in FIG. 4) may select one of the erase modes EM0 to EM3 based on a level of cumulative effective wearing CEW. For example, the storage controller 210 may select default erase mode EM0 for a memory block having cumulative effective wearing CEW indicating that deterioration of an oxide film of a memory cell is relatively low or slight, but may select the third erase mode EM3 causing a relatively low level of stress for a memory block having cumulative effective wearing CEW indicating that deterioration of an oxide film of a memory cell is relatively high or severe. Threshold voltage distributions corresponding to an erase mode should not be limited to only those discussed herein. A voltage width of each of erase states E0 to E3 may be varied to have various widths. For example, a width of a threshold voltage distribution corresponding to the erase state E3 may be wider than that corresponding to the erase state E2.

Furthermore, an increment $\Delta$V can be varied in accordance with the erase modes EM0 to EM3. For example, the increment $\Delta$V applied during the default erase mode EM0 may be relatively larger than other erase modes EM1 to EM3.

FIG. 8 is a diagram schematically illustrating an example embodiment of the per-block mode table 344 shown in FIG. 4.

Referring to FIG. 8, the per-block mode table 344 includes: an average erase count 344a; an average cumulative effective wearing 344b; and a per-block state table 344c.

The average erase count 344a provides a reference value for a wear leveling operation. The wear leveler 320 may decrease a frequency of use of a memory block having a relatively large erase count according to the average erase count 344a. The wear leveler 320 may also increase a frequency of use of a memory block having a relatively small erase count according to the average erase count 344a.

The average cumulative effective wearing 344b is a reference provided for wear leveling according to an example embodiment of inventive concepts. The average cumulative effective wearing 344b corresponds to an average value of cumulative effective wearing CEW of respective memory blocks. The wear lever 320 may perform the wear leveling operation based on the average cumulative effective wearing 344b. In one example, the wear leveler 320 may set a priority of a memory block based on the cumulative effective wearing. For example, the wear lever 320 may set a memory block having the cumulative effective wearing CEW larger than the average cumulative effective wearing 344b to a low priority. In another example, the wear lever 320 may set a memory block having the cumulative effective wearing CEW smaller than the average cumulative effective wearing 344b to a high priority. A deviation of cumulative effective wearing 344b of respective memory blocks may be reduced by the above-described operation of the wear leveler 320.

The per-block state table 344c stores erase states of memory blocks of the nonvolatile memory. In the example embodiment shown in FIG. 8, the per-block state table 344c stores an erase count EC; effective wearing EW; and cumulative effective wearing CEW for each memory block. The per-block state table 344c also stores a write mode WM and/or a read enhanced write mode REWM. The storage controller 210 may determine a write mode WM according to the effective wearing EW. Alternatively, the write mode WM may be forcibly set regardless of the effective wearing EW.

The per-block state table 344c may store and update the above-described information. The per-block state table 344c may provide state information of a selected memory block in response to a request from the dynamic access manager 330.

Figure 9:
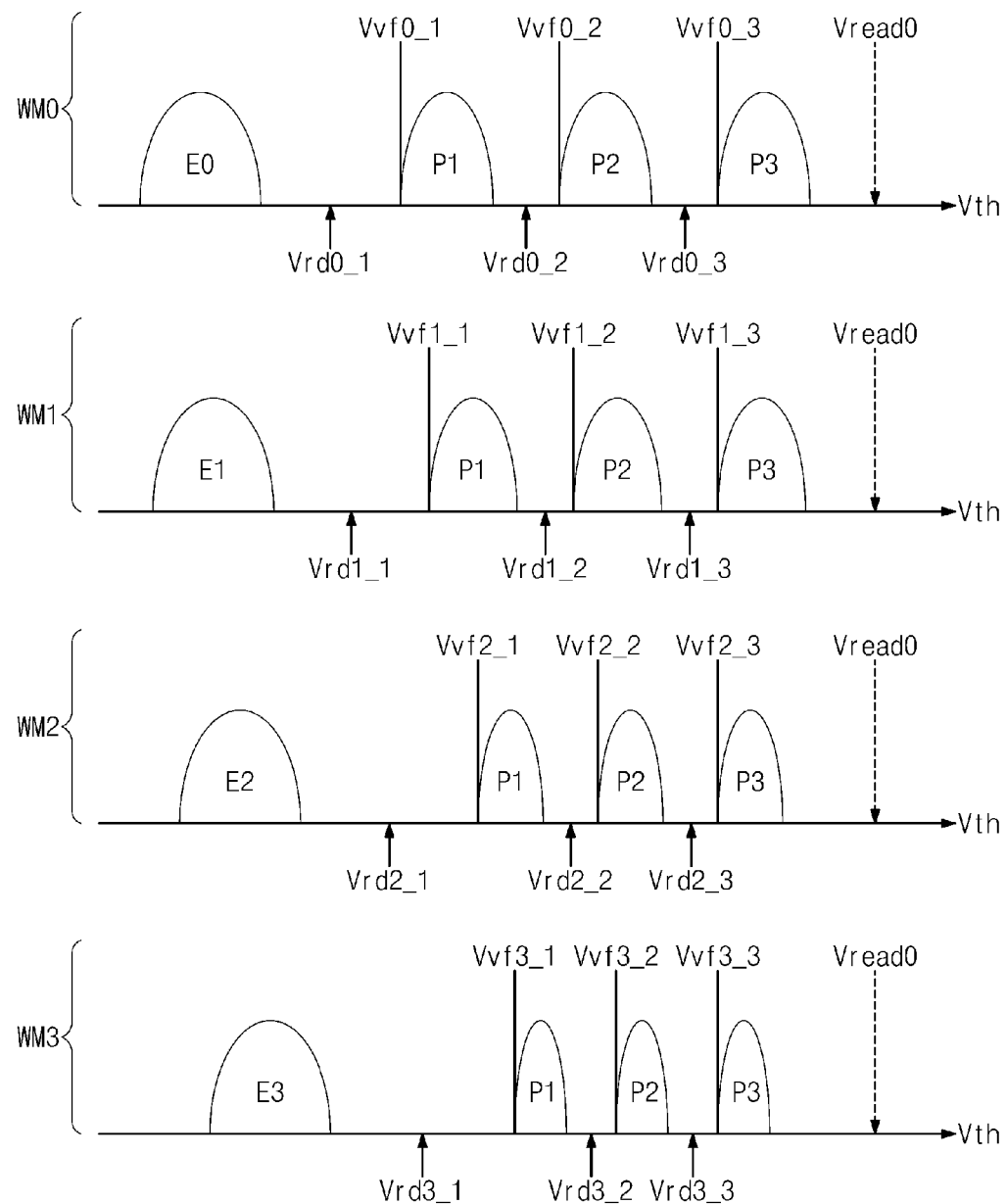
FIG. 9 is a diagram schematically illustrating write modes according to an example embodiment of inventive concepts.

FIG. 9 is a diagram schematically illustrating example write modes according to an example embodiment of inventive concepts.

FIG. 9 illustrates example threshold voltage distributions of memory cells formed according to four write modes WM0 to WM3. However, the number of write modes is not limited to 4, but may be changed to be less or more than 4. In this example, a write mode WM is based on erase states E0 to E3. However, the write mode WM may be selected by a host 100 (e.g., in an urgent case) regardless or independent of an erase state of the memory block.

Referring to FIG. 9, the default write mode WM0 may be applied to a memory block in which threshold voltages of memory cells erased through an erase operation correspond to the erase state E0. For example, the default write mode WM0 may be applied to a free block prepared by the default write mode WM0. A verification voltage set Vvf0_1, Vvf0_2, and Vvf0_3 may be provided to selected memory cells for a program operation corresponding to the default write mode WM0. Also, a level of a program voltage Vpgm for incremental step pulse programming (ISPP) may be varied according to a write mode. For example, an increment of the program voltage Vpgm applied during the default write mode WM0 may be relatively larger than other write modes WM1 to WM3. A write speed when the default write mode WM0 is applied may be faster than the write speed when other write modes WM1 to WM3 are applied.

When the first write mode WM1 is applied, threshold voltages of memory cells form an erase state E1 and program states P1 to P3. A program voltage Vpgm and a verification voltage set Vvf1_1, Vvf1_2, and Vvf1_3 may be applied to a word line of selected memory cells for a program operation corresponding to the first write mode WM1. A program speed corresponding to the first write mode WM1 may be slower than the write speed corresponding to the default write mode WM0. It may be desirable to select a memory block erased according to a first erase mode EM1 to perform the first write mode WM1.

When the second write mode WM2 is applied, threshold voltages of memory cells form an erase state E2 and program states P1 to P3. A program voltage Vpgm and a verification voltage set Vvf2_1, Vvf2_2, and Vvf2_3 may be applied to a word line of selected memory cells for a program operation corresponding to the second write mode WM2. A program speed corresponding to the second write mode WM2 may be slower than a write speed corresponding to the first write mode WM1. It may be desirable to select a memory block erased according to a second erase mode EM2 to perform the second write mode WM2 because speed may be improved when memory cells are programmed from the erase state E2 to the program states P1 to P3.

When the third write mode WM3 is applied, threshold voltages of memory cells form an erase state E3 and program states P1 to P3. A program voltage Vpgm and a verification voltage set Vvf3_1, Vvf3_2, and Vvf3_3 may be applied to a word line of selected memory cells for a program operation corresponding to the third write mode WM3. A program speed corresponding to the third write mode WM3 may be slower than the program speed corresponding to the second write mode WM2. It may be desirable to select a memory block erased according to a third erase mode EM3 to perform the third write mode WM3.

Example write modes WM0 to WM3 are described with regard to FIG. 9. And, the write modes WM0 to WM3 may be determined according to erase modes EM0 to EM3. However, a program operation may be performed using a write mode determined regardless or independent of erase modes EM0 to EM3. In addition, levels of verification voltage sets corresponding to the write modes WM0 to WM3 are only examples, and may be varied accordingly.

Figure 10:
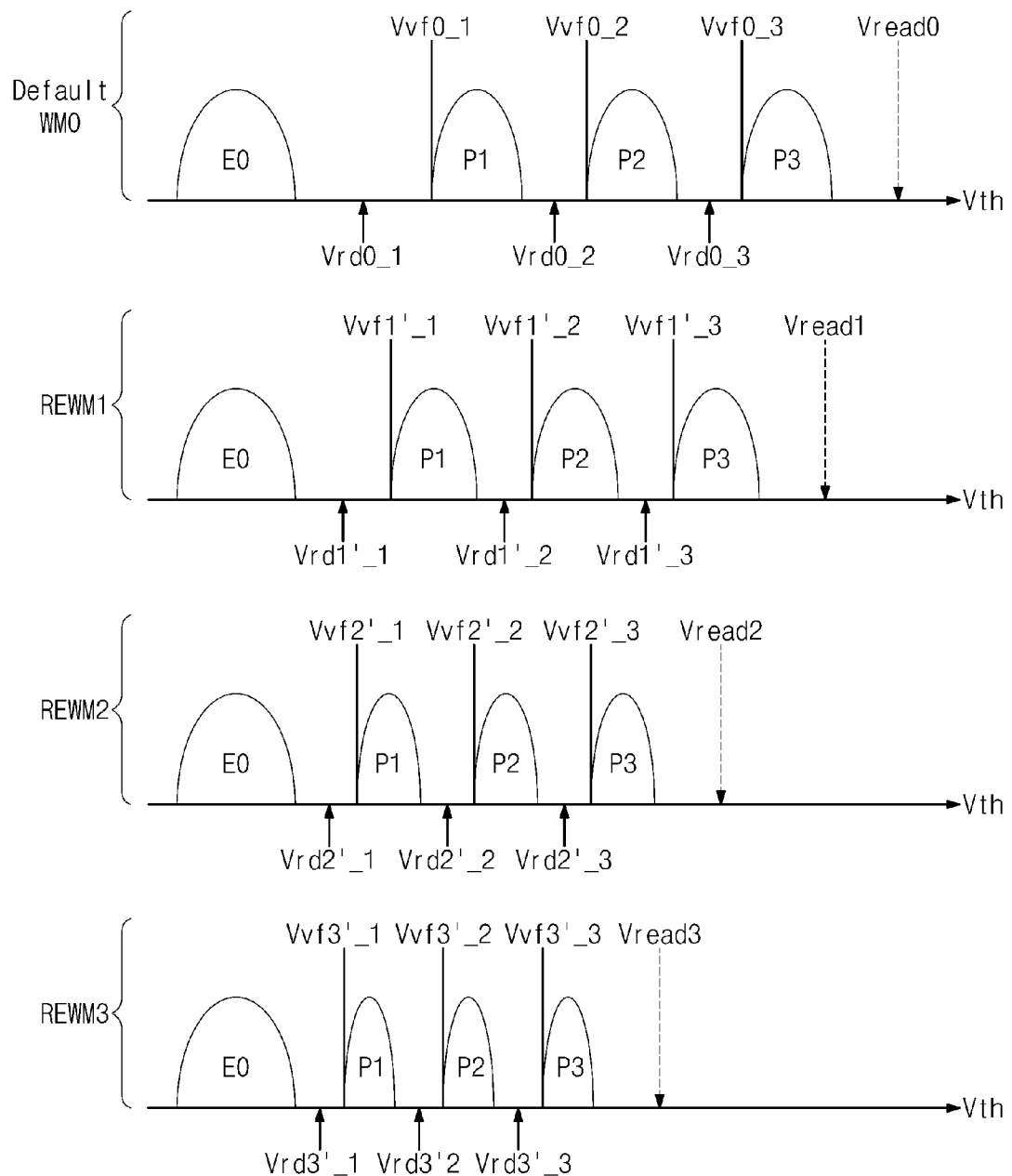
FIG. 10 is a diagram schematically illustrating read enhanced write modes according to an example embodiment of inventive concepts.

FIG. 10 is a diagram schematically illustrating example read enhanced write modes according to an example embodiment of inventive concepts.

FIG. 10 illustrates threshold voltage distributions of selected memory cells formed according to a default write mode WM0 and read enhanced write modes REWM1 to REWM3. However, the number of write modes may be variously changed.

Referring to FIG. 10, the default write mode WM0 is the same as the default write mode WM0 shown in FIG. 9. Thus, a default pass read voltage Vread0 may be applied to read memory cells programmed under the default write mode WM0. The pass read voltage Vread0 may have the highest level among the levels of pass read voltages Vread0 to Vread3.

When the first read enhanced write mode REWM1 is applied, threshold voltages of memory cells form an erase state E0 and program states P1 to P3. A program voltage Vpgm and a verification voltage set Vvf1_1', Vvf1_2', and Vvf1_3' may be applied to a word line of selected memory cells for a program operation corresponding to the first read enhanced write mode REWM1. Locations of the program states P1 to P3 are shifted toward the erase state E0 as compared to the program states P1 to P3 in the default write mode WM0. When the first read enhanced write mode REWM1 is applied, a first pass read voltage Vread1 lower than the default pass read voltage Vread0 may be applied to memory cells during a following read operation. In this case, read disturbance may be reduced.

A program voltage Vpgm and a verification voltage set Vvf2_1', Vvf2_2', and Vvf2_3' may be applied to a word line of selected memory cells for a program operation corresponding to the second read enhanced write mode REWM2. In this case, locations of the program states P1 to P3 are shifted toward the erase state E0 as compared to those at the first read enhanced write mode REWM1. As the second read enhanced write mode REWM2 is applied, a second pass read voltage Vread2 lower than the first pass read voltage Vread1 may be applied to memory cells during a following read operation.

A program voltage Vpgm and a verification voltage set Vvf3_1', Vvf3_2', and Vvf3_3' may be applied to a word line of selected memory cells for a program operation corresponding to the third read enhanced write mode REWM3. In this case, locations of the program states P1 to P3 are shifted toward the erase state E0 as compared to those at the second read enhanced write mode REWM2. As the third read enhanced write mode REWM3 is applied, a third pass read voltage Vread3 lower than the second pass read voltage Vread2 may be applied to memory cells during a following read operation.

Here, levels of verification voltage sets corresponding to the write modes WM0 and REWM1 to REWM3 shown in FIG. 10 are only examples. Various changes or modification on levels of verification voltage sets corresponding to the write modes WM0 and REWM1 to REWM3 may be made.

Figure 11:
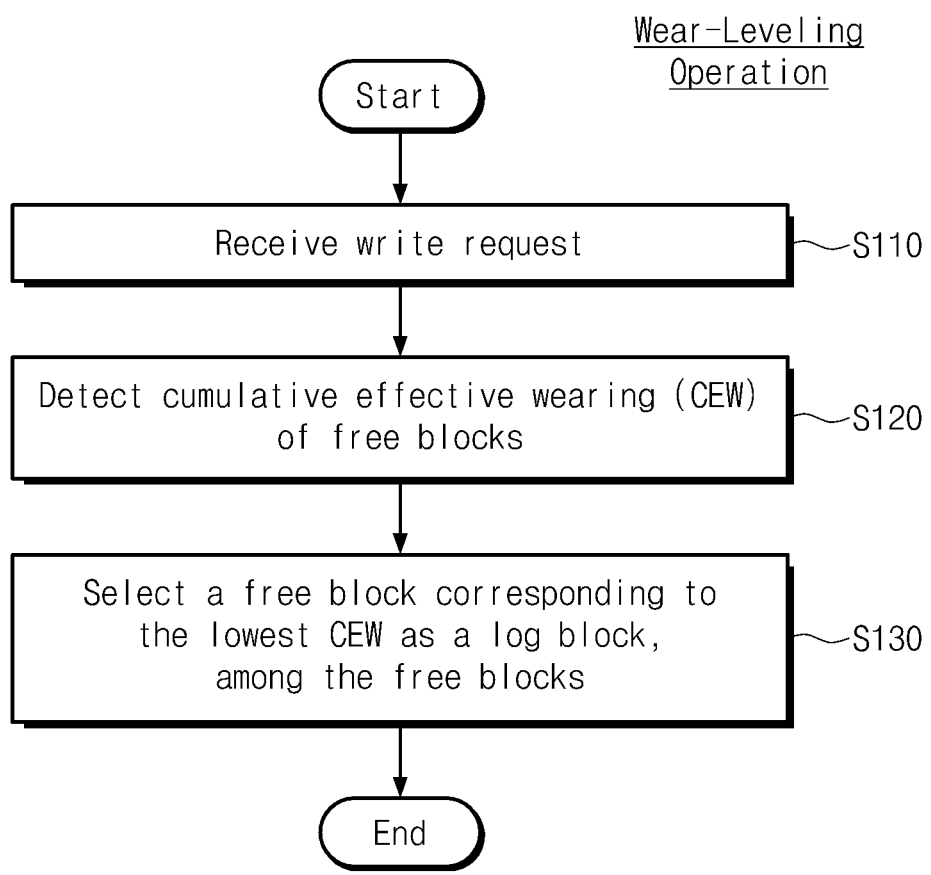
FIG. 11 is a flow chart schematically illustrating a wear leveling method according to an example embodiment of inventive concepts.

FIG. 11 is a flow chart schematically illustrating a wear leveling method according to an example embodiment of inventive concepts. A wear leveling operation performed in response to a write request will be described with reference to FIG. 11. And, for example purposes the example embodiment shown in FIG. 11 will be described with regard to the user device shown in FIG. 2 and the storage controller shown in FIG. 4.

Referring to FIG. 11, at step S110 the memory system 200 receives a write request from the host 100. The flash translation layer FTL of the memory system 200 processes the write request, and the dynamic access manager 330 informs the wear leveler 320 of a write request state.

At step S120, the wear leveler 320 checks states of free blocks in which data is to be written. In more detail, for example, the wear leveler 320 searches and detects the cumulative effective wearing CEW of free blocks stored in the per-block mode table 344.

At step S130, the wear leveler 320 selects a free block having the lowest cumulative effective wearing CEW from among the free blocks as a log block for writing the write requested data. An address of the selected log block is updated in the address mapping table 342. Afterwards, the data is programmed in the log block selected by the wear leveler 320.

With regard to FIG. 11, a wear leveling method according to an example embodiment of inventive concepts is described for example purposes. However, the wear leveling operation may be skipped at various modes of operation. Nevertheless, a priority of a memory block for storing data may be decided based on cumulative effective wearing CEW for various wear leveling operations in the same or substantially the same manner. For example, a data block having a relatively small cumulative effective wearing CEW may be selected first to write valid data for a merge operation.

According to at least one example embodiment, a dynamic access manager may control access to the nonvolatile memory. In one example, the dynamic access manager determines an access mode AMi based on parameters of the per-block mode table and on an access request (e.g., a read request, a write request or an erase request). As mentioned above, at least one of an erase mode EM, effective wearing EW, and cumulative effective wearing CEW for each memory block may be stored in the per-block mode table. If the access request is generated, then the dynamic access manager may initiate an access control operation according to at least one example embodiment of inventive concepts.

Figure 12:
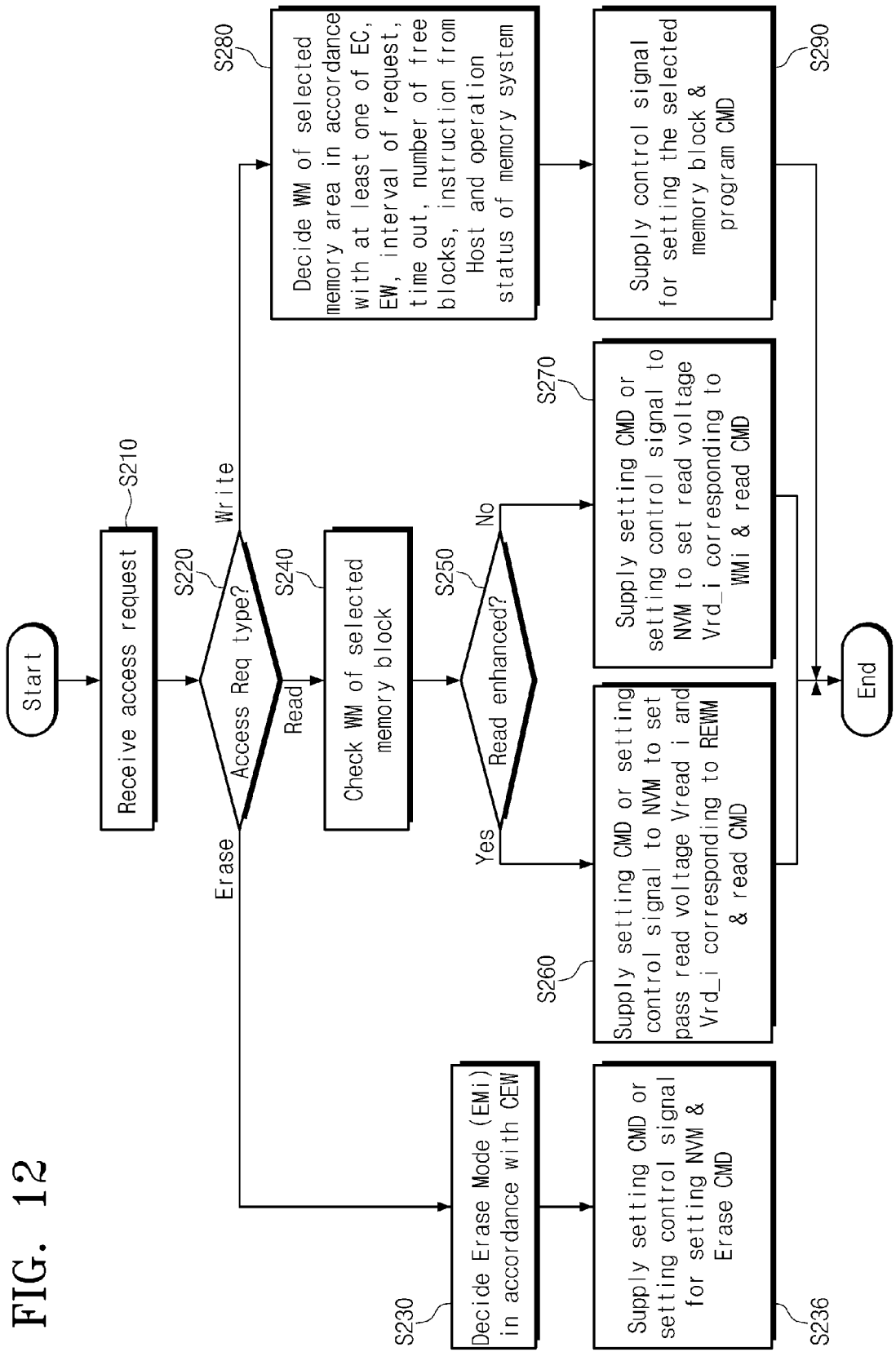
FIG. 12 is a flow chart schematically illustrating an access control method of a dynamic access manager according to an example embodiment of inventive concepts.

FIG. 12 is a flow chart schematically illustrating an access control method of a dynamic access manager according to an example embodiment of inventive concepts. For example purposes, FIG. 12 will be described with regard to the storage controller shown in FIG. 4.

Referring to FIG. 12, at step S210 the storage controller 210b receives an access request generated by the host 100 or internally.

At step S220, the dynamic access manager 330 determines a type of the input access request. If the access request is an erase request corresponding to an erase operation, then the method proceeds to step S230.

At step S230, the dynamic access manager 330 decides an erase mode EMi of a selected memory block based on a level of cumulative effective wearing CEW for the selected memory block. If the level of the cumulative effective wearing CEW is relatively small, then deterioration of an oxide film may be considered to be slight. In this case, the dynamic access manager 330 may select the default erase mode EM0 in which an erase operation is performed using a relatively high level of erase voltage. On the other hand, if the level of the cumulative effective wearing CEW is larger than a reference value, then deterioration of an oxide film may be considered to be relatively high or serious. If the cumulative effective wearing CEW is larger than the reference value, then the dynamic access manager 330 may select erase mode EM3 in which an erase operation is performed using a relatively low level of erase voltage may be selected. A method of deciding an erase mode EMi will be described in more detail below with reference to FIG. 13.

At step S236, the dynamic access manager 330 determines an erase bias (e.g., erase voltage Vers_i, and erase verify voltage Vevf_i) corresponding to the erase mode EMi for the selected memory block. In one example, the dynamic access manager 330 issues a setting command for adjusting an erase bias to the nonvolatile memory device 230. In another example, the dynamic access manager 330 issues a setting control signal for adjusting an erase bias to the nonvolatile memory device 230. After setting the erase bias (Vers_i, Vevf_i) for the selected memory block, the dynamic access manager 330 issues an erase command for the selected memory block. Here, issuing of the erase command and adjusting of the erase bias may be performed at the same or substantially the same time (e.g., simultaneously and/or concurrently).

Returning to step S220, if the access request is a read request corresponding to a read operation, then the method proceeds to step S240.

At step S240, the dynamic access manager 330 detects a write mode WMi of a memory block corresponding to a logical address provided with the read request. In one example, the dynamic access manager 330 detects the write mode WMi of the selected memory block by accessing the per-block mode table 344 of the extended mapping table 340. The detected write mode may be a write mode WMi or a read enhanced write mode REWM.

At step S250, the dynamic access manager 330 determines whether the write mode for the memory block corresponding to the logical address is a read enhanced write mode REWM. If the write mode of the memory block is a read enhanced write mode REWM, then the method proceeds to step S260.

At step S260, the dynamic access manager 330 provides an adjusted read bias and read command for the selected memory block to the nonvolatile memory device 230. Because the memory block is programmed according to a read enhanced write mode REWMi, the read bias may be set according to the read enhanced write mode REWMi. Thus, in this example, the dynamic access manager 330 issues a command and/or a control signal for setting a pass read voltage Vreadi and a read voltage set Vrd_i to the nonvolatile memory device 230. The nonvolatile memory device 230 may set DC levels for the pass read voltage Vreadi and a read voltage set Vrd_i as illustrated in FIG. 10. Step S260 will be more described in more detail later with reference to FIG. 14A.

Returning to step S250, if the write mode of the memory block corresponds to a normal write mode WMi, not the read enhanced write mode REWM, then the method proceeds to step S270.

At step S270, the dynamic access manager 330 issues a command and/or a control signal for adjusting a read bias of the selected memory block to the nonvolatile memory device 230. Because the selected memory block is programmed according to a write mode WMi, a read bias is set to correspond to the write mode WMi. Thus, the dynamic access manager 330 issues a command and/or a control signal for setting a read voltage set Vrd_i corresponding to the write mode WMi to the nonvolatile memory device 230. The nonvolatile memory device 230 may set DC levels to a read voltage set Vrd_i as illustrated in FIG. 9. Afterwards, the dynamic access manager 330 issues a read command for the memory block. Step S270 will be described in more detail later with reference to FIG. 14B.

Returning again to step S220 in FIG. 12, if the access request is a write request corresponding to a write operation, then the method proceeds to step S280.

At step S280, the dynamic access manager 330 decides a write mode WM for a selected memory block based on at least one of an erase mode EM, an erase count EC, effective wearing EW, an interval between write requests, a timeout, the number of free blocks, an instruction from a host or an upper layer, etc. In one example, the write mode for the selected memory block may be decided according to effective wearing EW. However, the dynamic access manager 330 may decide the write mode according to various operation conditions independent and/or regardless of effective wearing EW. Step S280 will be described in more detail later with reference to FIGS. 15 to 19.

At step S290, the dynamic access manager 330 provides the nonvolatile memory device 230 with a setting command and/or a control signal for adjusting DC levels of the nonvolatile memory device 230 to a program bias corresponding to the determined write mode WMi. In one example, the dynamic access manager 330 may provide the nonvolatile memory device 230 with a command set and/or a control signal set for adjusting a program voltage Vpgm and a verification voltage set Vvf_i corresponding to the decided write mode WMi. Then, the nonvolatile memory device 230 may generate a program voltage and a verification voltage set corresponding to one of the write modes WMi illustrated in FIG. 9. The dynamic access manager 330 may then issue a program command for the selected memory area.

In connection with FIG. 12, example operating methods for the dynamic access manager 330 according to write, read, and erase requests have been described. However, inventive concepts are not limited thereto. The dynamic access manager 330 may perform memory management operations for various requests of the host 100 based on effective wearing EW according to example embodiments of inventive concepts.

Figure 13:
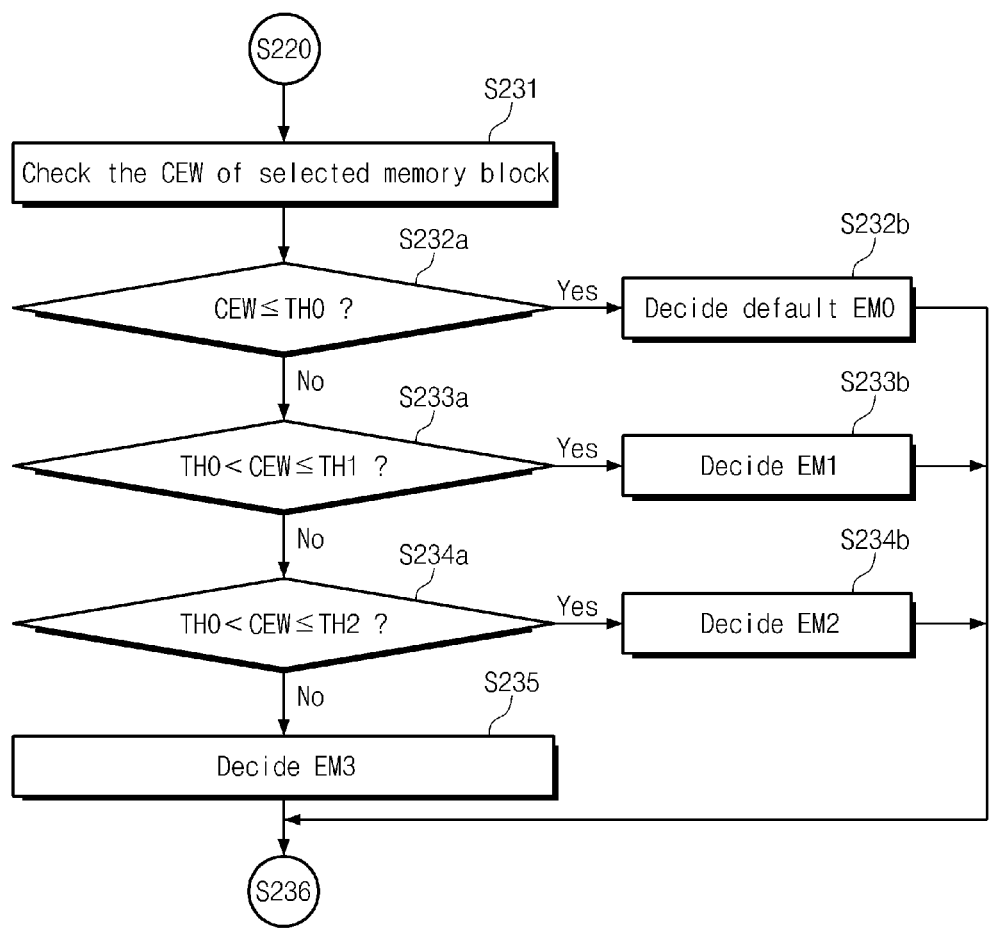
FIG. 13 is a flow chart schematically illustrating an erase mode deciding method according to an example embodiment of inventive concepts.

FIG. 13 is a flow chart schematically illustrating an erase mode deciding method according to an example embodiment of inventive concepts. More specifically, FIG. 13 illustrates an example embodiment of step S230 in FIG. 12 in more detail. In this example, an erase mode is selected according to cumulative effective wearing CEW.

Referring to FIG. 13, at step S231 the dynamic access manager 330 checks the cumulative effective wearing CEW of a selected memory block. The dynamic access manager 330 may acquire the cumulative effective wearing CEW of a memory block to be erased from the per-block mode table 344.

At step S232a, the dynamic access manager 330 compares the cumulative effective wearing CEW with a threshold value TH0. If the cumulative effective wearing CEW is less than or equal to the threshold value TH0, then the method proceeds to step S232b. At step S232b, the dynamic access manager 330 selects a default erase mode EM0 as the erase mode for the selected memory block.

Returning to step S232a, if the cumulative effective wearing CEW is larger than the threshold value TH0, then the method proceeds to step S233a.

At step S233a, the dynamic access manager 330 determines whether the cumulative effective wearing CEW is greater than the threshold value TH0, but less than or equal to a threshold value TH1. If the cumulative effective wearing CEW is greater than the threshold value TH0, but less than or equal to the threshold value TH1, then the method proceeds to step S233b. At step S233b, the dynamic access manager 330 selects a first erase mode EM1 as the erase mode for the selected memory block.

Returning to step S233a, if the cumulative effective wearing CEW is larger than the threshold value TH1, then the method proceeds to step S234a.

At step S234a, the dynamic access manager 330 determines whether the cumulative effective wearing CEW is greater than the threshold value TH1, but less than or equal to a threshold TH2. If the cumulative effective wearing CEW is greater than the threshold value TH1, but less than or equal to the threshold TH2, then the method proceeds to step S234b.

At step S234b, the dynamic access manager 330 selects a second erase mode EM2 as the erase mode of the selected memory block.

Returning to step S234a, if the cumulative effective wearing CEW is larger than the threshold value TH2, then the method proceeds to step S235.

At step S235, the dynamic access manager 330 selects a third erase mode EM3 as the erase mode of the selected memory block.

FIG. 13 illustrates an example embodiment of a method of deciding an erase mode according to cumulative effective wearing CEW. According to at least this example embodiment, an erase mode EMi may be decided according to erase stress actually applied to a memory block selected for erasing. In so doing, a memory block the cumulative erase stress of which is relatively large may be erased using a relatively low erase voltage.

Figure 14A:
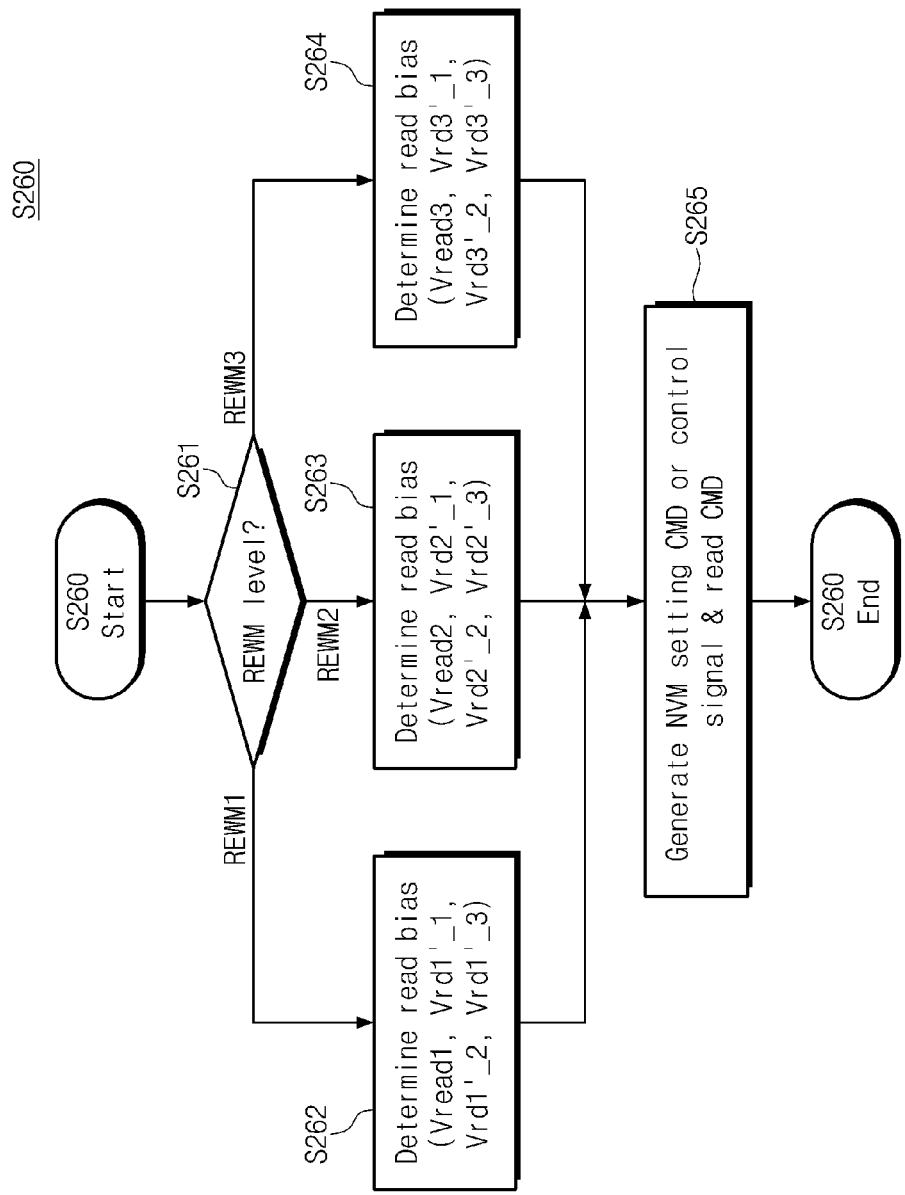
FIG. 14A is a detailed flow chart illustrating an example embodiment of step S260 of FIG. 12.

FIG. 14A is a flow chart illustrating an example embodiment of step S260 shown in FIG. 12. More specifically, FIG. 14A illustrates a read operation for a memory block in which data is written according to a read enhanced write mode REWM.

Referring to FIG. 14A, at step S261 the dynamic access manager 330 detects a level of the read enhanced write mode REWM. In one example, the dynamic access manager 330 may check a level of a read enhanced write mode REWM of a selected memory block by accessing the per-block mode table 344.

If the data stored in the read requested memory block was programmed using a read enhanced write mode REWM1, then the method proceeds to step S262.

At step S262, the dynamic access manager 330 decides a read bias for the memory block programmed according to the read enhanced write mode REWM1. The dynamic access manager 330 may select a pass read voltage Vread1 and a read voltage set (Vrd1'_1, Vrd1'_2, Vrd1'_3) corresponding to the read enhanced write mode REWM1 as a read bias. Examples of the pass read voltage Vread1 and the read voltage set (Vrd1'_1, Vrd1'_2, Vrd1'_3) are illustrated in FIG. 10. The method then proceeds to step S265.

At step S265, the dynamic access manager 330 issues a command and/or a control signal to set a read bias of the selected memory block to the nonvolatile memory device 230. Then, the dynamic access manager 330 issues a read command and/or a control signal to the nonvolatile memory device 230 to read data stored in the selected memory block.

Returning to step S261, if data of the read requested memory block was programmed using a read enhanced write mode REWM2, then the method proceeds to step S263.

At step S263, the dynamic access manager 330 decides a read bias of a memory block programmed according to the read enhanced write mode REWM2. The dynamic access manager 330 may select a pass read voltage Vread2 and a read voltage set (Vrd2'_1, Vrd2'_2, Vrd2'_3) corresponding to the read enhanced write mode REWM2 as a read bias. Examples of the pass read voltage Vread2 and the read voltage set (Vrd2'_1, Vrd2'_2, Vrd2'_3) are illustrated in FIG. 10. After deciding the read bias, the method proceeds to step S265 and continues as discussed above.

Returning again to step S261, if data of the read requested memory block was programmed using a read enhanced write mode REWM3, then the method proceeds to step S264.

At step S264, the dynamic access manager 330 decides a read bias of a memory block programmed according to the read enhanced write mode REWM3. The dynamic access manager 330 may select a pass read voltage Vread3 and a read voltage set (Vrd3'_1, Vrd3'_2, Vrd3'_3) corresponding to the read enhanced write mode REWM3 as a read bias. Examples of the pass read voltage Vread3 and the read voltage set (Vrd3'_1, Vrd3'_2, Vrd3'_3) are illustrated in FIG. 10. After deciding the read bias, the method proceeds to step S265 and continues as discussed above.

In connection with FIG. 14A, an example embodiment is described with regard to a read control operation when a memory block selected in response to a read request is a memory block in which data is written according to a read enhanced write mode REWM. This read mode may be applied to a memory block that is a target of iterative read operations.

Figure 14B:
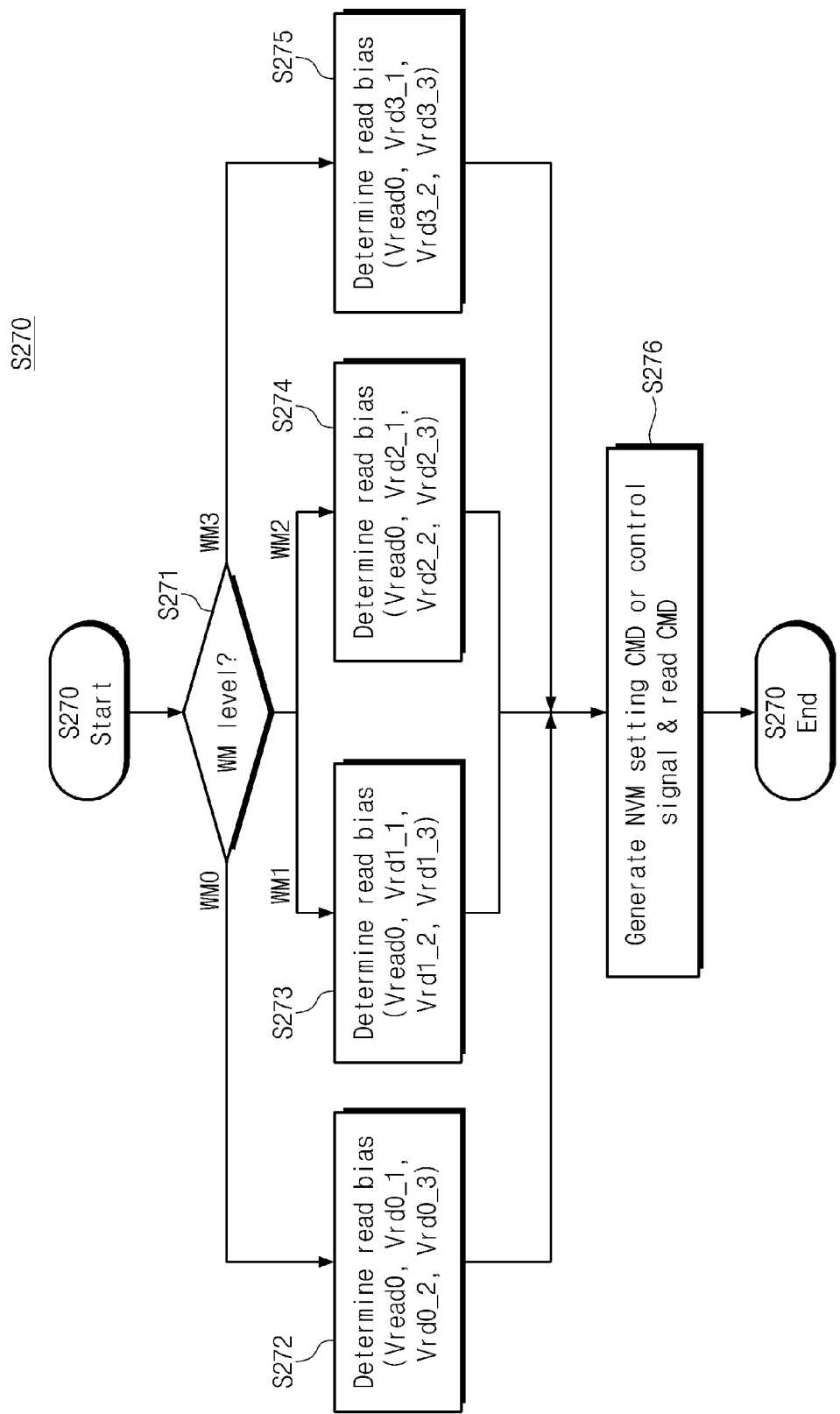
FIG. 14B is a detailed flow chart illustrating an example embodiment of step S270 of FIG. 12.

FIG. 14B is a flow chart illustrating an example embodiment of step S270 in FIG. 12. More specifically, FIG. 14B illustrates a read operation for a memory block in which data is written according to a write mode WMi. That is, for example, FIG. 14B illustrates an example embodiment of a read control operation when a memory block selected in response to a read request is a memory block in which data is written according to write modes WM0 to WM3.

Referring to FIG. 14B, at step S271 the dynamic access manager 330 detects a level or type of a write mode WMi. In one example, the dynamic access manager 330 may check a type of write mode WMi of a selected memory block by accessing the per-block mode table 344. If the dynamic access manager 330 determines the write mode based only on effective wearing EW, then the effective wearing EW may be detected instead of the write mode WMi. If data of a read requested memory block corresponds to a default write mode WM0, then the method proceeds to step S272.

At step S272, the dynamic access manager 330 determines a read bias for a memory block programmed according to the default write mode WM0. The dynamic access manager 330 may select a pass read voltage Vread0 and a read voltage set (Vrd0_1, Vrd0_2, Vrd0_3) corresponding to the default write mode WM0 as a read bias. Examples of the pass read voltage Vread0 and the read voltage set (Vrd0_1, Vrd0_2, Vrd0_3) are illustrated in FIG. 9. After deciding the read bias, the method proceeds to step S276.

At step S276, the dynamic access manager 330 generates a setting command and/or a control signal for setting a nonvolatile memory device 230 to the selected read bias. Then, the dynamic access manager 330 issues a read command to the nonvolatile memory device 230 with the set the read bias.

Returning to step S271, if the data of a read requested memory block was written using a first write mode WM1, then the method proceeds to step S273.

At step S273, the dynamic access manager 330 decides a read bias of a memory block programmed according to the first write mode WM1. The dynamic access manager 330 may select a pass read voltage Vread0 and a read voltage set (Vrd1_1, Vrd1_2, Vrd1_3) corresponding to the first write mode WM1 as a read bias. Examples of the pass read voltage Vread0 and the read voltage set (Vrd1_1, Vrd1_2, Vrd1_3) are illustrated in FIG. 9. After deciding the read bias, the method proceeds to step S276 and continues as discussed above.

Returning again to step S271, if data of a read requested memory block was programmed using a second write mode WM2, then the method proceeds to step S274.

At step S274, the dynamic access manager 330 decides a read bias of the memory block programmed according to the second write mode WM2. The dynamic access manager 330 may select a pass read voltage Vread0 and a read voltage set (Vrd2_1, Vrd2_2, Vrd2_3) corresponding to the second write mode WM2 as a read bias. Examples of the pass read voltage Vread0 and the read voltage set (Vrd2_1, Vrd2_2, Vrd2_3) are illustrated in FIG. 9. After deciding the read bias, the method proceeds to step S276 and continues as discussed above.

Returning to step S271, if data of the read requested memory block was programmed using a third write mode WM3, then the method proceeds to step S275.

At step S275, the dynamic access manager 330 decides a read bias of the memory block programmed according to the third write mode WM3. The dynamic access manager 330 may select a pass read voltage Vread0 and a read voltage set (Vrd3_1, Vrd3_2, Vrd3_3) corresponding to the third write mode WM3 as a read bias. Examples of the pass read voltage Vread0 and the read voltage set (Vrd3_1, Vrd3_2, Vrd3_3) are illustrated in FIG. 9. After deciding the read bias, the method proceeds to step S276 and continues as discussed above.

Figure 15:
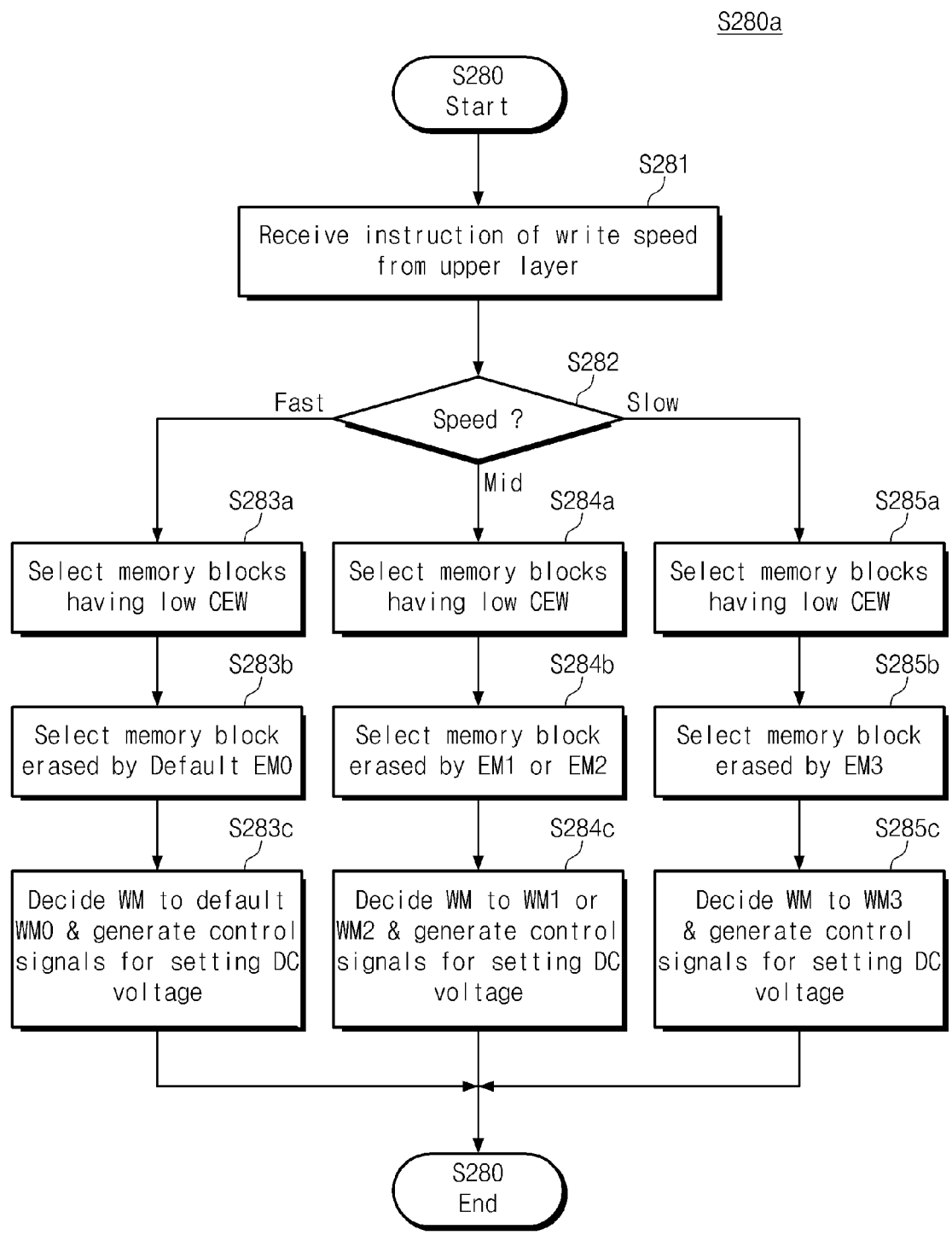
FIG. 15 is a detailed flow chart illustrating an example embodiment of step S280 of FIG. 12.

FIG. 15 is a flow chart illustrating an example embodiment of step S280 in FIG. 12. More specifically, FIG. 12 illustrates a method S280a for selecting a write mode WMi according to an instruction on a write speed provided from a host 100 or an upper software layer.

With regard to FIG. 15, there is described an example embodiment of a write mode setting method when a write speed is directed by the host 100. Since memory block erased by the third erase mode EM3 necessitates a more severe control to program memory cells from an erase state E3 to a program state, a program speed may be lowered. On the other hand, a program speed of memory cells erased by erase mode EM0 may be relatively high.

Referring to FIG. 15, at step S281 the dynamic access manager 330 receives an instruction on a write speed provided from a host 100 or an upper software layer. In one example, the storage controller 210 may receive a write speed from a device driver or an application of the host 100. The dynamic access manager 330 may recognize a value of the write speed. In one example, the write speeds of "Fast", "Mid" and "Slow" may be used. However, inventive concepts are not limited to these examples.

At step S282, the dynamic access manager 330 determines the write speed.

If the write speed for the write requested data corresponds to "Fast", then the method proceeds to step S283a.

At step S283a, the dynamic access manager 330 selects memory blocks, having cumulative effective wearing CEW lower than a minimum or reference value from among memory blocks. The cumulative effective wearing CEW for the memory blocks may be stored in the per-block mode table 344. Such selection may be performed together with the wear leveler 320.

At step S283b, the dynamic access manager 330 selects a memory block erased according to an erase mode EM0 from among the memory blocks selected based on the cumulative effective wearing CEW. In example embodiments, an order of steps S283a and S283b may be varied.

At step S283c, the dynamic access manager 330 selects the default write mode WM0 as the write mode for the selected memory block. The dynamic access manager 330 then issues a command and/or a control signal for setting a write bias of the selected memory block to the nonvolatile memory device 230.

Returning to step S282, if the write speed of the write requested data corresponds to "Mid", then the method proceeds to step S284a.

At step S284a, the dynamic access manager 330 selects memory blocks having cumulative effective wearing CEW lower than a minimum or reference value from among memory blocks according to the cumulative effective wearing CEW stored in the per-block mode table 344. Such selection may be performed together with the wear leveler 320.

At step S284b, the dynamic access manager 330 selects a memory block erased according to erase mode EM1 or EM2 from among the memory blocks selected based on the cumulative effective wearing CEW. In example embodiments, the order of steps S284a and S284b may be varied.

At step S284c, the dynamic access manager 330 selects a write mode WM1 or WM2 as the write mode of the selected memory block. The dynamic access manager 330 then issues a command and/or a control signal for setting a write bias of the selected memory block to the nonvolatile memory device 230.

Returning again to step S282, if the write speed for the write requested data corresponds to "Slow", then the method proceeds to step S285a.

At step S285a, the dynamic access manager 330 selects memory blocks having cumulative effective wearing CEW lower than a minimum or reference value from among memory blocks based on the cumulative effective wearing CEW stored in the per-block mode table 344. Such selection may be performed together with the wear leveler 320.

At step S285b, the dynamic access manager 330 selects a memory block erased according to an erase mode EM3 from among the memory blocks selected based on the cumulative effective wearing CEW. In example embodiments, the order of steps S285a and S285b may be varied.

At step S285c, the dynamic access manager 330 selects a write mode WM3 as the write mode for the selected memory block. The dynamic access manager 330 then issues a command and/or a control signal for setting a write bias of the selected memory block to the nonvolatile memory device 230.

Figure 16:
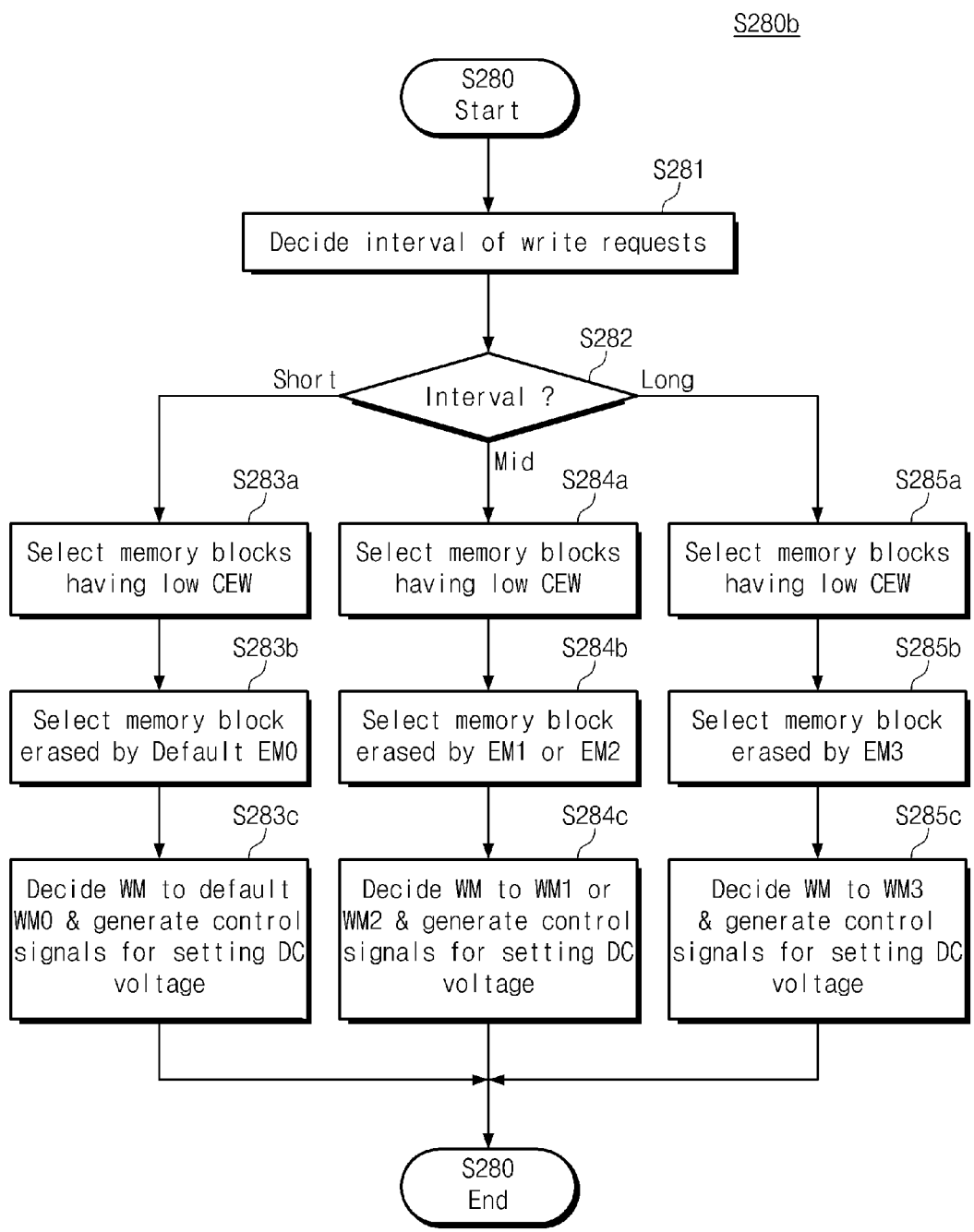
FIG. 16 is a flow chart schematically illustrating a write mode deciding method according to another example embodiment of inventive concepts.

FIG. 16 is a flow chart schematically illustrating an example embodiment of a write mode deciding method S280b. In the method shown in FIG. 16, the dynamic access manager 330 decides a write mode WMi based on a time interval between write requests of the host 100.

With regard to FIG. 16, there is described an example embodiment where a write mode is selected according to a time interval between write requests provided from the host 100. An interval between write requests may be decided based on an interval between a current write request and a previous write request or an interval between a current write request and a next write request predicted.

Referring to FIG. 16, at step S281 the dynamic access manager 330 determines a time interval between write requests provided from the host 100. For example, the dynamic access manager 330 may compare a time interval between a previous write request and a current write request with a reference interval. Alternatively, the dynamic access manager 330 may predict an input point of time of a next write request based on an input history of write requests provided from the host 100. The dynamic access manager 330 decides a write mode for a current write request based on a time interval between the predicted write request and the current write request. Here, the time intervals of "Short", "Mid" and "Long" are used. However, inventive concepts are not limited to these examples.

At step S282, the dynamic access manager 330 determines the time interval. If the time interval corresponds to "Short", then the method proceeds to step S283a.

At step S283a, the dynamic access manager 330 selects memory blocks, having cumulative effective wearing CEW lower than a minimum or reference value from among memory blocks. The cumulative effective wearing for the memory blocks may be stored in the per-block mode table 344. Such selection may be performed together with the wear leveler 320.

At step S283b, the dynamic access manager 330 selects a memory block erased according to an erase mode EM0 from among the memory blocks selected based on the cumulative effective wearing CEW. In example embodiments, an order of steps S283a and S283b may be varied.

At step S283c, the dynamic access manager 330 selects the default write mode WM0 as the write mode for the selected memory block. The dynamic access manager 330 then issues a command and/or a control signal for setting a write bias of the selected memory block to the nonvolatile memory device 230. According to at least this example embodiment, if a time interval between write requests predicted or detected is short, then the default write mode WM0 may be selected to write data at high speed.

Returning to step S282, if the time interval corresponds to "Mid", then the method proceeds to step S284a.

At step S284a, the dynamic access manager 330 selects memory blocks having cumulative effective wearing CEW lower than a minimum or reference value from among memory blocks according to the cumulative effective wearing CEW stored in the per-block mode table 344. Such selection may be performed together with the wear leveler 320.

At step S284b, the dynamic access manager 330 selects a memory block, erased according to erase mode EM1 or EM2 from among the memory blocks selected based on the cumulative effective wearing CEW. In example embodiments, the order of steps S284a and S284b may be varied.

At step S284c, the dynamic access manager 330 selects a write mode WM1 or WM2 as the write mode of the selected memory block. The dynamic access manager 330 then issues a command and/or a control signal for setting a write bias of the selected memory block to the nonvolatile memory device 230.

Returning again to step S282, if the time interval corresponds to "Long", then the method proceeds to step S285a.

At step S285a, the dynamic access manager 330 selects memory blocks having cumulative effective wearing CEW lower than a minimum or reference value from among memory blocks based on the cumulative effective wearing CEW stored in the per-block mode table 344. Such selection may be performed together with the wear leveler 320.

At step S285b, the dynamic access manager 330 selects a memory block erased according to an erase mode EM3 from among the memory blocks selected based on the cumulative effective wearing CEW. In example embodiments, the order of steps S285a and S285b may be varied.

At step S285c, the dynamic access manager 330 selects a write mode WM3 as the write mode for the selected memory block. The dynamic access manager 330 then issues a command and/or a control signal for setting a write bias of the selected memory block to the nonvolatile memory device 230.

According to at least this example embodiment, if a time interval between write requests predicted or detected is long, then the dynamic access manager 330 may select the write mode WM3 that provides a relatively slow speed, but has relatively high reliability.

Figure 17:
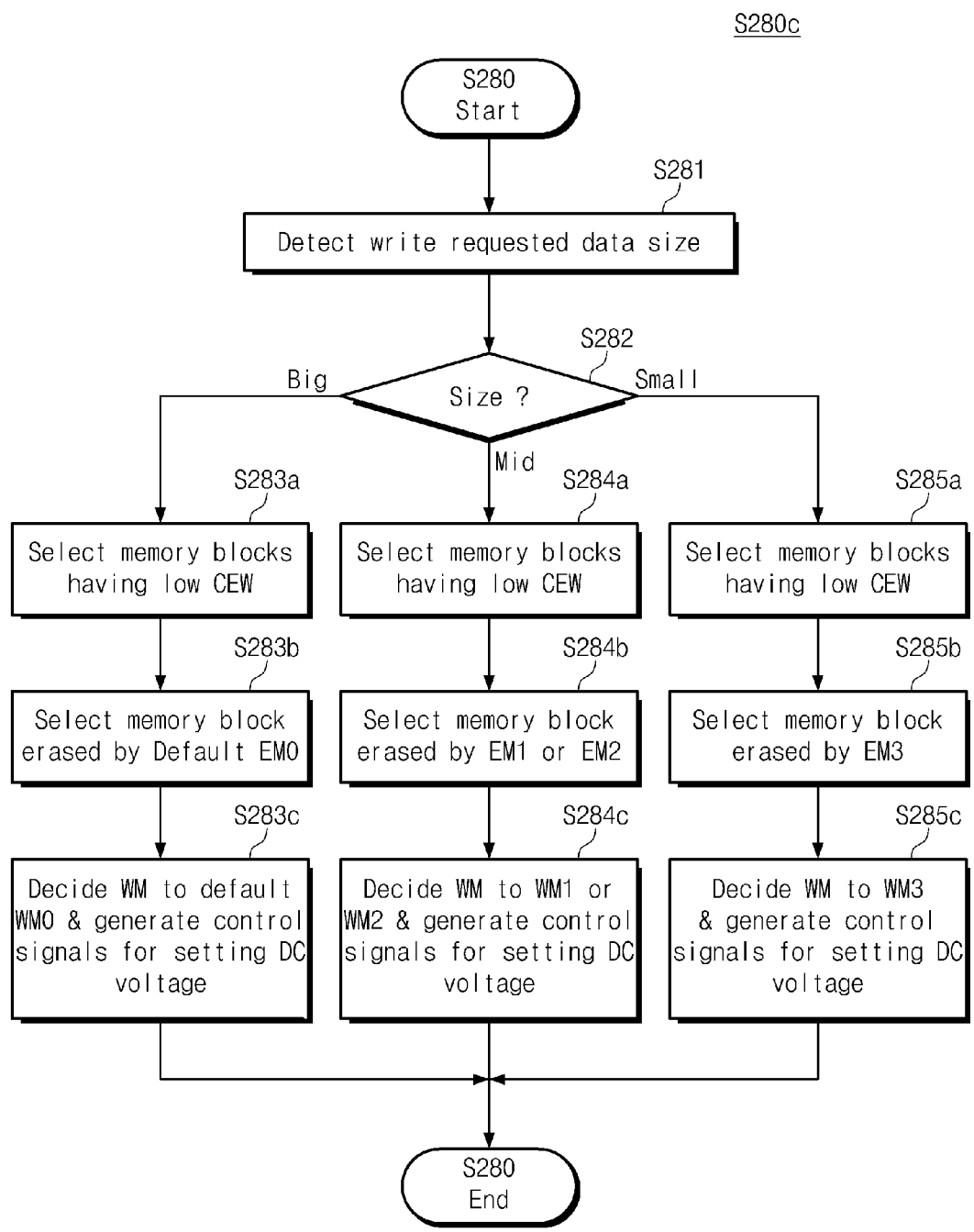
FIG. 17 is a flow chart schematically illustrating a write mode deciding method according to still another example embodiment of inventive concepts.

FIG. 17 is a flow chart schematically illustrating another example embodiment of a write mode deciding method S280c. In FIG. 17, the dynamic access manager 330 decides a write mode WMi based on the size of data write requested by a host 100.

With regard to FIG. 17, there is described an example embodiment of a method of deciding a write mode according to the size of data write requested by the host 100. In at least some example embodiments, a write mode may be decided using the sizes of data the number of which is two or four or more, and the number of write modes may be variously changed.

At step S281, the dynamic access manager 330 detects the size of data to be written at the request of the host 100. For example, the dynamic access manager 330 may determine the size of data based on a logical address of the write requested data. That is, for example, the dynamic access manager 330 may determine the size of data based on a start address and the number of sectors of data. Here, the data sizes of "Big", "Mid" and "Small" are used. However, inventive concepts are not limited to these examples.

At step S282, the dynamic access manager determines whether the size of data is "Big", "Mid" or "Small".

If the size of data corresponds to "Big", then the method proceeds to step S283a.

At step S283a, the dynamic access manager 330 selects memory blocks, having cumulative effective wearing CEW lower than a minimum or reference value from among memory blocks. The cumulative effective wearing for the memory blocks may be stored in the per-block mode table 344. Such selection may be performed together with the wear leveler 320.

At step S283b, the dynamic access manager 330 selects a memory block erased according to an erase mode EM0 from among the memory blocks selected based on the cumulative effective wearing CEW. In example embodiments, an order of steps S283a and S283b may be varied.

At step S283c, the dynamic access manager 330 selects the default write mode WM0 as the write mode for the selected memory block. The dynamic access manager 330 then issues a command and/or a control signal for setting a write bias of the selected memory block to the nonvolatile memory device 230.

According to at least this example embodiment, if the size of data is bigger than a reference value, then the dynamic access manager 330 may select the default write mode WM0 in which data is written at high speed to end a write operation within a timeout interval.

Returning to step S282, if the size of data corresponds to "Mid", then the method proceeds to step S284a.

At step S284a, the dynamic access manager 330 selects memory blocks having cumulative effective wearing CEW lower than a minimum or reference value from among memory blocks according to the cumulative effective wearing CEW stored in the per-block mode table 344. Such selection may be performed together with the wear leveler 320.

At step S284b, the dynamic access manager 330 selects a memory block, erased according to erase mode EM1 or EM2 from among the memory blocks selected based on the cumulative effective wearing CEW. In example embodiments, the order of steps S284a and S284b may be varied.

At step S284c, the dynamic access manager 330 selects a write mode WM1 or WM2 as the write mode of the selected memory block. The dynamic access manager 330 then issues a command and/or a control signal for setting a write bias of the selected memory block to the nonvolatile memory device 230.

Returning to step S282, if the size of data corresponds to "Small", then the method proceeds to step S285a.

At step S285a, the dynamic access manager 330 selects memory blocks having cumulative effective wearing CEW lower than a minimum or reference value from among memory blocks based on the cumulative effective wearing CEW stored in the per-block mode table 344. Such selection may be performed together with the wear leveler 320.

At step S285b, the dynamic access manager 330 selects a memory block erased according to an erase mode EM3 from among the memory blocks selected based on the cumulative effective wearing CEW. In example embodiments, the order of steps S285a and S285b may be varied.

At step S285c, the dynamic access manager 330 selects a write mode WM3 as the write mode for the selected memory block. The dynamic access manager 330 then issues a command and/or a control signal for setting a write bias of the selected memory block to the nonvolatile memory device 230.

According to at least this example embodiment, if the size of data is smaller than the reference value, then the dynamic access manager 330 may select the write mode WM3 that provides a relatively slow speed, but has relatively high reliability.

Figure 18:
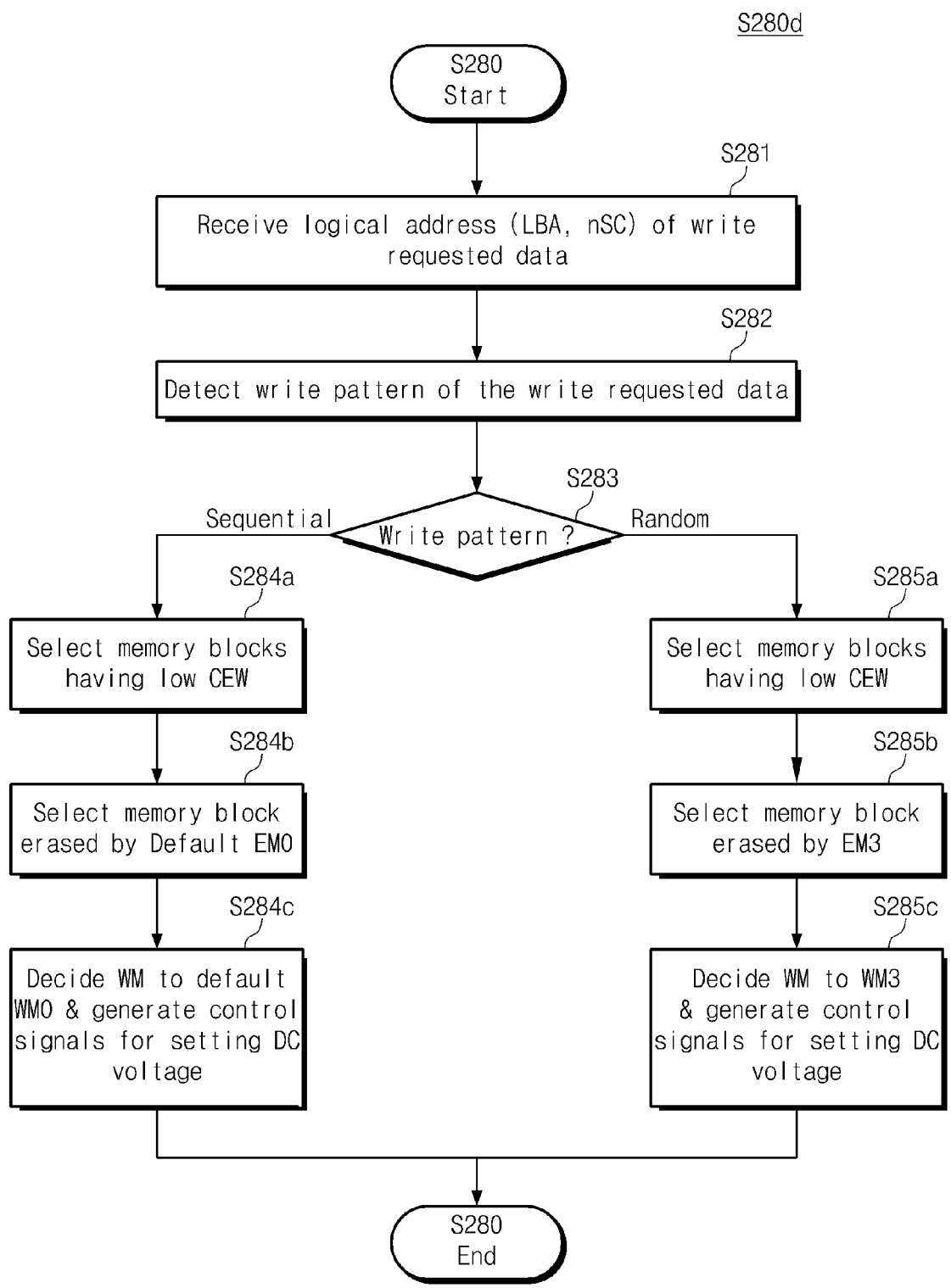
FIG. 18 is a flow chart schematically illustrating a write mode deciding method according to another example embodiment of inventive concepts.

FIG. 18 is a flow chart schematically illustrating a write mode deciding method S280d according to another example embodiment of inventive concepts. In the example embodiment shown in FIG. 18, the dynamic access manager 330 decides a write pattern of write requested data based on a logical address (LBA, nSC) provided at a write request.

With regard to FIG. 18, there is described an example embodiment in which a write mode is selected according to a pattern of data write requested by the host 100. Here, the default write mode WM0 in which data is written at relatively high speed may be allocated to data having the sequential write pattern, and the write mode WM3 in which data is written at relatively slow speed may be allocated to data having the random write pattern. However, it is understood that the write mode WM3 may be allocated to data having the sequential write pattern, and the default write mode WM0 may be allocated to data having the random write pattern. There is described an example embodiment in which a write pattern is determined based on a logical address (LBA, nSC). However, it is understood that a write pattern may be determined by various algorithms.

Referring to FIG. 18, at step S281, the dynamic access manager 330 receives a logical address (LBA, nSC) corresponding to a write request from the host 100.

At step S282, the dynamic access manager 330 detects a write pattern for the write requested data based on a logical address (LBA, nSC).

At step S283, the dynamic access manager 330 determines whether the detected write pattern of the write requested data corresponds to a sequential write pattern or a random write pattern based on an address of the write requested data.

If the detected write pattern of the write requested data corresponds to the sequential write pattern, then the method proceeds to step S284a.

At step S284a, the dynamic access manager 330 selects memory blocks, having cumulative effective wearing CEW lower than a minimum or reference value from among memory blocks. The cumulative effective wearing for the memory blocks may be stored in the per-block mode table 344. Such selection may be performed in line with a wear leveler 320.

At step S284b, the dynamic access manager 330 selects a memory block erased according to an erase mode EM0 from among the memory blocks selected based on the cumulative effective wearing CEW. In example embodiments, an order of steps S283a and S283b may be varied.

At step S284c, the dynamic access manager 330 selects the default write mode WM0 as the write mode for the selected memory block. The dynamic access manager 330 then issues a command and/or a control signal for setting a write bias of the selected memory block to the nonvolatile memory device 230.

According to at least this example embodiment, if the detected write pattern of the write requested data corresponds to the sequential write pattern, the default write mode WM0 in which data is written at relatively high speed may be selected to end a write operation within a timeout interval.

Returning to step S283, if the detected write pattern of the write requested data corresponds to the random write pattern, then the method proceeds to step S285a.

In step S285a, the dynamic access manager 330 selects memory blocks having cumulative effective wearing CEW lower than a minimum or reference value from among memory blocks based on the cumulative effective wearing CEW stored in the per-block mode table 344. Such selection may be performed together with the wear leveler 320.

At step S285b, the dynamic access manager 330 selects a memory block erased according to an erase mode EM3 from among the memory blocks selected based on the cumulative effective wearing CEW. In example embodiments, the order of steps S285a and S285b may be varied.

In step S285c, the dynamic access manager 330 selects a write mode WM3 as the write mode for the selected memory block. The dynamic access manager 330 then issues a command and/or a control signal for setting a write bias of the selected memory block to the nonvolatile memory device 230.

According to at least this example embodiment, if the detected write pattern of the write requested data corresponds to the random write pattern, then the dynamic access manager 330 may select the write mode WM3 that provides a relatively slow speed but has relatively high reliability.

Figure 19:
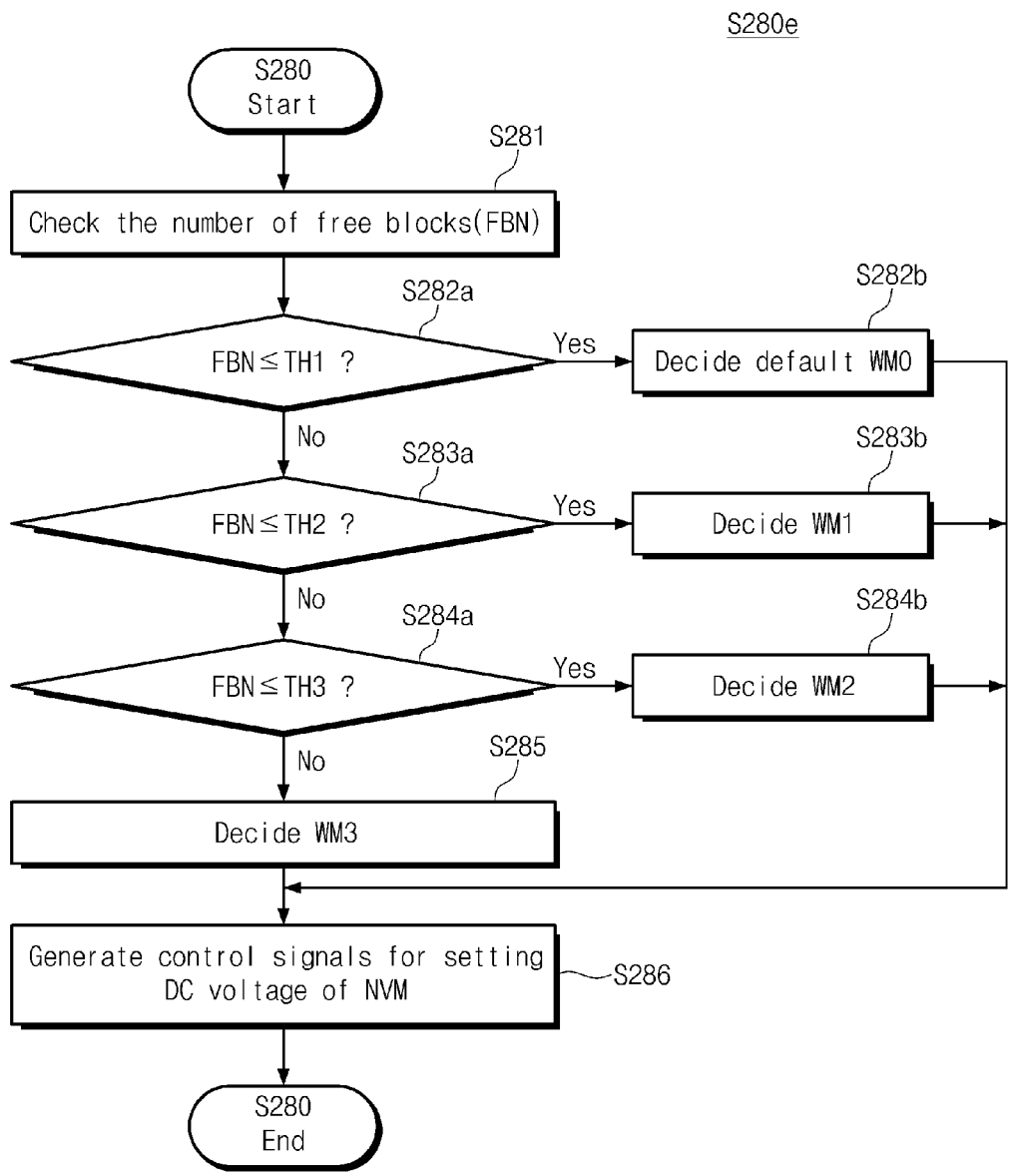
FIG. 19 is a flow chart schematically illustrating a write mode deciding method according to yet another example embodiment of inventive concepts.

FIG. 19 is a flow chart schematically illustrating a write mode deciding method S280e according to yet another example embodiment of inventive concepts. In the example embodiment shown in FIG. 19, the dynamic access manager 330 decides a write pattern of write requested data based on a number of free blocks.

With regard to FIG. 19, there is described a method of deciding a write mode based on a number of free blocks FBN. According to at least this example embodiment, a relatively fast write mode is selected to lead a relatively quick merge operation when the number of free blocks FBN is insufficient. In another example, when the number of free blocks FBN is insufficient, a merge operation may be performed in the background manner, and a relatively slow write mode may be selected.

Referring to FIG. 19, at step S281 the dynamic access manager 330 checks the number of free blocks FBN in which data corresponding to a write request from a host 100 is to be written. The write requested data may be stored in a log block selected from among the free blocks. If the number of free blocks FBN is sufficient, then an operation of generating free blocks may be unnecessary. On the other hand, if the number of free blocks FBN is insufficient, then the operation of generating free blocks may be performed. The dynamic access manager 330 according to at least some example embodiments may support a high-speed write mode when the number of free blocks FBN is insufficient such that a merge operation to be later performed is shifted ahead. The dynamic access manager 330 may check the number of free blocks FBN by searching an address mapping table 342.

At step S282a, the dynamic access manager 330 determines whether the number of free blocks FBN is less than or equal to a first threshold value TH1. If the number of free blocks FBN is less than or equal to the first threshold value TH1, then the method proceeds to step S282b.

At step S282b, the dynamic access manager 330 selects a default write mode WM0 as a write mode for the selected memory block.

At step S286, the dynamic access manager 330 issues a command and/or a control signal for setting the write bias of the selected memory block to a nonvolatile memory device 230.

Returning to step S282a, if the number of free blocks FBN is more than the first threshold value TH1, then the method proceeds to step S283a.

At step S283a, the dynamic access manager 330 determines whether the number of free blocks FBN is more than the first threshold value TH1, but and less than or equal to a second threshold value TH2. If the number of free blocks FBN is more than the first threshold value TH1, but less than or equal to the second threshold value TH2, then the method proceeds to step S283b.

At step S283b, the dynamic access manager 330 selects a first write mode WM1 as a write mode for the selected memory block. The method then proceeds to step S286 and continues as discussed above.

Returning to step S283a, if the number of free blocks FBN is more than the second threshold value TH2, then the method proceeds to step S284a.

At step S284a, the dynamic access manager 330 determines whether the number of free blocks FBN is more than the second threshold value TH2, but less than or equal to a third threshold value TH3.

If the number of free blocks FBN is more than the second threshold value, but less than or equal to the third threshold value TH3, then the method proceeds to step S284b.

At step S284b, the dynamic access manager 330 selects a second write mode WM2 as a write mode for the selected memory block. The method then proceeds to step S286 and continues as discussed above.

Returning to step S284a, if the number of free blocks FBN is more than the third threshold value TH3, then the method proceeds to step S285.

At step S285, the dynamic access manager 330 selects a third write mode WM3 as a write mode for the selected memory block. The method then proceeds to step S286 and continues as discussed above.

Figure 20:
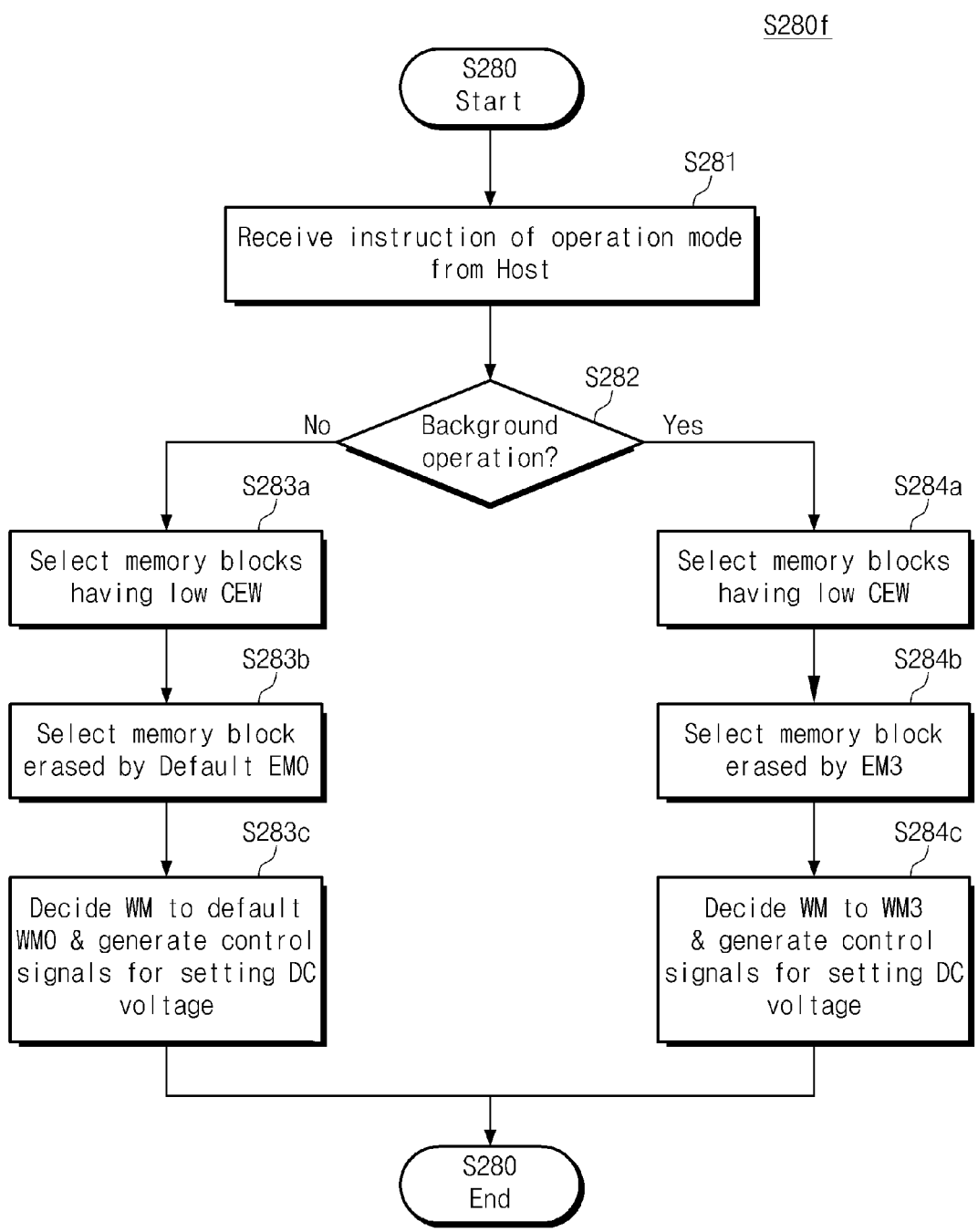
FIG. 20 is a flow chart schematically illustrating a write mode deciding method according to still another example embodiment of inventive concepts.

FIG. 20 is a flow chart schematically illustrating a write mode deciding method S280f according to still another example embodiment of inventive concepts. According to the example embodiment shown in FIG. 20, at a write request, the dynamic access manager 330 decides a write pattern of write requested data based on an operation mode instruction from a host 100.

With regard to FIG. 20, there is described an example embodiment in which a write mode is decided according to whether an operation mode on data write requested by the host 100 corresponds to a background operation. Here, a write speed of write requested data at a background operation may be set to a relatively low speed.

Referring to FIG. 20, at step S281, after receiving a write request from the host 100, the dynamic access manager 330 receives an operation mode instruction corresponding to the write request.

At step S282, the dynamic access manager 330 determines whether the operation mode corresponds to a background operation. If the operation mode does not correspond to background operation, then the method proceeds to step S283a.

In step S283a, the dynamic access manager 330 selects memory blocks, having cumulative effective wearing CEW lower than a minimum or reference value from among memory blocks. The cumulative effective wearing for the memory blocks may be stored in the per-block mode table 344. Such selection may be performed in line with a wear leveler 320.

In step S283b, the dynamic access manager 330 selects a memory block erased according to an erase mode EM0 from among the memory blocks selected based on the cumulative effective wearing CEW. In example embodiments, an order of steps S283a and S283b may be varied.

In step S283c, the dynamic access manager 330 selects the default write mode WM0 as the write mode for the selected memory block. The dynamic access manager 330 then issues a command and/or a control signal for setting a write bias of the selected memory block to the nonvolatile memory device 230.

According to at least this example embodiment, when the operation mode does not correspond to a background operation, the default write mode WM0 to write data at relatively high speed may be selected to end a write operation within a timeout interval.

Returning to step S282, if the operation mode corresponds to the background operation, then the method proceeds to step S284a.

In step S284a, the dynamic access manager 330 selects memory blocks having cumulative effective wearing CEW lower than a minimum or reference value from among memory blocks based on the cumulative effective wearing CEW stored in the per-block mode table 344. Such selection may be performed together with the wear leveler 320.

In step S284b, the dynamic access manager 330 selects a memory block erased according to an erase mode EM3 from among the memory blocks selected based on the cumulative effective wearing CEW. In example embodiments, the order of steps S285a and S285b may be varied.

In step S284c, the dynamic access manager 330 selects a write mode WM3 as the write mode for the selected memory block. The dynamic access manager 330 then issues a command and/or a control signal for setting a write bias of the selected memory block to the nonvolatile memory device 230.

According to at least this example embodiment, if the operation mode corresponds to the background operation, the dynamic access manager 330 may select the write mode WM3 that provides a relatively slow speed, but has relatively high reliability.

Figure 21:
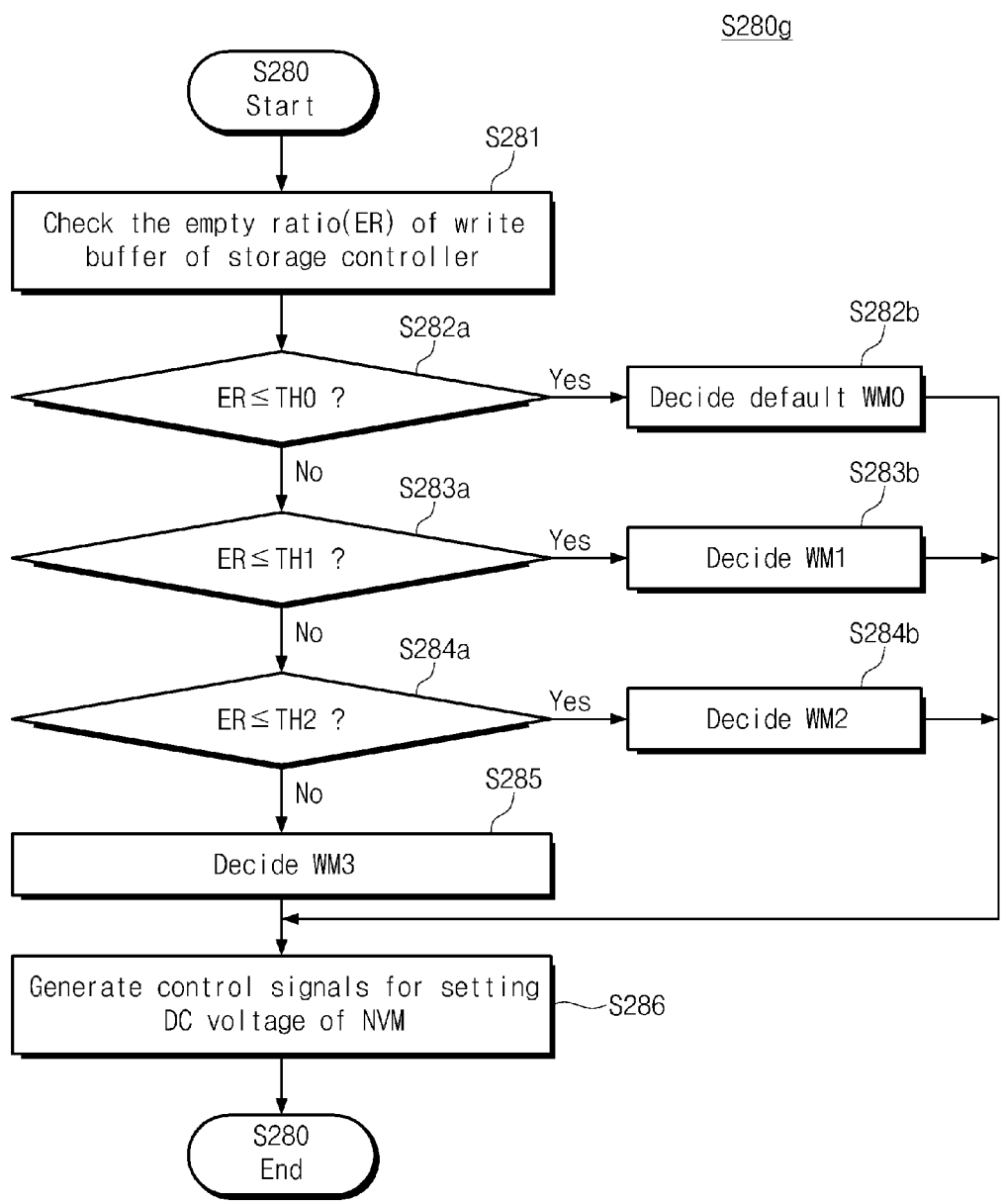
FIG. 21 is a flow chart schematically illustrating a write mode deciding method according to another example embodiment of inventive concepts.

FIG. 21 is a flow chart schematically illustrating a write mode deciding method S280g according to another example embodiment of inventive concepts. In the example embodiment shown in FIG. 21, a dynamic access manager 330 decides a write mode according to a state of a write buffer provided inside or outside of the storage controller 210.

If the empty ratio ER is relatively high, then a write mode supporting a relatively low speed may be selected because the amount of data accumulated in the write buffer is relatively small. If the empty ratio ER is low, then a write mode supporting a relatively high speed may be selected because the amount of data accumulated in the write buffer is relatively large.

Referring to FIG. 21, at step S281 the dynamic access manager 330 checks an empty ratio ER of a write buffer in which write requested data is stored.

At step S282a, the dynamic access manager 330 determines whether the empty ratio ER is less than or equal to a first threshold value TH0. If the empty ratio ER is less than or equal to the first threshold value TH0, then the method proceeds to step S282b.

At step S282b, the dynamic access manager 330 selects a default write mode WM0 as a write mode for the selected memory block.

At step S286, the dynamic access manager 330 issues a command and/or a control signal for setting a write bias of the selected memory block to the nonvolatile memory device 230.

Returning to step S282a, if the empty ratio ER is greater than the first threshold value TH0, then the method proceeds to step S283a.

At step S283a, the dynamic access manager 330 determines whether the empty ratio ER is greater than the first threshold value TH0, but less than or equal to a second threshold value TH1. If the empty ratio ER is greater than the first threshold value TH0, but less than or equal to the second threshold value TH1, then the method proceeds to step S283b.

At step S283b, the dynamic access manager 330 selects a first write mode WM1 as a write mode for the selected memory block. The method then proceeds to step S286 and continues as discussed above.

Returning to step S283a, if the empty ratio ER is greater than the second threshold value TH1, then the method proceeds to step S284a.

At step S284a, the dynamic access manager 330 determines whether the empty ratio ER is greater than the second threshold value TH1, but less than or equal to a third threshold value TH2. If the empty ratio ER is less than or equal to the third threshold value TH2, then the method proceeds to step S284b.

At step S284b, the dynamic access manager 330 selects a second write mode WM2 as a write mode for the selected memory block. The method then proceeds to step S286 and continues as discussed above.

Returning to step S284a, if the empty ratio ER is greater than the third threshold value TH2, then the method proceeds to step S285.

At step S285, the dynamic access manager 330 selects a third write mode WM3 as a write mode for the selected memory block. The method then proceeds to step S286 and continues as discussed above.

Figure 22:
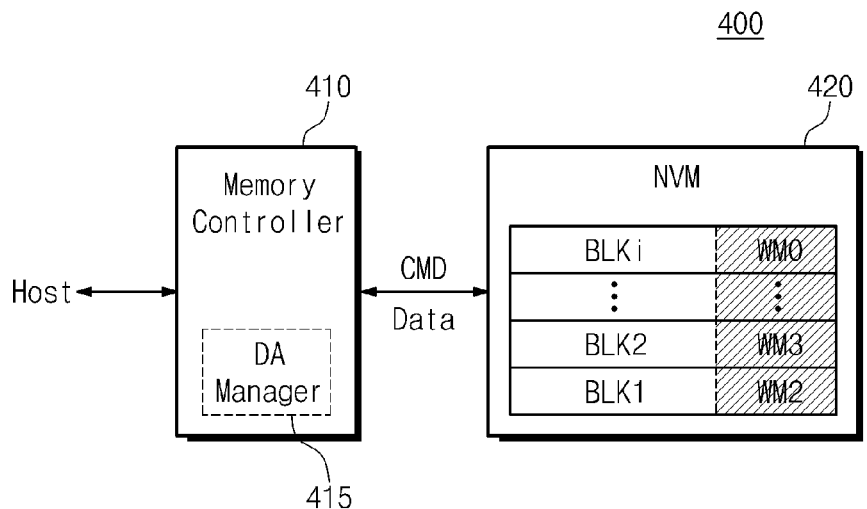
FIG. 22 is a block diagram schematically illustrating a memory system according to another example embodiment of inventive concepts.

FIG. 22 is a block diagram schematically illustrating a memory system according to another example embodiment of inventive concepts.

Referring to FIG. 22, a memory system 400 includes a memory controller 410 and a nonvolatile memory device 420. According to at least this example embodiment, the memory system 400 is configured such that access mode information AMI including a write mode WMi is stored in a specific area of the nonvolatile memory device 420.

In example operation, the memory controller 410 controls the nonvolatile memory device 420 in response to a request of a host. The memory controller 410 provides an interface between the host and the nonvolatile memory device 420. In response to the host request, the memory controller 410 accesses a selected memory block of the nonvolatile memory device 420 according to various access modes.

The memory controller 410 reads a write mode WMi stored in the specific area of a selected memory block BLKj in response to an access request from the host. The memory controller 410 may access the selected memory block based on the read write mode WMi. A software module such as dynamic access manager 425 for controlling dynamic access based on the write mode WMi may be included in the memory controller 410. In one example, the dynamic access manager 415 may control an access operation based on the write mode WMi together with a flash translation layer FTL of the memory controller 410.

According to at least the example embodiment shown in FIG. 22, the memory controller 410 may decide an access bias of a selected memory block based on the write mode WMi. In one example, the memory controller 410 may decide an erase voltage, an erase verification voltage, a program voltage, a program verification voltage, a pass read voltage, a read voltage, etc. of the selected memory block based on the write mode WMi.

The memory controller 410 controls the nonvolatile memory device 420 to adjust DC levels according to the decided access bias, and performs an access operation requested by the host or determined internally.

The nonvolatile memory device 420 performs an erase operation, a read operation, and a write operation according to a control of the memory controller 410.

In the example embodiment shown in FIG. 22, the nonvolatile memory device 420 includes a plurality of memory blocks BLK1 to BLKi, each of which has a plurality of memory cells arranged in rows and columns. Each of the memory blocks BLK1 to BLKi may form an erase unit. A write mode WMi may be stored in a specific area of each of the memory blocks BLK1 to BLKi. In one example, the nonvolatile memory device 420 may be a NAND flash memory. However, inventive concepts are not limited to this example. For example, the nonvolatile memory device 420 may be formed of a PRAM, an MRAM, a ReRAM, an FRAM, a NOR flash memory, etc.

If an access request from the host is received, then the dynamic access manager 415 may read a write mode WMi of a selected memory block. The dynamic access manager 415 may then perform a read/write/erase operation of the selected memory block based on the read write mode WMi.

Figure 23:
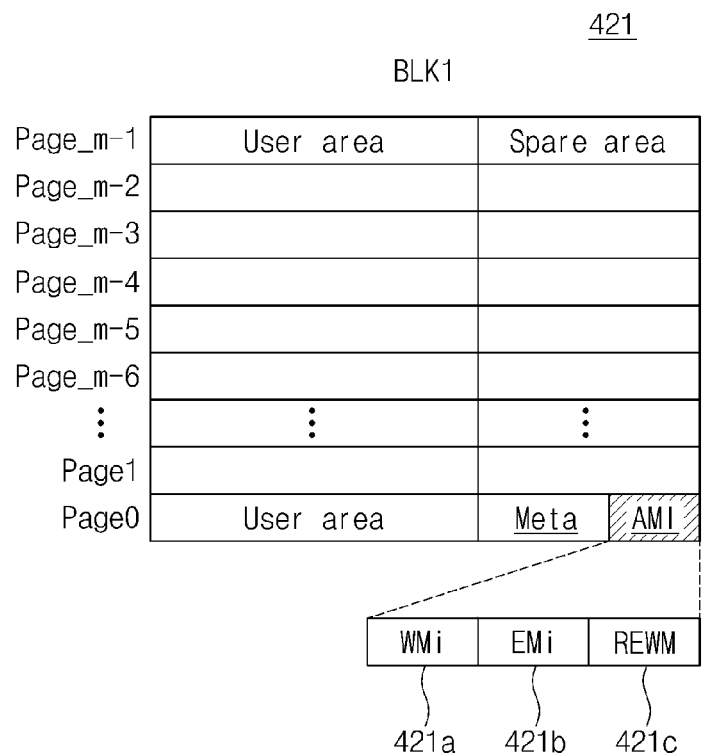
FIG. 23 is a block diagram schematically illustrating an example embodiment of a memory block of the nonvolatile memory device of FIG. 22.

FIG. 23 is a block diagram schematically illustrating an example embodiment of a memory block of the nonvolatile memory device of FIG. 22. In the example embodiment shown in FIG. 23, access mode information AMI is stored in a specific area of the memory block BLK1 of the nonvolatile memory device 420.

As shown in FIG. 23, the memory block BLK1 is formed of a plurality of page areas. Each page area may be a unit by which data is simultaneously and/or concurrently written through a program operation. The access mode information AMI on the memory block BLK1 is stored in at least one of the plurality of page areas. The access mode information AMI may include a write mode 421a, an erase mode 421b, and a read enhanced write mode 421c.

In example operation, when an access request is internally generated or received from a host, the memory controller 410 reads access mode information AMI from a selected memory block corresponding to the access request. The memory controller 410 decides at least one of a write mode, a read mode and an erase mode for the selected memory block based on the read access mode information AMI. The memory controller 410 then controls the nonvolatile memory device 420 to adjust DC levels for execution of the decided mode. The memory controller 410 may then perform an access operation to the selected memory block using the adjusted DC level condition. In this case, the access mode information AMI may be generated when data is written in a selected memory block and programmed together with metadata.

With regard to FIGS. 22 and 23, there is described an example embodiment in which access mode information AMI is embedded in each of memory blocks. However, access mode information AMI of respective memory blocks may be programmed and managed in a specific memory block.

Figure 24:
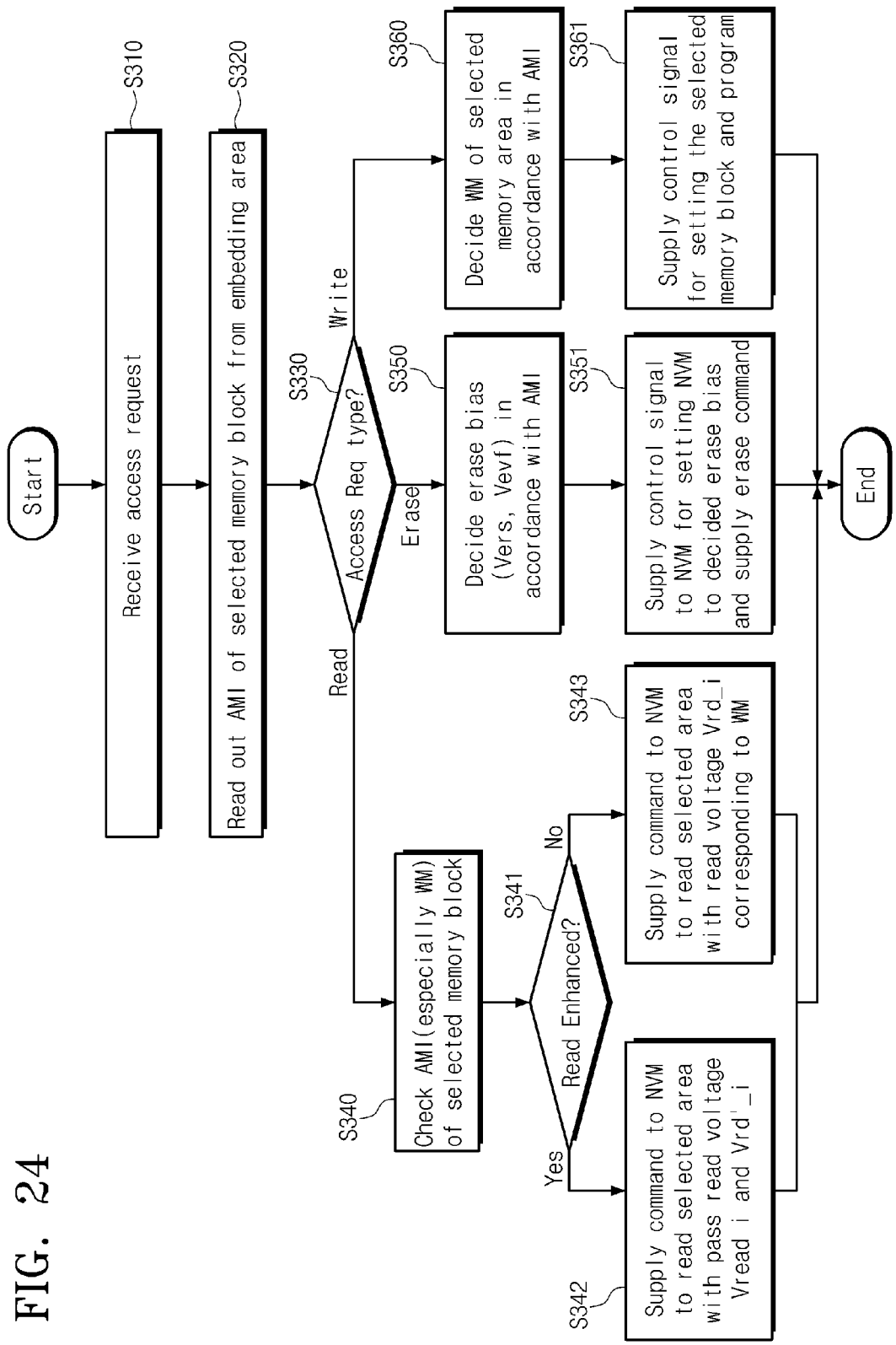
FIG. 24 is a flow chart schematically illustrating an example embodiment of a method of controlling a nonvolatile memory device based on embedded access mode information.

FIG. 24 is a flow chart schematically illustrating an example embodiment of a method of controlling a nonvolatile memory device based on embedded access mode information. The example embodiment shown in FIG. 24 will be described with regard to the memory system shown in FIGS. 22 and 23.

According to the example embodiment shown in FIG. 24, the dynamic access manager 415 reads embedded access mode information AMI of a nonvolatile memory device 420 in response to an access request. The dynamic access manager 415 determines an access bias of a selected memory area based on the access mode information AMI. An access control operation according to at least some example embodiments may initiate in response to an access request generated by a host or internally.

In accordance with FIG. 24, there is described an example embodiment of an access method based on access mode information AMI embedded in a specific area of the nonvolatile memory device 420. Although a read operation is performed to read the access mode information AMI, various memory management methods capable of extending a life of a memory through such setting may be applied.

Referring to FIG. 24, at step S310 the memory controller 410 receives an access request. In this example, the access request may be an access request generated by a host or internally.

At step S320, the dynamic access manager 415 reads the access mode information AMI from the nonvolatile memory device 420 in response to the input access request. In accordance with the access request, the memory controller 410 accesses a selected memory block to read a page area including the access mode information AMI. The dynamic access manager 415 detects the access mode information AMI of the read data.

At step S330, the dynamic access manager 415 determines a type of the input access request.

If the input access request corresponds to a read request, then the method proceeds to step S340.

At step S340, the dynamic access manager 415 checks the read access mode information AMI of the selected memory block. This operation may be an operation for determining a read bias to read data stored in a selected memory block.

At step S341, the dynamic access manager 415 determines whether a read requested memory block includes data written according to a read enhanced write mode REWM.

If the read requested memory block includes data written according to the read enhanced write mode REWM, then the method proceeds to step S342.

At step S342, the dynamic access manager 415 reads the selected memory block according to a read enhanced mode. In this case, the dynamic access manager 415 issues a command set and/or a control signal set for setting a pass read voltage Vreadi (i>0) and a read voltage set Vrd_i lower than those for a default read mode to the nonvolatile memory device 420. The nonvolatile memory device 420 may set DC levels to a pass read voltage Vreadi' and a read voltage set Vrdi'_j (j=1, 2, 3) corresponding to one selected from a plurality of read enhanced write modes described with reference to FIG. 10. The nonvolatile memory device 420 senses and outputs data of the selected memory area based on the determined DC levels.

Returning to step S341, if the read requested memory block does not include data written according to the read enhanced write mode REWM, then the method proceeds to step S343.

At step S343, the dynamic access manager 415 issues a read command and/or a control signal to the nonvolatile memory device 420. Since the selected memory block is programmed according to a write mode WMi, the nonvolatile memory device 420 sets a read bias corresponding to the write mode WMi. Thus, the dynamic access manager 415 issues a command set and/or a control signal set for setting a read voltage set Vrdi_j (j=1, 2, 3) to the nonvolatile memory device 420. The nonvolatile memory device 420 may set DC levels to a pass read voltage Vread0 and a read voltage set Vrdi_j described above with reference to FIG. 9. The nonvolatile memory device 420 senses and outputs data of the selected memory area based on the decided DC levels.

Returning again to step S330, if the input access request corresponds to an erase request, then the method proceeds to step S350.

At step S350, the dynamic access manager 415 decides an erase bias of the selected memory block. The dynamic access manager 415 may decide an erase bias (Vers, Vevf) based on an erase mode EM of the read access mode information AMI. Alternatively, the dynamic access manager 415 may decide an erase bias based on cumulative effective wearing CEW of the read access mode information AMI.

At step S351, the dynamic access manager issues an erase command and/or a control on the selected memory block to the nonvolatile memory device 420. The nonvolatile memory device 420 sets DC levels corresponding to the decided erase mode EMi such that the selected memory block is erased according to the decided erase mode EMi. Thus, the dynamic access manager 415 provides the nonvolatile memory device 420 with a control signal for adjusting DC levels corresponding to the erase mode EMi. The nonvolatile memory device 420 may be set to an erase bias described above with reference to FIG. 7. The nonvolatile memory device 420 erases the selected memory block based on the set erase bias.

Returning again to step S330, if the input access request corresponds to a write request, then the method proceeds to step S360.

At step S360, the dynamic access manager 415 decides a write mode WM of the selected memory block. The dynamic access manager 415 may decide a program voltage Vpgm and a verification voltage set Vvfi_j based on a write mode WM of the read access mode information AMI.

At step S361, the dynamic access manager issues a write command and/or a control signal on the selected memory block to the nonvolatile memory device 420. The nonvolatile memory device 420 sets DC levels corresponding to the decided write mode WMi such that write requested data is programmed in the selected memory block according to the decided write mode WMi. Thus, the dynamic access manager 415 provides the nonvolatile memory device 420 with a control signal for adjusting DC levels corresponding to the write mode WMi. The nonvolatile memory device 420 may be set to a write bias described with reference to FIG. 9 or 10. The nonvolatile memory device 420 programs the selected memory block based on the set write bias.

Figure 25A:
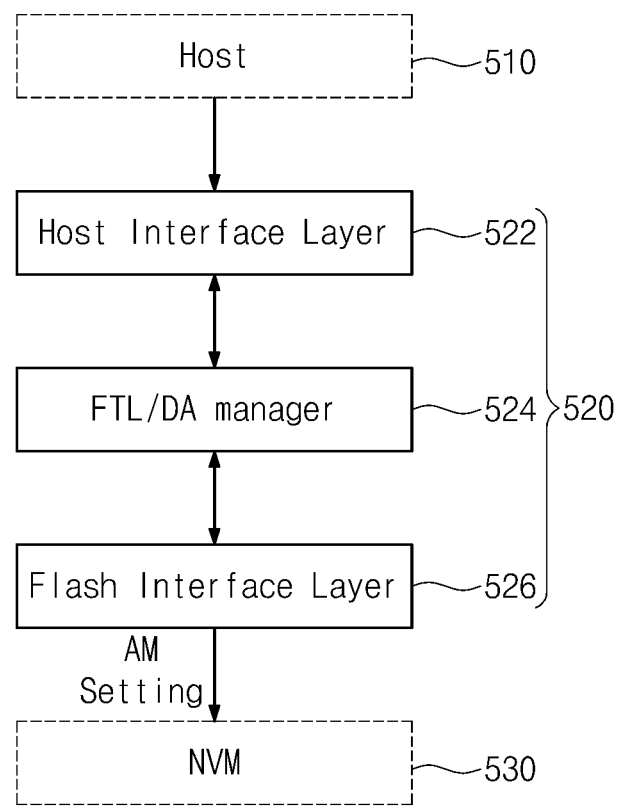
FIGS. 25A and 25B are diagrams schematically illustrating an interface method at a software layer for applying example embodiments of inventive concepts.
Figure 25B:
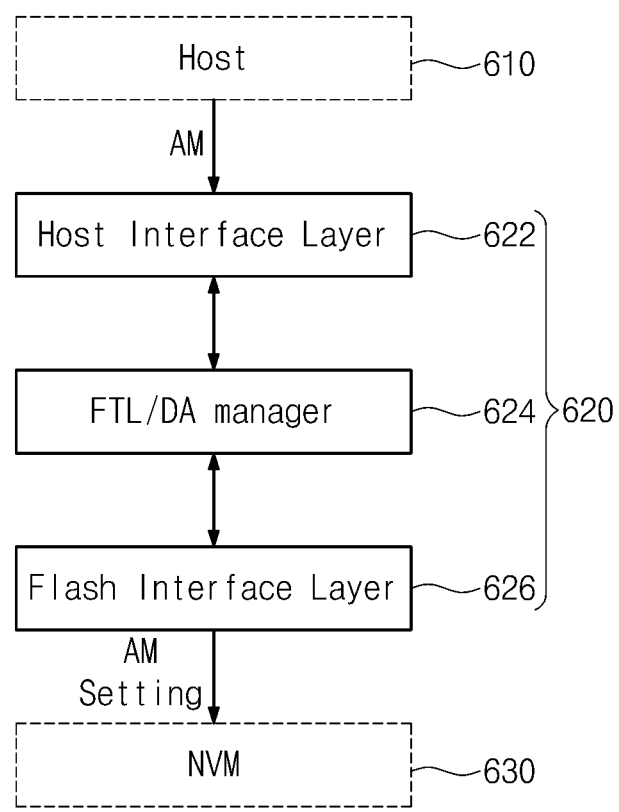

FIGS. 25A and 25B are diagrams schematically illustrating interface methods at a software layer for applying example embodiments of inventive concepts.

Referring to FIG. 25A, a memory controller 520 provides an interface between a host 510 and a nonvolatile memory device 530. To provide an interface between the host 510 and the nonvolatile memory device 530, a software layer of the memory controller 520 includes: a host interface layer 522; a flash translation layer (FTL) and dynamic access (DA) manager 524; and a flash interface layer 526.

The host interface layer 522 controls an internal cache function of the memory controller 520. The host interface layer 522 decodes a request such as reading or writing request provided from the host 510. The host interface layer 522 monitors and/or predicts an interval between requests provided from the host 510. Thus, the host interface layer 522 determines an attribute of requests from the host 510, and transfers the determined attribute to the flash translation layer and dynamic access manager 524.

The flash translation layer and dynamic access manager 524 selects an access mode AM (e.g., one of a write mode, a read mode and an erase mode) of the nonvolatile memory device 530 based on the attribute of the request provided from the host interface layer 522. The flash translation layer and dynamic access manager 524 provides the selected access mode AM to the flash interface layer 526. The flash translation layer and dynamic access manager 524 may support wear leveling and garbage collection.

The flash interface layer 526 performs a low level operation for an interface operation between the memory controller 520 and the nonvolatile memory device 530. For example, the flash interface layer 526 may include a low level driver for controlling hardware of the nonvolatile memory device 530, an error correction code for correcting an error of data read from the nonvolatile memory device 530, bad block management, etc. The flash interface layer 526 controls the nonvolatile memory device 530 according to a control of the flash translation layer and dynamic access manager 524.

The flash interface layer 526 changes a setting of the access mode AM of the nonvolatile memory device 530 according to an instruction of the flash translation layer and dynamic access manager 524 to control the nonvolatile memory device 530. For example, the flash interface layer 526 may control the nonvolatile memory device 530 such that an erase operation of the nonvolatile memory device 530 is performed according to one of erase modes described with reference to FIG. 7. The flash interface layer 526 may set the nonvolatile memory device 530 to perform a write mode and a read mode according to various bias conditions. Bias setting may be performed through a control signal.

Referring to FIG. 25B, a memory controller 620 provides an interface between a host 610 and a nonvolatile memory device 630. To provide an interface between the host 610 and the nonvolatile memory device 630, a software layer of the memory controller 620 includes: a host interface layer 622; a flash translation layer and dynamic access manager 624; and a flash interface layer 626.

In this example, the host 610 may include software such as application, a file system, and a device driver. The host 610 decides an access mode of the nonvolatile memory device 630 and provides the access mode AM to the memory controller 620. The access mode AM may include a write speed, a write pattern, a read mode, a read enhanced mode, etc.

The host interface layer 622 decodes the access mode AM from the host 610 and transfers the decoded result to the flash translation layer and dynamic access manager 624. The flash translation layer and dynamic access manager 624 selects an access mode (e.g., one of a write mode, a read mode and an erase mode) of the nonvolatile memory device 630 based on the access mode AM provided from the host interface layer 622. The flash translation layer and dynamic access manager 624 transfers the access mode AM to the flash interface layer 626.

The flash interface layer 626 performs a low level operation for an interface operation between the memory controller 620 and the nonvolatile memory device 630. For example, the flash interface layer 626 may include a low level driver for controlling hardware of the nonvolatile memory device 530, an error correction code for correcting an error of data read from the nonvolatile memory device 630, bad block management, etc. The flash interface layer 626 controls the nonvolatile memory device 630 according to a control of the flash translation layer and dynamic access manager 624.

For example the flash interface layer 626 changes a setting of the access mode AM of the nonvolatile memory device 630 according to an instruction from the flash translation layer and dynamic access manager 624. For example, the flash interface layer 626 may control the nonvolatile memory device 630 such that an erase operation of the nonvolatile memory device 630 is performed according to one of erase modes described with reference to FIG. 7. In another example, the flash interface layer 626 may set the nonvolatile memory device 630 to perform a write mode and a read mode according to various bias conditions. Bias setting may be performed through a control signal.

Figure 26:
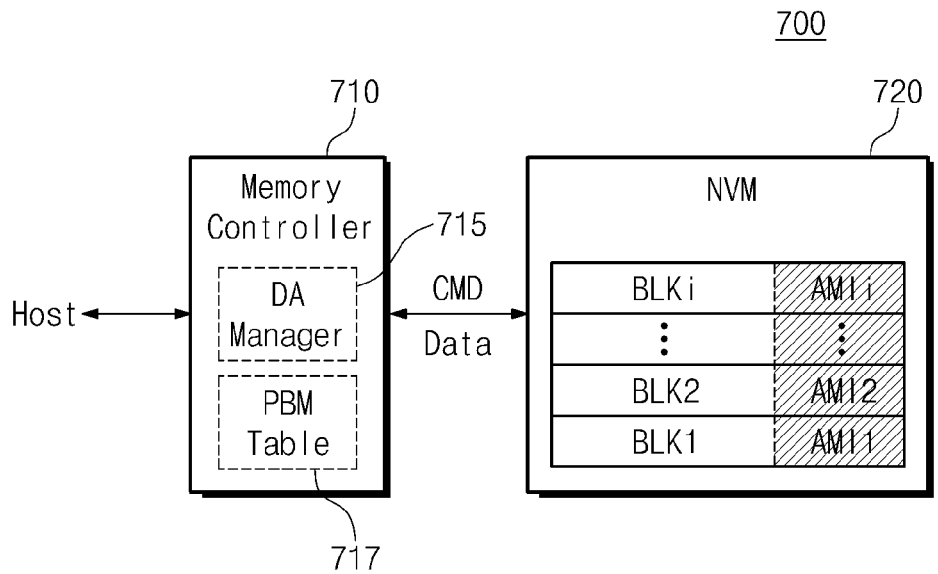
FIG. 26 is a block diagram schematically illustrating a memory system according to still another example embodiment of inventive concepts.

FIG. 26 is a block diagram schematically illustrating a memory system according to still another example embodiment of inventive concepts.

Referring to FIG. 26, a memory system 700 includes a memory controller 710 and a nonvolatile memory device 720. The memory controller 710 of the memory system 700 includes a per-block mode table 717. The memory system 700 may form the per-block mode table 717 and embed access mode information AMI including a write mode WMi in a specific area of the nonvolatile memory device 720.

The memory controller 710 controls the nonvolatile memory device 720 in response to a request from a host. When an access request is provided from the host, the memory controller 710 accesses a selected memory block BLKj according to a write mode WMi. Here, access mode information AMI including a write mode WMi is stored in the per-block mode table 717. A dynamic access manager 715 controls an access operation based on the write mode WMi together with a flash translation layer of the memory controller 710. At sudden power-off, the memory controller 710 reads access mode information AMI stored in the nonvolatile memory device 720 to recover the per-block mode table 717. In this case, the memory controller 710 may rebuild the per-block mode table 717 based on the access mode information AMI stored in the nonvolatile memory device 720.

Figure 27:
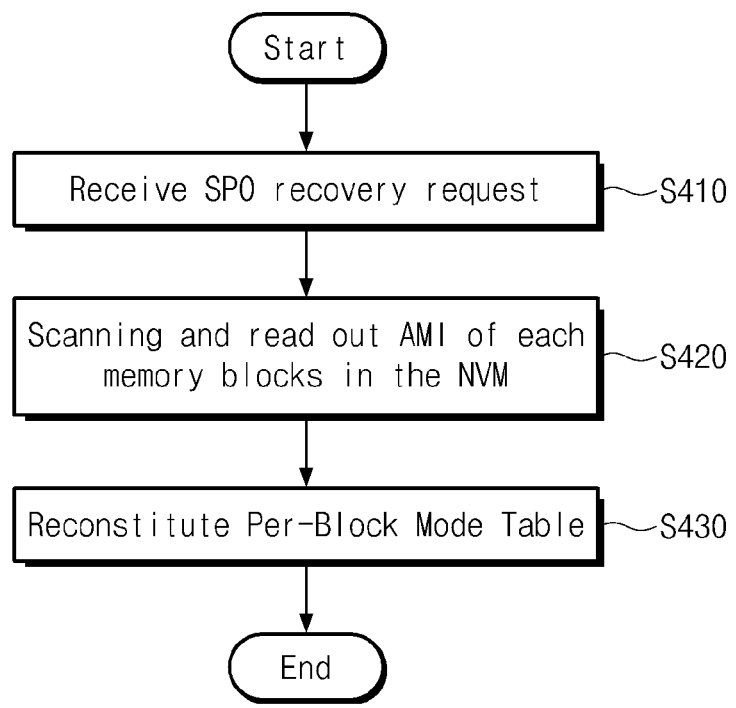
FIG. 27 is a flow chart schematically illustrating an example embodiment of a recovery method of a memory system of FIG. 26 when sudden power-off occurs.

FIG. 27 is a flow chart schematically illustrating an example embodiment of a recovery method of the memory system shown in FIG. 26 when sudden power-off occurs. In accordance with the example embodiment shown in FIG. 27, a write mode, an erase mode, effective wearing, cumulative effective wearing, etc. for memory units may be recovered based on embedded access mode information AMI.

Referring to FIG. 27, at step S410 the memory system 700 receives a sudden power-off (SPO) recovery request from a host.

At step S420, the dynamic access manager 715 reads access mode information AMI corresponding to an access unit (e.g., a memory block unit, a chip unit, a super block unit, etc.) from the nonvolatile memory device 720.

At step S430, the memory controller 710 reconstitutes the per-block mode table 717 using the read access mode information AMI from the nonvolatile memory device 720.

Figure 28:
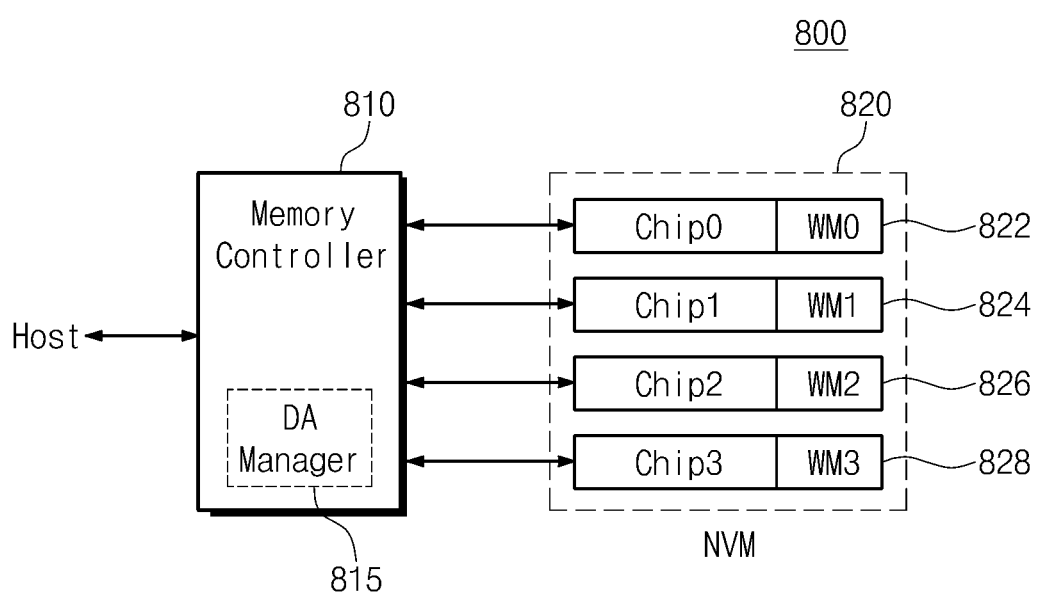
FIG. 28 is a block diagram schematically illustrating a memory system according to a yet another example embodiment of inventive concepts.

FIG. 28 is a block diagram schematically illustrating another example embodiment of a memory system.

Referring to FIG. 28, a memory system 800 includes a memory controller 810 and a nonvolatile memory device 820. The nonvolatile memory device 820 may be formed of a multi-chip package including a plurality of chips.

The memory controller 810 includes a dynamic access manager 815. The dynamic access manager 815 set access biases of the chips differently. For example, the dynamic access manager 815 may set a memory chip 822 to a default write mode WM0, the dynamic access manager 815 may set the memory chip 824 to a first write mode WM1, the dynamic access manager 815 may set a memory chip 826 to a second write mode WM2, and the dynamic access manager 815 may set a memory chip 828 to a third write mode WM3.

If a default write mode WM0 is allocated to specific data, then the dynamic access manager 815 may use a memory block included in the memory chip 822 as a free block. If data is written according to the second write mode WM2, then the dynamic access manager 815 may use a memory block included in the memory chip 826 as a free block.

In the example embodiment shown in FIG. 28, the dynamic access manager 815 may perform a wear leveling operation by a chip unit. If a level of stress applied to memory blocks in a specific memory chip is relatively high, then an access bias may be switched into the third write mode WM3 in which a level of stress is relatively low.

Figure 29:
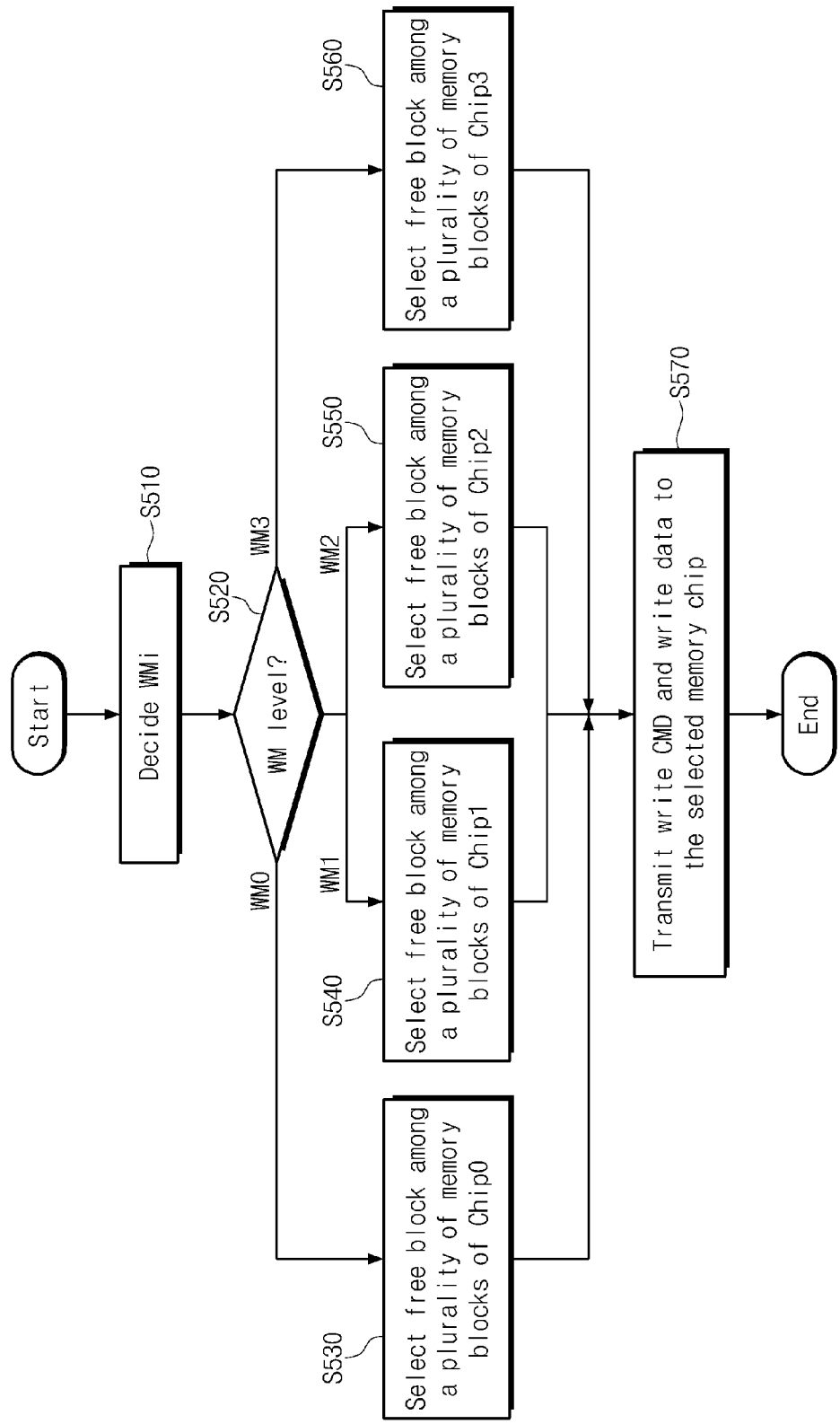
FIG. 29 is a flow chart schematically illustrating an example embodiment of a data writing method associated with the memory system shown in FIG. 28.

FIG. 29 is a flow chart schematically illustrating an example embodiment of a data writing method associated with the memory system shown in FIG. 28. In accordance with the example embodiment shown in FIG. 29, an access operation may be performed by a memory chip unit according to a write mode WMi of write requested data.

Referring to FIG. 29, at step S510 the dynamic access manager 815 decides a write mode of write requested data. Here, the write mode WMi may be decided in the same or substantially the same manner as described with reference to other example embodiments of inventive concepts, and thus, a description thereof is omitted.

At step S520, the dynamic access manager 815 detects a level or type of the write mode WMi.

If the write requested data corresponds to a default write mode WM0, then the method proceeds to step S530.

At step S530, the dynamic access manager 815 selects a memory block in the memory chip 822 as a free block in which the write requested data is to be programmed. The memory chip 822 may exist in such a state that a write bias of the memory chip 822 is previously set to a value corresponding to the default write mode WM0.

At step S570, the memory controller 810 provides the selected memory chip with the write requested data and a write command. The write requested data is then written in the memory block selected as the free block.

Returning to step S520, if the write requested data corresponds to a first write mode WM1, then the method proceeds to step S540.

At step S540, the dynamic access manager 815 selects memory block in the memory chip 824 as a free block in which the write requested data is to be programmed. The memory chip 824 may exist in such a state that a write bias of the memory chip 824 is previously set to a value corresponding to the first write mode WM1. The method then proceeds to step S570 and continues as discussed above.

Returning again the step S520, if the write requested data corresponds to a second write mode WM2, then the method proceeds to step S550.

At step S550, the dynamic access manager 815 selects a memory block in the memory chip 826 as a free block in which the write requested data is to be programmed. The memory chip 826 may exist in such a state that a write bias of the memory chip 826 is previously set to a value corresponding to the second write mode WM2. The method then proceeds to step S570 and continues as discussed above.

Returning yet again to step S520, if the write requested data corresponds to a third write mode WM3, then the method proceeds to step S560.

At step S560, the dynamic access manager 815 selects a memory block in the memory chip 828 as a free block in which the write requested data is to be programmed. The memory chip 828 may exist in such a state that a write bias of the memory chip 828 is previously set to a value corresponding to the third write mode WM3. The method then proceeds to step S570 and continues as discussed above.

Figure 30:
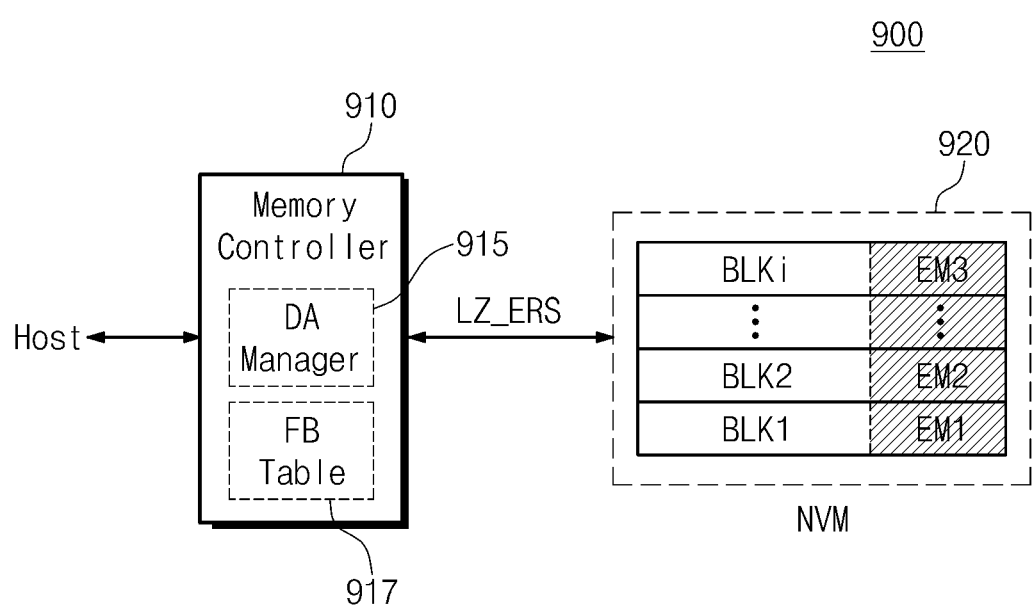
FIG. 30 is a block diagram schematically illustrating a memory system according to a further embodiment of the inventive concept.

FIG. 30 is a block diagram schematically illustrating a memory system according to a further embodiment of the inventive concept. Referring to FIG. 30, a memory system 900 may include a memory controller 910 and a nonvolatile memory device 920. The memory controller 910 includes a dynamic access manager 915 and a free block table 917 for managing erased memory blocks. The memory system 900 may provide a free block with an optimal erase state corresponding to a write mode WMi based on the free block table 917.

The memory controller 910 controls the nonvolatile memory system 920 in response to a request of a host. Upon a write request of the host, the memory controller 910 may access a selected memory block BLKj according to the write mode WMi. Here, the write mode Mi may be decided according to a variety of conditions. For example, the write mode WMi may be decided based on at least one of an interval among write requests, a time-out, the number of free blocks, an instruction from a host or upper layer. Or, the memory controller 910 may decide the write mode WMi of data according to an instruction of the host. Decision about the write mode WMi may be made by the dynamic access manager 915.

Upon a write request of the host, the dynamic access manager 915 may select a memory block for storing write-requested data referring to the free block table 917. First, the dynamic access manager 915 may decide the write mode WMi. An optimal memory block, at which data is to be written according to the write mode WMi, may be selected based on the free block table 917. However, such a case that memory blocks erased according to a variety of erase modes EMj don't include a free block to which the decided write mode WMi is applied may occur. For example, a program operation using a write mode WM0 may be applied only to an erase block that is erased according to an erase mode EM0 or an erase mode EM1. The event that a free block erased according to the erase mode EM0 or the erase mode EM1 does not exist in the free block table 917 may occur. In this case, the dynamic access manager 915 may select one of free blocks erased according to erase modes EM2, EM3, and EM4 and erase the selected free block at high speed. This operation may be referred to as a lazy erase operation. With the lazy erase operation, the dynamic access manager 915 may get a free block having the same state as an erase state acquired through the erase mode EM0 or the erase mode EM1.

The free block table 917 may store physical address information about free blocks that are managed by the dynamic access manager 915. For example, a block address of a memory block appointed to a free block may be recorded and updated at the free block table 917. Some of memory blocks, which store invalid data because of a garbage collection or merge operation, may be appointed to free blocks. Memory blocks appointed as a free block may include memory blocks, which are managed by an erased state, and memory blocks, which are managed by an unerased state.

The free block table 917 of the inventive concept may include free blocks managed by an erased state and free blocks managed by an unerased state. Further, free blocks managed by an erased state may be blocks that are erased according to various erase modes described above. That is, free blocks may be classified and managed within the free block table 917 according to an erase state.

The nonvolatile memory system 920 may perform an erase operation, a read operation, and a write operation according to a control of the memory controller 901. The nonvolatile memory device 920 may include a plurality of memory blocks BLK1 to BLKi, each of which has a plurality of memory cells arranged in rows and columns. Each of the memory blocks BLK1 to BLKi may correspond to an erase unit. There will be described an example in which a NAND flash memory is used as a storage medium of the nonvolatile memory device 920. However, the inventive concept is not limited thereto. For example, PRAM, MRAM, ReRAM, FRAM, NOR flash memory, and the like may be used as the storage medium.

With the above-described memory system 900, upon a write request of the host, the dynamic access manager 915 that is driven on the memory controller 910 may decide the write mode WMi. The dynamic access manager 915 may select a free block, in which data is to be written, according to the write mode WMi thus decided. In the event that an erase state of free block, to which the write mode WMi thus decided is to be applied, does not exist, a lazy erase operation may be applied to a free block with another erase state. The dynamic access manager 915 may program write-requested data by applying the decided write mode WMi to a free block that is erased at high speed according to the lazy erase operation.

Figure 31:
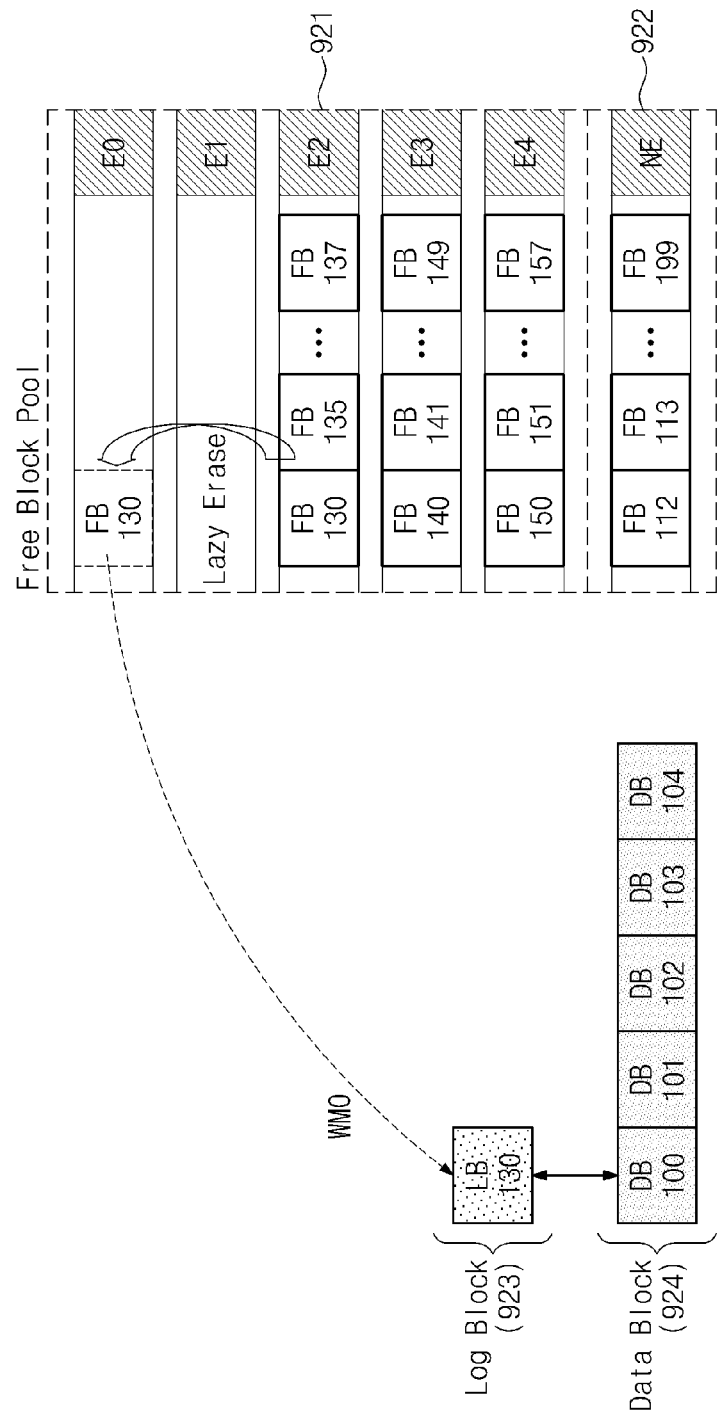
FIG. 31 is a diagram for describing a free block managing method according to an embodiment of the inventive concept.

FIG. 31 is a diagram for describing a free block managing method according to an embodiment of the inventive concept. Referring to FIG. 31, write-requested data may be programmed at a log block or a data block. In the event that a free block to which a write mode WMi of the write-requested data is to be applied does not exist, a lazy erase operation according to the inventive concept may be performed. Free blocks that are managed at a free block table 917 may be divided into two groups: an erase free block 921 being a group of erased blocks and an unerased free block 922 being a group of blocks not erased. Further, the erase free block 921 may be divided into a plurality of sub-groups according to erase distributions E0, E1, E2, E3, and E4.

It is assumed that a write mode WMi for programming write-requested data is a write mode WM0 where a relatively low threshold voltage distribution is formed. Also, it is assumed that an erased free block to which the write mode WM0 is to be applied corresponds to an erase state E0 or E1. However, free blocks having the erase states E0 and E1 may not be included in the erase free block 921. The reason is that all free blocks have been used by a data write operation according to write modes WM0 and WM1.

In this case, a dynamic access manager 915 may decide execution of a lazy erase operation. For the lazy erase operation, the dynamic access manager 915 may select one free block (e.g., FB130) included in the erase free block 921 referring to a free block table 917 (refer to FIG. 30). The dynamic access manager 915 applies the lazy erase operation to the free block FB130. An erase state E2 of the free block FB130 may be changed into an erase state E0 through the lazy erase operation. Under a control of the dynamic access manager 915, an attribute of the free block FB130, of which the erase state is changed into the erase state E0 through the lazy erase operation, may be changed into an attribute of a log block LB130. The dynamic access manager 915 may program the write-requested data at the log block LB130 using a write mode WM0.

There has been described a method where in the event that there exist no free block to which the decided write mode WMi is to be applied, a free block with a required erase state is generated using the lazy erase operation that is performed at high speed. The lazy erase operation may make it possible to obtain fast program speed and high data reliability of a memory system that needs a variety of program and erase modes.

Figure 32:
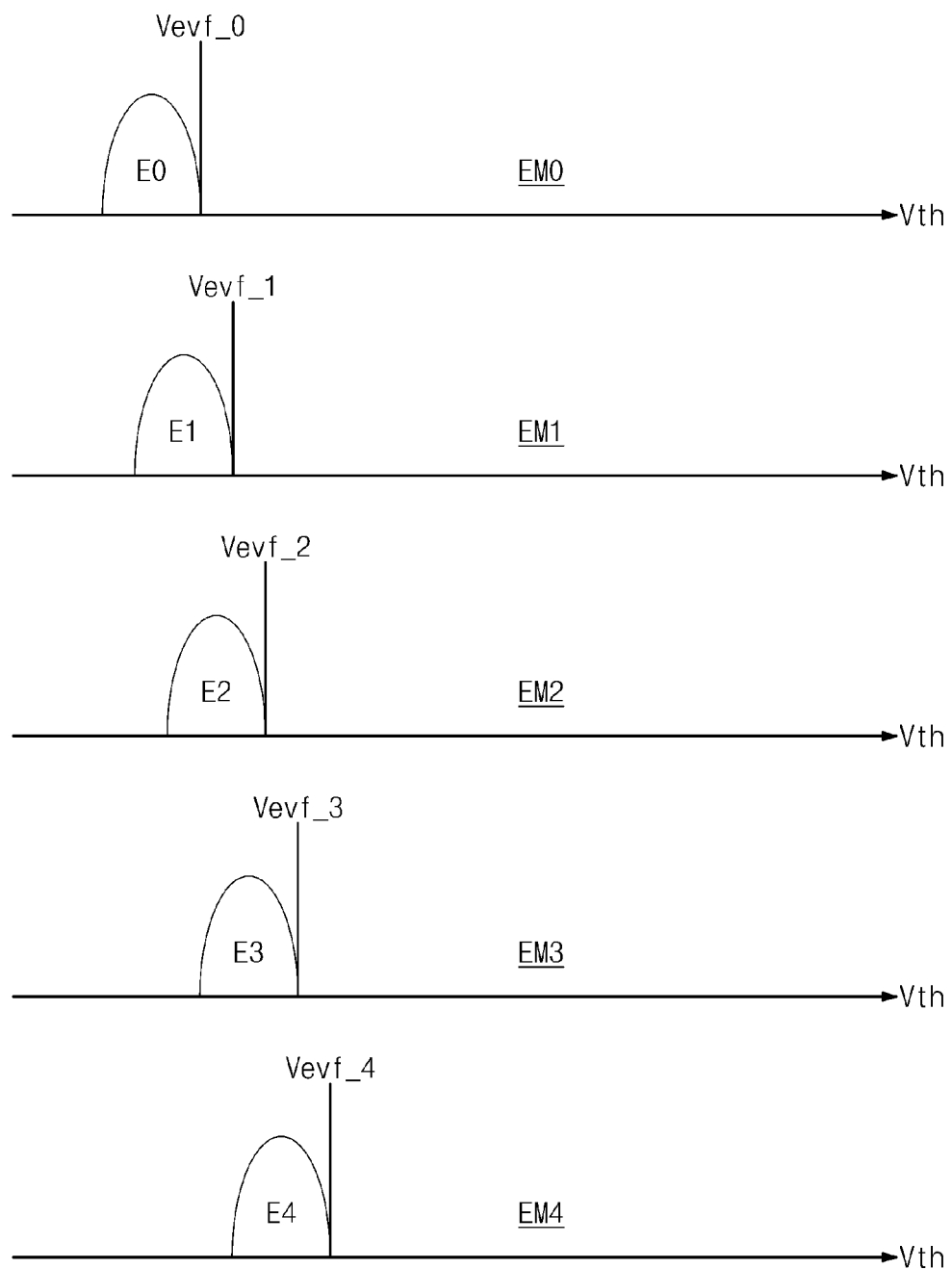
FIG. 32 is a diagram schematically illustrating erase states of an erase free block, according to an embodiment of the inventive concept.

FIG. 32 is a diagram schematically illustrating erase states of an erase free block, according to an embodiment of the inventive concept. Referring to FIG. 32, each memory block included in an erase free block 921 (refer to FIG. 2) may have a threshold voltage distribution corresponding to one of a plurality of erase states E0 to E5. That is, the erase free block 921 may include memory blocks that are erased according to one of a plurality of erase modes EM0 to EM4.

An erase free block having the erase state E0 may be a memory block that is erased according to an erase bias, corresponding to an erase mode EM0, including an erase verification voltage Vevf_0. An erase free block with the erase state E1 may be a memory block that is erased according to an erase bias, corresponding to an erase mode EM1, including an erase verification voltage Vevf_1. An erase free block having the erase state E2 may be a memory block that is erased according to an erase bias, corresponding to an erase mode EM2, including an erase verification voltage Vevf_2. An erase free block having the erase state E3 may be a memory block that is erased according to an erase bias, corresponding to an erase mode EM3, including an erase verification voltage Vevf_3. An erase free block with the erase state E4 may be a memory block that is erased according to an erase bias, corresponding to an erase mode EM4, including an erase verification voltage Vevf_4.

A dynamic access manager 915 sets a memory block obtained through a merge or garbage collection operation to a free block. After erased, the memory block appointed to the free block may be managed as a free block. Or, the memory block appointed to the free block may be managed with the memory block not erased. Erase free blocks that are managed as a free block after erasing may be blocks that are erased according to one of the plurality of erase modes EM0 to EM4. Selection of an erase mode may be made according to an operating state of a memory system or a type of write mode WMi.

Figure 33:
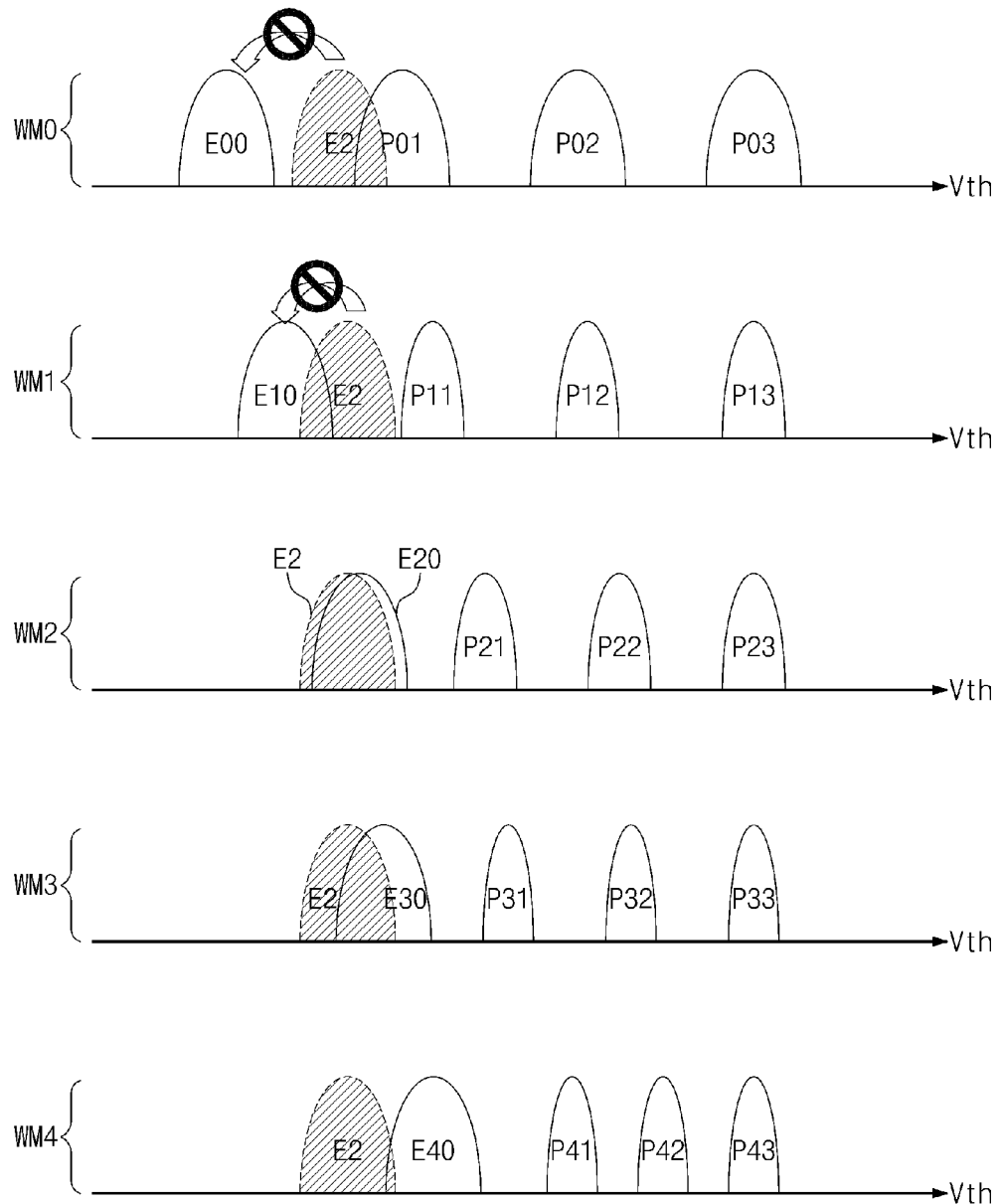
FIG. 33 is a diagram schematically illustrating a write mode where an erase free block with a specific erase state cannot be used.

FIG. 33 is a diagram schematically illustrating a write mode where an erase free block with a specific erase state cannot be used. Referring to FIG. 33, below, there will be described why a free block having a threshold voltage corresponding to an erase state E2 cannot be used for write modes WM0 and WM1.

The event that a write mode WM0 is applied to an erase free block with an erase state E2 will be considered. If memory cells of a selected memory block are programmed according to the write mode WM0, threshold voltage distributions E00, P01, P02, and P03 may be formed as illustrated in FIG. 33. In case of a free block where threshold voltages of all memory cells are at an erase state E2, threshold voltages of memory cells may move into an increasing direction during a program operation where a program voltage is applied to a word line of the memory cells. That is, upon the program operation, threshold voltages of memory cells may be changed according to a unidirectional characteristic: an increasing direction. If the write mode WM0 is used, thus, it is impossible to program memory cells with threshold voltages corresponding to the erase state E2 to have threshold voltages corresponding to an erase state E00. A read error may occur when the write mode WM0 is applied to memory cells with the erase state E2.

The event that a write mode WM1 is applied will be considered. If memory cells of a selected memory block are programmed according to the write mode WM1, threshold voltage distributions E10, P11, P12, and P13 may be formed as illustrated in FIG. 33. However, it is impossible to program memory cells with the erase state E2 to have the erase state E10. If the write mode WM1 is applied to memory cells with the erase state E2, it is difficult to ensure data reliability.

The event that a write mode WM2 is applied will be considered. If memory cells of a selected memory block are programmed according to the write mode WM2, threshold voltage distributions E20, P21, P22, and P23 may be formed as illustrated in FIG. 33. However, it is possible to program memory cells with the erase state E2 to have the erase state E20. Thus, it is possible to apply the write mode WM2 to memory cells with the erase state E2.

Upon applying of the write mode WM3 to memory cells with the erase state E2, threshold voltage distributions E30, P31, P32, and P33 may be formed when selected memory cells are programmed. Also, upon applying of the write mode WM4 to memory cells with the erase state E2, threshold voltage distributions E40, P41, P42, and P43 may be formed when selected memory cells are programmed.

It is understood from the above description that it is impossible to apply the write modes WM0 and WM1 to a free block with an erase state E2. To program a memory block using a write mode WM0, there may be required an additional operation such as a lazy erase operation. Through the lazy erase operation, a memory block with an erase state E2 may have lower threshold voltages.

Figure 34A:
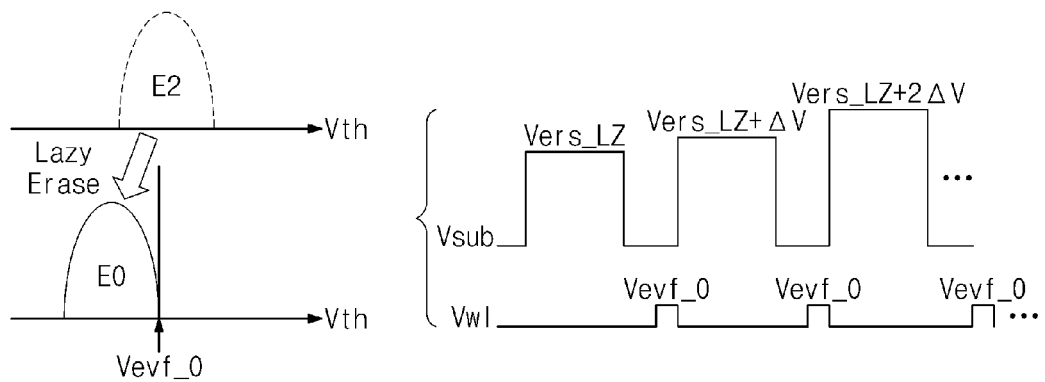
FIGS. 34A to 34C are diagrams for describing a lazy erase method according to an embodiment of the inventive concept.
Figure 34B:
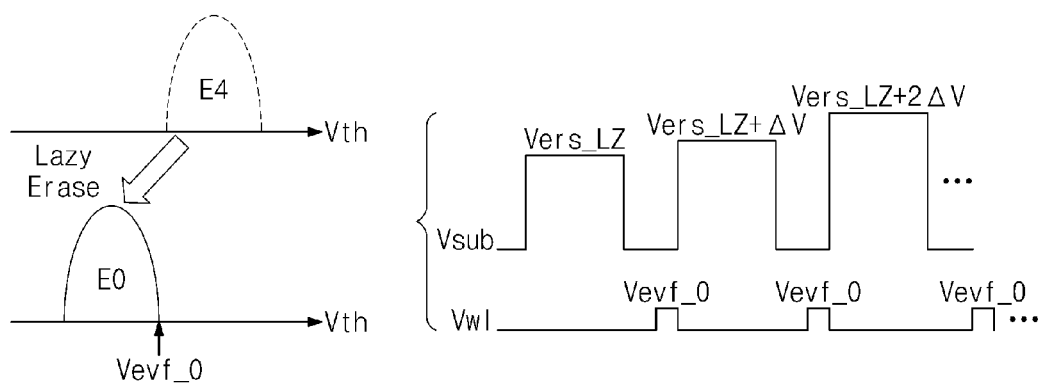
Figure 34C:
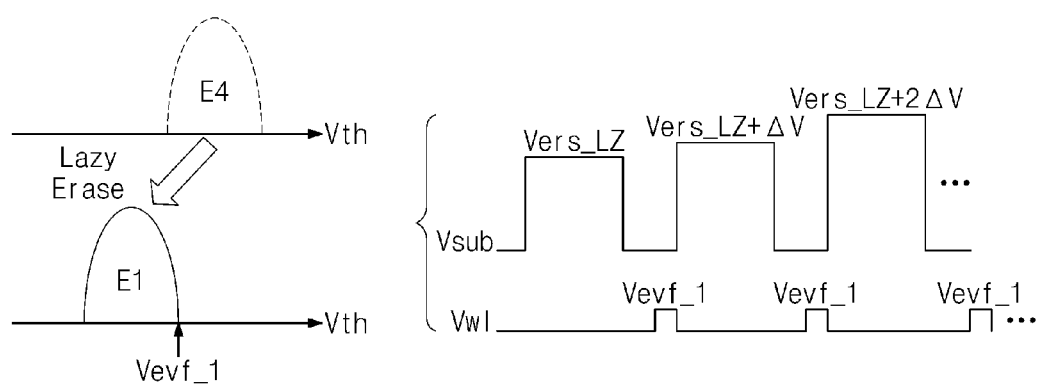

FIGS. 34A to 34C are diagrams for describing a lazy erase method according to an embodiment of the inventive concept.

Referring to FIG. 34A, there are illustrated a method of performing a lazy erase operation and an erase bias. The lazy erase operation may be performed to erase a free block with an erase state E2 to have an erase state E0. If a free block with the erase state E2 is selected for the lazy erase operation, it may be erased using an erase start voltage Vers_LZ and an erase verification voltage Vevf_0. In the event that a memory block is erased according to an Incremental Step Pulse manner, first, the erase start voltage Vers_LZ may be provided to the selected free block. Next, the erase verification voltage Vevf_0 may be supplied to word lines of the selected memory block. If an erase verification result indicates that threshold voltages of memory cells are greater than the erase verification voltage Vevf_0, a next erase operation may be performed using an erase voltage (Vers_LZ+ΔV) and the erase verification voltage Vevf_0. If threshold voltages of memory cells are smaller than the erase verification voltage Vevf_0 according to a gradual increase in the erase voltage, the erase operation may be completed. Thus, the erased free block may have the erase state E0 through the above-described lazy erase operation.

Referring to FIG. 34B, there are illustrated a method of performing a lazy erase operation and an erase bias. The lazy erase operation may be performed to erase a free block with an erase state E4 to have an erase state E0. If a free block with the erase state E4 is selected for the lazy erase operation, it may be erased using the erase start voltage Vers_LZ and the erase verification voltage Vevf_0. If an erase verification result indicates that threshold voltages of memory cells are greater than the erase verification voltage Vevf_0, a next erase operation may be performed using the erase voltage (Vers_LZ+ΔV) and the erase verification voltage Vevf_0. If threshold voltages of memory cells are smaller than the erase verification voltage Vevf_0 according to a gradual increase in the erase voltage, the erase operation may be completed. Thus, the erased free block may have the erase state E0 through the above-described lazy erase operation.

Referring to FIG. 34C, there are illustrated a method of performing a lazy erase operation and an erase bias, according to another embodiment of the inventive concept. The lazy erase operation may be performed to erase a free block with an erase state E4 to have an erase state E1. If a free block with the erase state E4 is selected for the lazy erase operation, it may be erased using the erase start voltage Vers_LZ and an erase verification voltage Vevf_1. If an erase verification result indicates that threshold voltages of memory cells are greater than the erase verification voltage Vevf_1, a next erase operation may be performed using the erase voltage (Vers_LZ+ΔV) and the erase verification voltage Vevf_1. If threshold voltages of memory cells are smaller than the erase verification voltage Vevf_1 according to a gradual increase in the erase voltage, the erase operation may be completed. Thus, the erased free block may have the erase state E1 through the above-described lazy erase operation.

With the above-described lazy erase method, the erase start voltage Vers_LZ may be greater than an erase start voltage Vers that is used at a full erase operation for erasing a memory block with a program state. In FIGS. 34A to 34C, there is illustrated an example where a plurality of erase pulses are used for a lazy erase operation. However, the inventive concept is not limited thereto. For example, an erase pulse may be used for a lazy erase operation. In the event that a plurality of erase pulses are provided, the number of erase pulses may be much smaller than that used for the full erase operation. Thus, a time taken to perform the lazy erase operation may be much shorter than that taken to perform the full erase operation.

Some of many lazy erase methods have been described with reference to FIGS. 34A to 34C. In FIGS. 34A to 34C, there are illustrated examples where source erase states are erase states E2 and E4 and target erase states are erase states E0 and E1. However, the inventive concept is not limited thereto. For example, it is understood that the lazy erase method may be applied to an erase state E3.

FIG. 35 is a table schematically illustrating a free block table according to an embodiment of the inventive concept. Referring to FIG. 35, a free block table 917 may be managed such that erase free blocks are divided according to erase states. The free block table 917 may be formed of a portion of a per-block mode table shown in FIG. 4.

Free blocks that are managed using the free block table 917 may be divided into unerased blocks and erased blocks. The unerased blocks may be memory blocks that are gathered through a garbage collection or merge operation. For example, free blocks FB112, FB113, FB115, FB116 . . . FB919 may be unerased free blocks. In contrast, erased free blocks may be classified according to erase states. The erased free blocks may be acquired by erasing unerased free blocks or memory blocks gathered through a garbage collection or merge operation.

It is assumed that all free blocks having an erase state E0 and an erase state E1 are used. This assumption may mean that free blocks having the erase state E0 and the erase state E1 don't exist currently. Five free blocks FB130, FB133 . . . FB137 may have an erase state E2, seven free blocks FB140, FB141 . . . FB149 may have an erase state E3, and six free blocks FB150, FB151 . . . FB147 may have an erase state E4.

Returning to FIG. 32, memory cells corresponding to the erase state E0 may form the lowest erase threshold voltage distribution. A threshold voltage distribution corresponding to an erase state E1 may be higher than that corresponding to the erase state E0 and lower than those corresponding to the erase states E2, E3, and E4. Free blocks having the erase states E0 and E1 have to be gathered to execute a write mode WM2. However, a relatively long time may be taken to obtain free blocks with the erase states E0 and E1 by erasing unerased free blocks. A free block corresponding to an optimal erase state may be acquired at high speed by performing a lazy erase operation about one selected from erase free blocks belonging to the erase states E2, E3, and E4.

Figure 36:
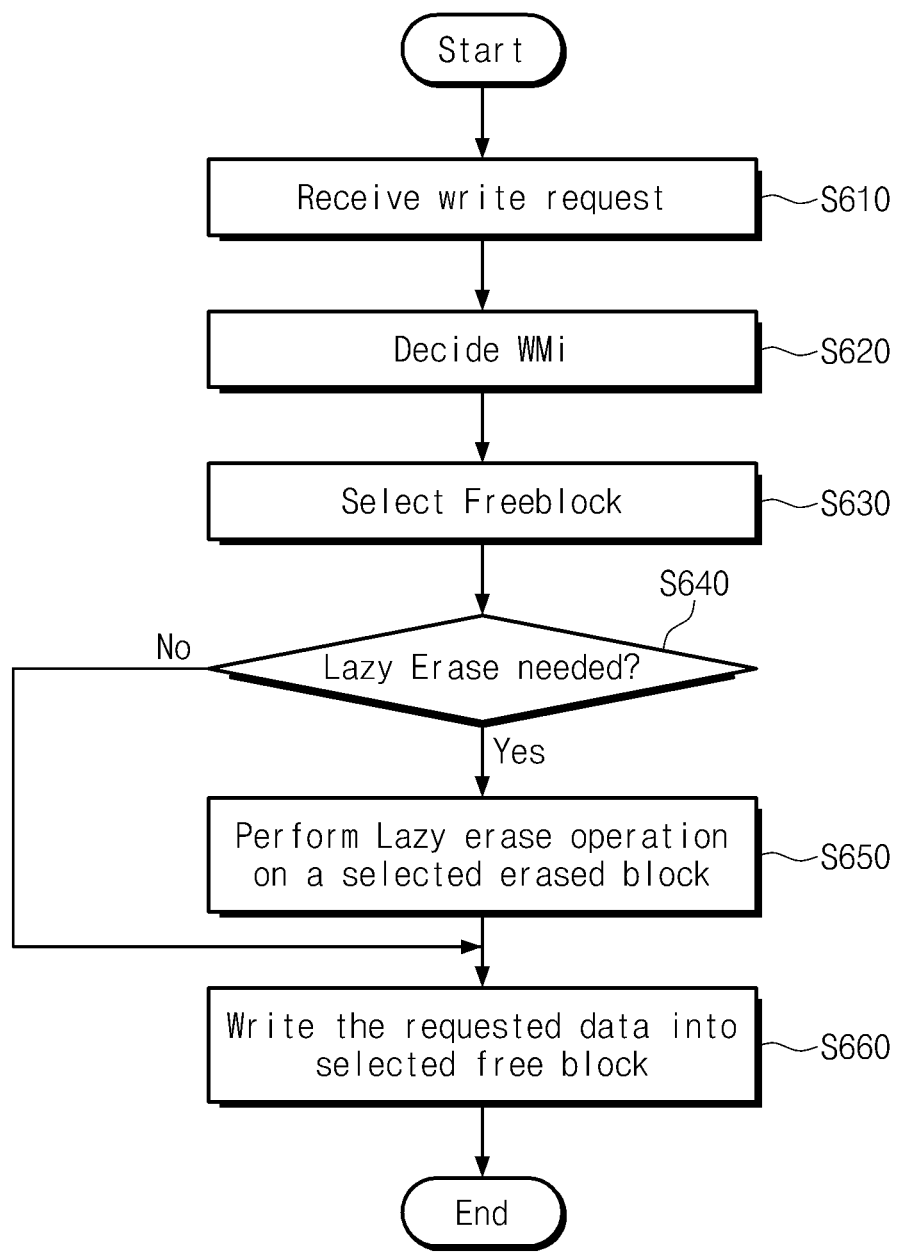
FIG. 36 is a flow chart schematically illustrating a data write method according to an embodiment of the inventive concept.

FIG. 36 is a flow chart schematically illustrating a data write method according to an embodiment of the inventive concept. Referring to FIG. 36, there will be described a lazy erase operation based on a free block table 917 of a dynamic access manager 915 (refer to FIG. 30).

In step S610, a memory controller 910 may receive or detect a write request. Here, the write request may be provided from a host or may be a write request that a flash translation layer generates. The write request may be issued according to a command from the host or a background operation such as a garbage collection operation or a merge operation.

In step S620, a dynamic access manager 915 that is driven on the memory controller 910 may decide an optimal write mode WMi in response to the write requested thus detected or received. For example, the write mode WMi may be decided based on an attribute of write-requested data, a write pattern, a status, a time-out, etc. A variety of examples for deciding a variety of write modes WMi have been described with reference to FIG. 12, and a description thereof is thus omitted.

In step S630, the dynamic access manager 915 may select a free block to which the write mode WMi decided with reference to the free block table 917 is to be applied. For example, if the write mode WMi is decided, the dynamic access manager 915 may select an erase free block having an erase state E0. If a write mode WM3 is decided, the dynamic access manager 915 may select an erase free block having an erase state E3.

The event that a free block to which the write mode WMi decided is to be applied does not exist may occur. For example, if a write mode WM0 is decided, data may be written at free blocks having erase states E0 and E1; on the other hand, if a write mode WM4 is decided, data may be written at free blocks with the erase states E0 to E4.

In step S640, whether a lazy erase operation is required may be determined based on a result of selecting a free block. In the event that an erase free block corresponding to the erase state E0 or E1 does not exist when there is required programming of data according to the write mode WM0, in step S650, there may be performed the lazy erase operation about one of erase free blocks having one of the erase states E2, E3, and E4. If there are sufficiently provided erase free blocks to which the decided write mode WMi is to be applied, the method proceeds to step S660.

In step S650, the dynamic access manager 915 may perform the lazy erase operation about the selected erase free block. It is assumed that the write mode WM0 is applied to write-requested data and the free block table 917 includes erase free blocks each having one of the erase states E2, E3, and E4. The dynamic access manager 915 may select a free block, which is to be erased most rapidly to the erase state E0 with the write mode WM0 applied, from among erase free blocks in a free block pool. For example, the dynamic access manager 915 may select a memory block, having the erase state E2, from among erase free blocks and may perform the lazy erase operation about the selected memory block. However, a method of selecting an erase free block for execution of the lazy erase operation is not limited to this disclosure. For example, it is possible to select a free block, having an adjacent block address, from among free blocks each having one of the erase states E2, E3, and E4 and then perform the lazy erase operation about the selected block. If the lazy erase operation is ended, the dynamic access manager 915 may allocate the free block thus acquired to a log block or a data block.

In step S660, the dynamic access manager 915 may program the write-requested data at a memory block that is obtained by performing a lazy erase operation according to a decided write mode WMi.

There has been described a data write operation that accompanies a lazy erase operation in a memory system 900. A free block with a specific erase state may be generated at high speed by applying a lazy erase method of the inventive concept to the memory system 900 in which a free block pool is formed of memory blocks with an erase state. Thus, it is possible to reduce such a burden that a full erase operation about a memory block is required for a write mode WMi after a write request is received.

FIG. 37 is a table schematically illustrating a free block table according to another embodiment of the inventive concept. Referring to FIG. 37, erase free blocks of a free block table 917' may be divided and managed according to erase states. In addition, the free block table 917' may further comprise the number of erase free blocks and a minimum reference Ref_min for ensuring the performance. The minimum reference Ref_min may have a minimum value of the number free blocks corresponding to an erase state to be retained. It is understood that the free block table 917' is formed of a portion of a per-block mode table shown in FIG. 4.

A configuration of unerased blocks of the free block table 917' may be substantially the same as that described with reference to FIG. 35, and a description thereof is thus omitted.

The erase free blocks may be classified according to erase states, which is performed substantially the same as that described with reference to FIG. 35. For example, it is assumed that all free blocks having an erase state E0 are used. Two free blocks FB122 and FB123 may have an erase state E1, five free blocks FB130, FB133 . . . FB137 may have an erase state E2, seven free blocks FB140, FB141 . . . FB149 may have an erase state E3, and six free blocks FB150, FB151 . . . FB147 may have an erase state E4.

Referring to the minimum reference Ref_min shown in FIG. 37, at least eight free blocks with an erase state E0 may be required, and at least six free blocks with an erase state E1 may be required. However, currently, the number of free blocks with the erase state E0 is 0, and the number of free blocks with the erase state E1 is 2. In contrast, free blocks each having one of erase states E2, E3, and E4 may be sufficient. In this case, a dynamic access manager 915 may perform lazy erase operations about free blocks, each having one of the erase states E2, E3, and E4, according to the minimum reference Ref_min, to produce free blocks each having one of the erase states E0 and E1. This operation will be performed at a point in time when a write request is issued or as a background operation.

Figure 38:
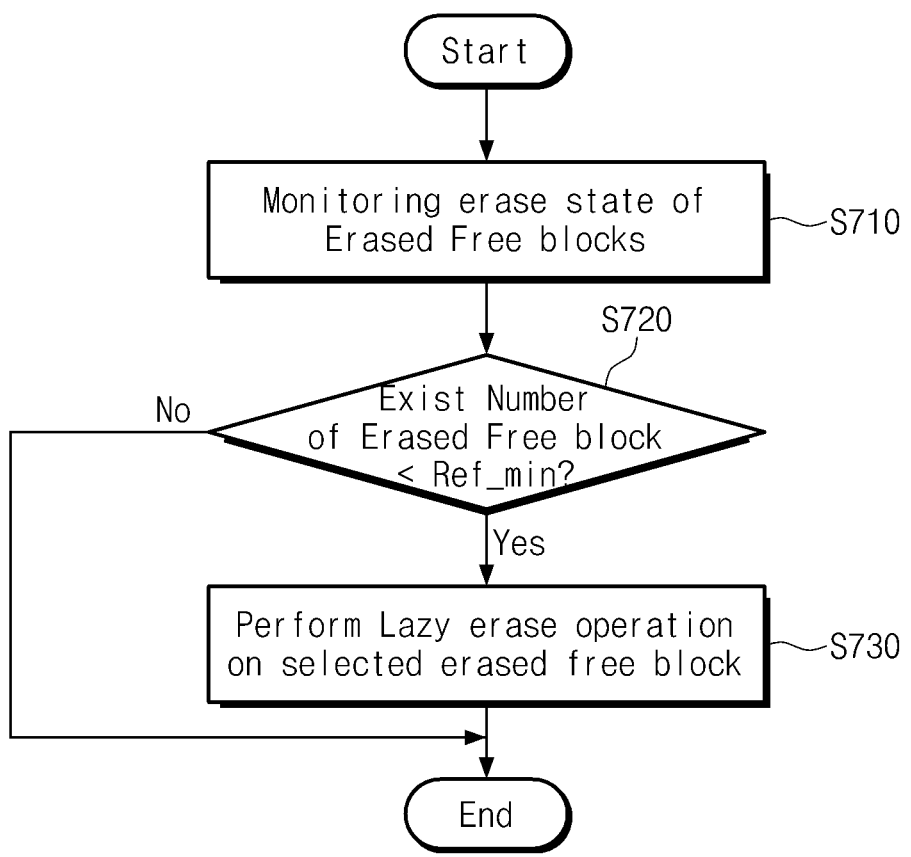
FIG. 38 is a flow chart schematically illustrating a free block managing method according to an embodiment of the inventive concept.

FIG. 38 is a flow chart schematically illustrating a free block managing method according to an embodiment of the inventive concept. Referring to FIG. 38, there will be described a lazy erase operation based on a free block table 917' of a dynamic access manager 915 (refer to FIG. 30).

In step 710, the dynamic access manager 915 may monitor the number of erase free blocks. In step S720, the dynamic access manager 915 may determine whether the number of free blocks included in an erase state E0 is smaller than a minimum reference Ref_min (e.g., 8), based on the free block table 917'. This monitoring may be performed with respect to erase states E0 to E4, respectively.

If the number of free blocks included in each erase state is smaller than a minimum reference Ref_min, the method proceeds to step S730. In contrast, if the number of free blocks included in an erase state is greater than a minimum reference Ref_min, the method is ended.

In step S730, the dynamic access manager 915 may perform a lazy erase operation for supplementing erase free blocks the number of which is smaller than a minimum reference Ref_min. That is, as there is performed a lazy erase operation about free blocks with a relatively high erase state (e.g., E3 or E4), the number of free blocks with the lowest erase state E0 may be maintained above the minimum reference Ref_min. Here, the lazy erase operation may be performed such that the number of free blocks with an erase state E1 may be maintained above the minimum reference Ref_min (e.g., 6). However, the lazy erase operation may not be performed when the number of free blocks with a relatively high erase state (e.g., E4) is smaller than a minimum reference Ref_min (e.g., 2).

There has been described a lazy erase method for producing memory blocks with a specific erase state at high speed in a memory system 900. In the event that the number of free blocks corresponding to an erase state is maintained according to a minimum reference Ref_min, there may be reduced such a burden that a full erase operation is performed in advance upon selecting of a free block to which a specific write mode WMi is to be applied.

Figure 39:
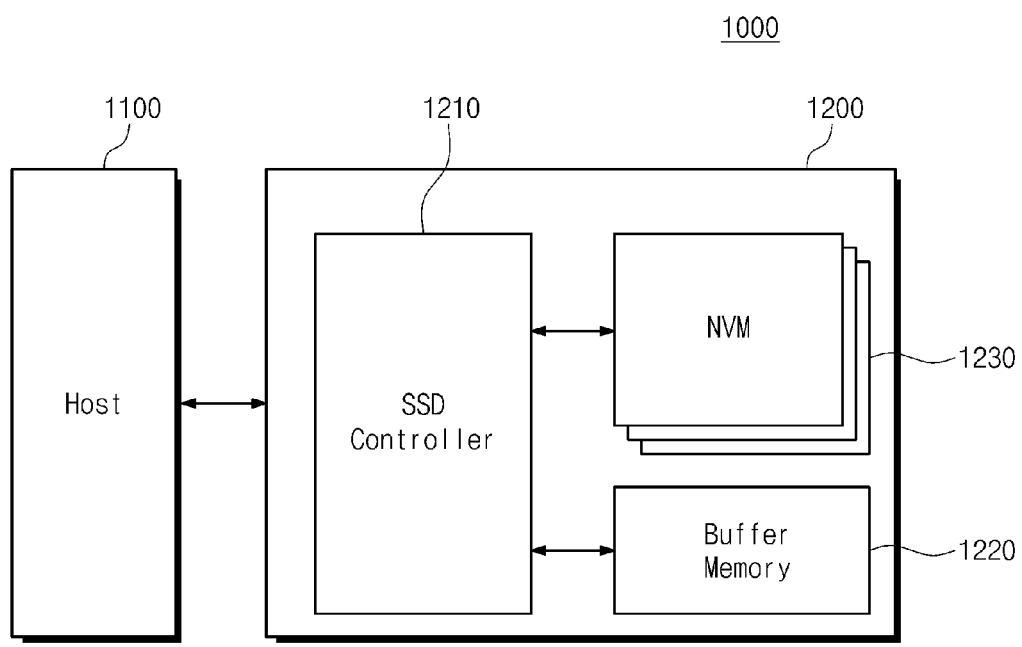
FIG. 39 is a block diagram illustrating an example embodiment of a user device including a solid state drive.

FIG. 39 is a block diagram illustrating a user device including a solid state drive according to an example embodiment of inventive concepts.

Referring to FIG. 39, a user device 1000 include a host 1100 and a solid state drive (hereinafter, referred to as SSD) 1200. The SSD 1200 includes: an SSD controller 1210; a buffer memory 1220; and a nonvolatile memory device 1230.

The SSD controller 1210 provides physical interconnection between the host 1100 and the SSD 1200. The SSD controller 1210 also provides an interface to the SSD 1200 corresponding to a bus format of the host 1100. The bus format of the host 1100 may include USB (Universal Serial Bus), SCSI (Small Computer System Interface), PCI express, ATA, PATA (Parallel ATA), SATA (Serial ATA), SAS (Serial Attached SCSI), and the like. The SSD controller 1210 may change an access mode to the nonvolatile memory device 1230 based on various access requests provided from the host 1100. For example, the SSD controller 1210 may adjust an access bias of the nonvolatile memory device 1230 according to an attribute of an access request. The SSD controller 1210 may include a dynamic access manager, and set a level of an erase voltage variously. The SSD controller 1210 may perform various memory management operations according to a level of an erase voltage.

The buffer memory 1220 temporarily stores write data provided from the host 1100 or data read out from the nonvolatile memory device 1130. In the event that data existing in the nonvolatile memory device 1230 is cached, at a read request of the host 1100 the buffer memory 1220 may support a cache function to provide cached data directly to the host 1100. Typically, a data transfer speed of a bus format (e.g., SATA or SAS) of the host 1100 may be higher than that of a memory channel of the SSD 1200. In the event that an interface speed of the host 1100 is relatively fast, lowering of the performance due to a speed difference may be reduced and/or minimized by providing the buffer memory 1220 having a relatively large storage capacity.

The nonvolatile memory device 1230 is provided as a storage medium of the SSD 1200. For example, the nonvolatile memory device 1230 may be a vertical NAND flash memory device having a mass storage capacity. The nonvolatile memory device 1230 may be formed of a plurality of memory devices. In this case, memory devices are connected with the SSD controller 1210 by the channel.

With regard to FIG. 39, there is described an example in which the nonvolatile memory device 1230 is formed of a NAND flash memory. However, the nonvolatile memory device 1230 is not limited to a NAND flash memory. For example, the SSD 1200 may be formed of a PRAM, an MRAM, a ReRAM, a FRAM, a NOR flash memory, and the like. Further, inventive concepts may be applied to memory systems using different types of memory devices together.

Figure 40:
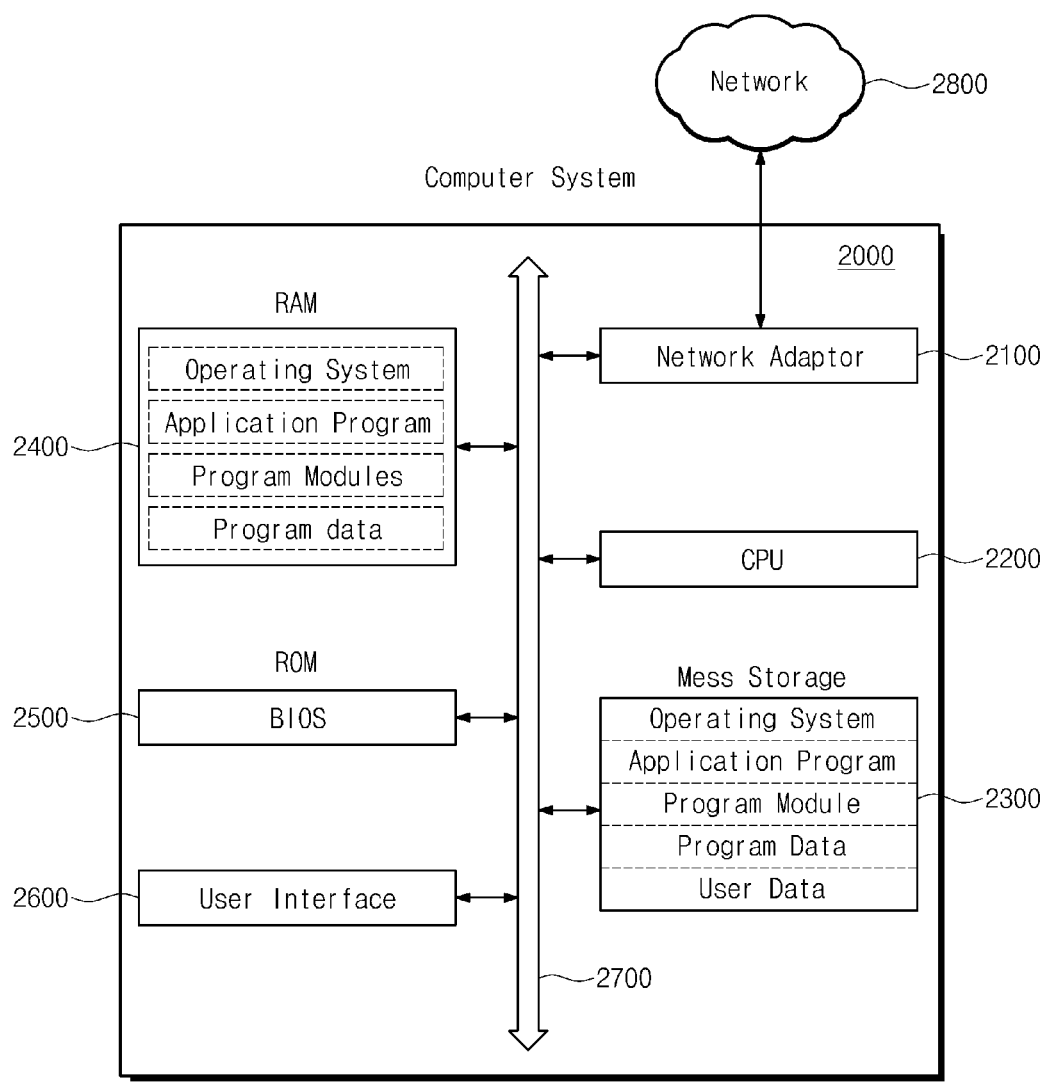
FIG. 40 is a block diagram schematically illustrating a computing system according to an example embodiment of inventive concepts.

FIG. 40 is a block diagram schematically illustrating a computing system according to an example embodiment of inventive concepts.

Referring to FIG. 40, a computing system 2000 includes: a network adaptor 2100; a central processing unit (CPU) 2200; a mass storage device 2300; a RAM 2400; a ROM 2500; and a user interface 2600, which are connected with a system bus 2700.

The network adaptor 2100 provides an interface between the computing system 2000 and external networks 2800. The CPU 2200 controls an overall operation for driving an operating system and an application program which are resident on the RAM 2400. The data storage device 2300 stores data needed for the computing system 2000. For example, the data storage device 2300 may store an operating system for driving the computing system 2000, an application program, various program modules, program data, user data, and so on.

The RAM 2400 is used as a working memory of the computing system 2000. Upon booting, the operating system, the application program, the various program modules, and program data needed to drive programs and various program modules read out from the data storage device 2300 may be loaded into the RAM 2400. The ROM 2500 stores a basic input/output system (BIOS), which is activated before the operating system is driven upon booting. Information exchange between the computing system 3000 and a user may be made via the user interface 2600.

In addition, the computing system 2000 may further include a battery, a modem, and the like. Although not shown, the computing system 2000 may further include an application chipset, a camera image processor (CIS), a mobile DRAM, and the like.

The mass storage device 2300 may include a nonvolatile storage device using a memory management method according to one or more example embodiments of inventive concepts discussed herein. For example, the mass storage device 2300 may perform wear leveling according to effective wearing EW and/or cumulative effective wearing CEW. A write mode or an erase mode may be changed according to a request of a host or according to an operation condition. The mass storage device 2300 may be implemented by a solid state drive, a multimedia card (MMC), a secure digital (SD) card, a micro SD card, a memory stick, an ID card, a PCMCIA card, a chip card, an USB card, a smart card, a compact flash (CF) card, and so on.

Figure 41:
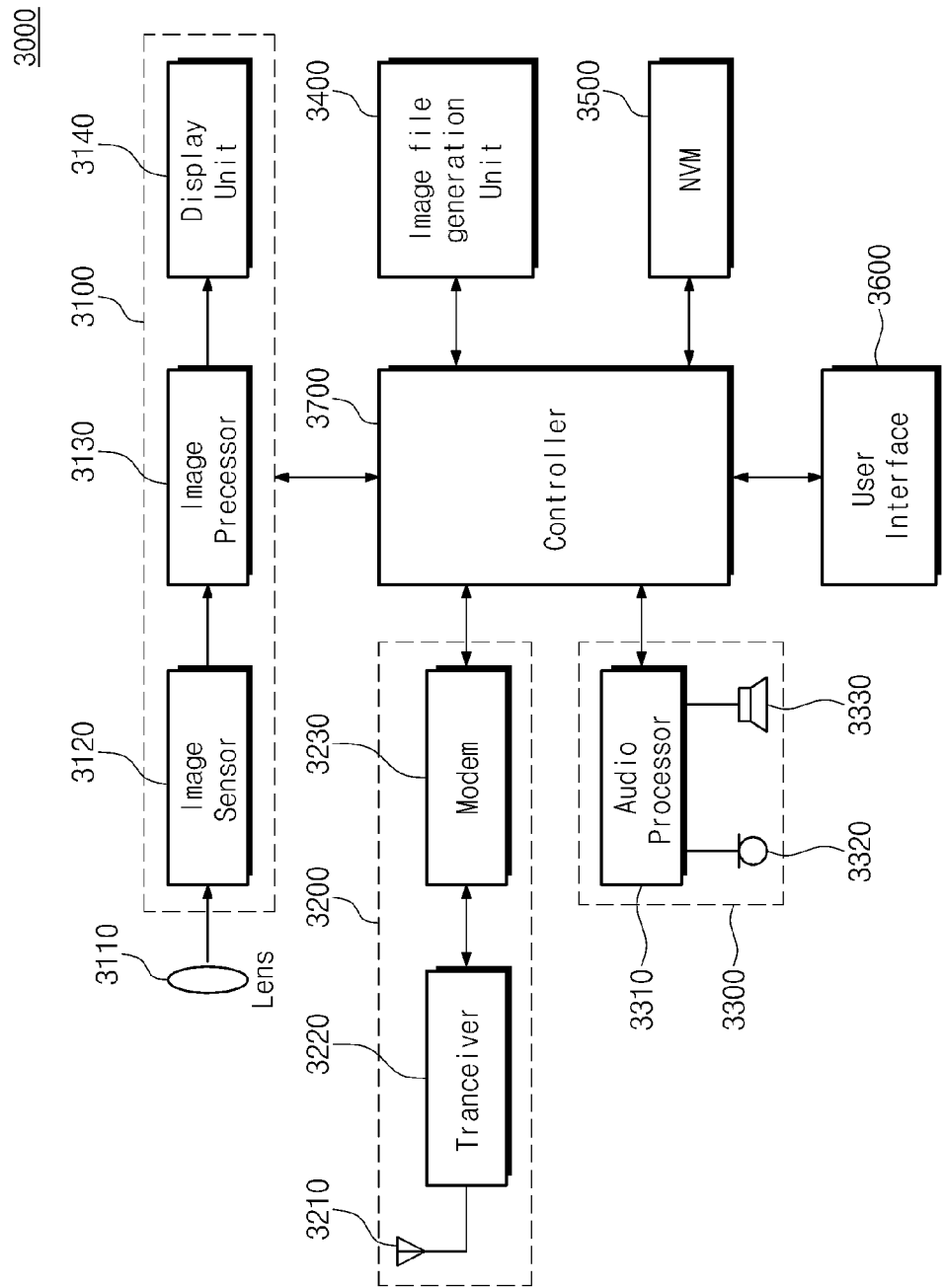
FIG. 41 is a block diagram schematically illustrating a handheld terminal according to an example embodiment of inventive concepts.

FIG. 41 is a block diagram schematically illustrating a handheld terminal according to an example embodiment of inventive concepts.

Referring to FIG. 41, a handheld terminal 3000 includes: an image processing circuit 3100; a wireless transceiver circuit 3200; an audio processing circuit 3300; an image file generating circuit 3400; a nonvolatile memory device 3500; a user interface 3600; and a controller 3700.

The image processing circuit 3100 includes: a lens 3110; an image sensor 3120; an image processor 3130; and a display unit 3140. The wireless transceiver circuit 3200 includes: an antenna 3210; a transceiver 3220; and a modem 3230. The audio processing circuit 3300 includes: an audio processor 3310; a microphone 3320; and a speaker 3330.

In this example embodiment, the nonvolatile memory device 3500 may be implemented by at least one of a memory system, a memory card, an SSD, and an eMMC driven according to one or more example embodiments of inventive concepts discussed herein. In this case, the nonvolatile memory device 3500 may be erased using various levels of erase voltages. An access mode of the nonvolatile memory device 3500 may be changed according to a level of an erase voltage.

Nonvolatile memory devices and/or memory controllers according to example embodiments of inventive concepts may be packed by according to various types of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While inventive concepts have been described with reference to some example embodiments, it will be apparent to those skilled in the art that various changes and modifications may be made without departing from the spirit and scope of this disclosure. Therefore, it should be understood that the above-discussed example embodiments are not limiting, but illustrative.

What is claimed is:

1. A method of reading data from a memory block of a memory device, the method comprising:
   detecting a write mode of the memory block in response to a request to read data from the memory block, the detected write mode being one of (i) a first write mode from among a plurality of first write modes and (ii) a second write mode from among a plurality of second write modes, wherein
      each of the plurality of first write modes has a corresponding first plurality of incremental step pulse programming states,
      each of the plurality of second write modes has a corresponding second plurality of incremental step pulse programming states, and
      for each of the plurality of second write modes, verification voltages associated with the second plurality of incremental step pulse programming states decrease as increments between the second plurality of incremental step pulse programming states decrease;
   setting a read voltage based on the detected write mode of the memory block; and
   reading the data from the memory block using the set read voltage.

2. The method of claim 1, wherein:
   the read voltage is a pass read voltage;
   the detected write mode includes a plurality of write mode levels, each of the plurality of write mode levels being associated with a different pass read voltage; and
   the setting the read voltage includes,
      selecting a write mode level from among the plurality of write mode levels, and
      setting the pass read voltage for the memory block based on the selected write mode level.

3. The method of claim 1, wherein:
   the detected write mode includes a plurality of write mode levels, each of the plurality of write mode levels being associated with at least one different read voltage, and
   the setting the read voltage includes,
      selecting a write mode level from among the plurality of write mode levels, and
      setting the read voltage for the memory block based on the selected write mode level.

4. The method of claim 1, wherein each of the plurality of write mode levels is associated with a same pass voltage.

5. A memory system comprising:
   a non-volatile memory including a memory block; and
   a storage controller configured to,
      detect a write mode of the memory block in response to a request to read data from the memory block, the detected write mode being one of (i) a first write mode from among a plurality of first write modes and (ii) a second write mode from among a plurality of second write modes, wherein
         each of the plurality of first write modes has a corresponding first plurality of incremental step pulse programming states,
         each of the plurality of second write modes has a corresponding second plurality of incremental step pulse programming states,
         for each of the plurality of second write modes, verification voltages associated with the second plurality of incremental step pulse programming states decrease as increments between the second plurality of incremental step pulse programming states decrease,
      set a read voltage based on the detected write mode of the memory block, and
      read the data from the memory block using the set read voltage.

6. The memory system of claim 5, wherein:
   the read voltage is a pass read voltage;
   the detected write mode includes a plurality of write mode levels, each of the plurality of write mode levels being associated with a different pass read voltage; and
   the storage controller is further configured to,
      select a write mode level from among the plurality of write mode levels, and
      set the pass read voltage for the memory block based on the selected write mode level.

* * * * *